(12) United States Patent
Tanabe et al.

(10) Patent No.: US 7,325,974 B2
(45) Date of Patent: Feb. 5, 2008

(54) PULLEY ROTATION SUPPORT APPARATUS

(75) Inventors: Kouichi Tanabe, Kanagawa (JP);
Takayuki Miyagawa, Kanagawa (JP);
Masato Taniguchi, Kanagawa (JP)

(73) Assignee: NSK Ltd., Tokyo (JP)

( * ) Notice: Subject to any disclaimer, the term of this patent is extended or adjusted under 35 U.S.C. 154(b) by 395 days.

(21) Appl. No.: 10/489,669

(22) PCT Filed: Sep. 10, 2002

(86) PCT No.: PCT/JP02/09228
§ 371 (c)(1),
(2), (4) Date: Apr. 15, 2004

(87) PCT Pub. No.: WO03/025409
PCT Pub. Date: Mar. 27, 2003

(65) Prior Publication Data
US 2006/0025257 A1   Feb. 2, 2006

(30) Foreign Application Priority Data

| Sep. 18, 2001 | (JP) | ............................ 2001-283322 |
| Jan. 24, 2002 | (JP) | ............................ 2002-015428 |
| Mar. 27, 2002 | (JP) | ............................ 2002-088771 |
| Jun. 14, 2002 | (JP) | ............................ 2002-174268 |

(51) Int. Cl.
*F16C 33/76* (2006.01)
*F16H 55/36* (2006.01)

(52) U.S. Cl. ...................... 384/486; 384/457; 384/543; 474/199

(58) Field of Classification Search ............ 474/69–70, 474/101, 135, 170–174, 199; 384/450, 457, 384/475, 486, 516, 543
See application file for complete search history.

(56) References Cited

U.S. PATENT DOCUMENTS

| 6,010,420 | A  | * | 1/2000  | Niki et al. ................... 474/199 |
| 6,116,786 | A  | * | 9/2000  | Takata et al. ................ 384/516 |
| 6,244,408 | B1 | * | 6/2001  | Tobayama et al. ...... 192/84.961 |
| 6,273,230 | B1 |   | 8/2001  | Nakano et al. |
| 6,659,649 | B2 | * | 12/2003 | Ishiguro et al. ............. 384/486 |
| 6,827,496 | B2 | * | 12/2004 | Iwata et al. .................. 384/516 |
| 2001/0028754 | A1 |   | 10/2001 | Ishiguro et al. |

FOREIGN PATENT DOCUMENTS

| JP | 4-7726 U  | 1/1992 |
| JP | 6-73454 U | 10/1994 |

(Continued)

*Primary Examiner*—Marcus Charles
(74) *Attorney, Agent, or Firm*—Sughrue Mion, PLLC

(57) ABSTRACT

An endless belt (11) to be provided on a driven pulley (4b) and a pulley rotation support apparatus for supporting the driven pulley (4b). In the pulley rotation support apparatus, there is used a three-point-contact-type or four-point-contact-type radial ball bearing (14b). An offset quantity δ, which is an axial-direction distance between the center α of a radial load applied from the endless belt (11) to the driven pulley (4b) and the center position β of the radial ball bearing (14b), is set 40% or less of the pitch circle diameter of the radial ball bearing (14b). The radial clearance of this radial ball bearing (14b) is set 0.2% or less of the above pitch circle diameter.

3 Claims, 29 Drawing Sheets

FOREIGN PATENT DOCUMENTS

| | | | |
|---|---|---|---|
| JP | 8-177871 A | | 7/1996 |
| JP | 8-232967 A | | 9/1996 |
| JP | 09-119510 A | * | 5/1997 |
| JP | 09-126303 A | * | 5/1997 |
| JP | 11-210766 A | * | 8/1999 |
| JP | 11-336795 A | * | 12/1999 |
| JP | 2000-120668 A | * | 4/2000 |
| JP | 2001-304279 A | | 10/2001 |

* cited by examiner

PULLEY ROTATION SUPPORT APPARATUS

TECHNICAL FIELD

A pulley rotation support apparatus according to the invention is used to support a pulley, on which there is disposed a belt to be driven and rotated by an engine for e.g. a car, on a fixed part of the car in such a manner that the pulley can be rotated with respect to the fixed part.

BACKGROUND ART

Conventionally, an automatic tensioner has been used in order to adjust the tensile force of a timing belt or an auxiliary machine driving belt used in a car engine, and the thus-adjustable belt has been used to drive an auxiliary machine such as a compressor. And, in a rotation support part for a pulley for use in the automatic tensioner or a driven pulley for driving the above auxiliary machine, there is supported such pulley on a fixed part using a rolling bearing in such a manner that the pulley can be rotated with respect to the fixed part.

For example, FIG. 32 shows a first example of conventional structures in which a double-row rolling element bearing is used in the rotation support part of a compressor to be incorporated into a car air conditioner to thereby compress a refrigerant. A rotary shaft 1 of this compressor is rotatably supported within a case 2 by a rolling bearing (not shown). On the periphery of a support tube part 3 formed in the outer surface of the end portion of the casing 2 and corresponding to a support part as set forth in the appended claims, there is rotatably supported a driven pulley 4 using a double-row radial ball bearing 5. The driven pulley 4 is structured such that it has a U-shaped section and it is formed in a circular-ring shape as a whole; and, a solenoid 6 fixed to the end face of the casing 2 is disposed in the internal space of the driven pulley 4. On the other hand, to the portion of the end portion of the above rotary shaft 1 that is projected from the above casing 2, there is fixed a mounting bracket 7; and, on the periphery of this mounting bracket 7, there is supported a ring-shaped plate 8 made of magnetic material through a plate spring 9. The ring-shaped plate 8, when the solenoid 6 is not energized electrically, is separated a part from the above driven pulley 4 due to the elastic force of the plate spring 9, as shown in FIG. 32; and, on the other hand, when the solenoid 6 is energized, the ring-shaped plate 8 is attracted toward this driven pulley 4 to be thereby be able to transmit the rotation power from this driven pulley 4 to the above rotary shaft 1. That is, the solenoid 6, ring-shaped plate 8 and plate spring 9 cooperate together in constituting an electromagnetic clutch 10 which is used to engage the above driven pulley 4 and the above rotary shaft 1 with each other and disengage them from each other.

According to the above-mentioned structure in which the driven pulley 4 is rotatably supported using the double-row radial ball bearing 5, even in case where a small level of partial load is applied to this driven pulley 4 from an endless belt 11 provided on this driven pulley 4, there is little possibility that the center axes of an outer ring 12 and an inner ring 13 respectively constituting the above double-row radial ball bearing 5 can be incongruous with each other (can be inclined with respect to each other). Therefore, not only the durability of the above double-row radial ball bearing 5 can be secured sufficiently but also the rotation center of the above driven pulley 4 can be prevented against inclination, thereby being able to prevent the above endless belt 11 against partial wear.

However, use of the above double-row radial ball bearing 5 inevitably increases the axial-direction dimension of the above structure. The rotation support part of the above driven pulley 4, in many cases, must be disposed in a limited space and thus the increase in the axial-direction dimension is not desirable. Also, the increase in the axial-dimension increases the costs of the composing parts of the structure.

In case where, as a rolling bearing for supporting the above driven pulley 4, instead of the above double-row radial ball bearing 5, there is used a single-row deep-groove-type radial ball bearing, the axial-direction dimension of the structure can be reduced to thereby be able to facilitate the installation of the rotation support part of the bearing in a limited space. However, in the case of a simple single-row deep-groove-type radial ball bearing, when a moment load is applied to the above driven pulley 4, there is obtained a small force to prevent the inclination of this driven pulley 4, which greatly increases the degree of incongruity between the center axes of the outer and inner rings respectively constituting the above radial ball bearing. As a result of this, not only the durability of the above radial ball bearing is insufficient but also great partial wear is easy to occur in the endless belt 11 arranged on the above driven pulley 4.

In view of the above circumstances, conventionally, there are proposed structures, as disclosed in the following patent reference 1 and patent reference 2, in which a single-row four-point-contact-type radial ball bearing is used to support a driven pulley. Here, FIGS. 33 and 34 shows a second example of the conventional structures disclosed in the patent reference 1.

According to the second example of the conventional structures, a driven pulley 4a, which is formed by enforcing a bending working operation such as a press working operation on a metal plate, can be rotatably supported on the periphery of a support part (not shown) using a single-row four-point-contact-type radial ball bearing 14. This radial ball bearing 14 comprises an outer ring 15 and an inner ring 16 supported so as to be concentric with each other, and two or more rolling elements 17, 17. Of these composing elements, in the inner peripheral surface of the outer ring 15, there is formed an outer raceway 16 and, in the outer peripheral surface of the inner ring 15, there is formed an inner raceway 19 in such a manner that they respectively extend over the entire peripheries of their associated peripheral surfaces. The section shapes of the respective raceways 18 and 19 are respectively so called Gothic arch shapes in which two arcs each having a radius of curvature larger than one half of the diameters of the respective rolling elements 17, 17. Therefore, the respective raceways 18, 19 and the rolling surfaces of the respective rolling elements 17, 17 are contacted with each other respectively at two points, that is, at a total of four points in every rolling elements 17, 17.

The thus-structured four-point-contact-type radial ball bearing 14 is large in rigidity with respect to the moment load when compared with an ordinary single-row deep-groove-type radial ball bearing and, even when the moment load is applied thereto, the center axes of the outer ring 15 and inner ring 16 are difficult to shift from each other. Thanks to this, when compared with a structure in which a pulley rotation support device for a compressor is formed using an ordinary single-row deep-groove-type radial ball bearing, there can be eased the partial wear that occurs in the endless belt 11 (see FIG. 32) arranged on the driven pulley 4. By the way, in the patent reference 2, there is disclosed a structure in which the above-structured four-point-contact-type radial ball bearing is assembled to the rotation support part of a driven pulley for driving a compressor and further, between the driven pulley and the rotary shaft of the compressor, there is interposed an electromagnetic clutch.

Also, in the case of such a single-row three-point-contact-type rolling element bearing 14a as shown in FIG. 35 as well, it has larger rigidity with respect to the moment load than an ordinary single-row deep-groove-type radial ball bearing and thus, even when it receives the moment load, the center axes of an outer ring 15 and inner ring 16a are difficult to shift from each other. According to the single-row three-point-contact-type rolling element bearing 14a, in the outer peripheral surface of the inner ring 16a, there is formed an arc-shaped inner raceway 19a, whose section to be contacted with the rolling surface of the rolling element 17 at a point has a single curvature; and, in the inner peripheral surface of the outer ring 15, similarly to the four-point-contact-type radial ball bearing 14 shown in the above-illustrated FIGS. 33 and 34, there is formed a Gothic-arch-shaped outer raceway 18 which is to be contacted with the rolling surface of the rolling element 17 at two points. In the structure in which a pulley for a compressor is supported using the thus-formed three-point-contact-type rolling element bearing 14a, when compared with the structure in which a pulley rotation support device for a compressor is formed using an ordinary single-row deep-groove-type radial ball bearing, there can be eased the partial wear that occurs in the endless belt 11 (see FIG. 32) provided on the driven pulley 4. A similar effect can also be obtained in a three-point-contact-type rolling element bearing having a structure in which, contrary to the structure shown in FIG. 5, the rolling surfaces of the respective rolling elements are contacted with an outer raceway at a point and are contacted with an inner raceway at two points.

As described above, when the above-mentioned three-point-contact-type or four-point-contact-type radial ball bearing is assembled to the rotation support part of the pulley, there is a possibility that the reduction in the size and weight of the structure and the durability thereof are compatible with each other on a high level. However, in the case of the conventional structures, since the factors and elements of the respective parts thereof are not examined to the full, there cannot be always obtained a sufficient effect.

Also, in the case of an auxiliary machine for an engine, especially, in the case of a compressor, recently, there have been made improvements such as an increase in the rotation thereof, an increase in the capacity thereof, and a decrease in the axial-direction dimension thereof. However, when the auxiliary machine is improved in the rotation thereof and the like, a rolling element bearing for supporting a pulley for the auxiliary machine is easy to generate heat, which reduces the seizure life (deterioration life) of grease. Also, since an excessively large moment load is applied to the rolling element bearing, the rolling elements are easy to run up onto the shoulder portions of an outer raceway and an inner raceway. Further, in the case of other machines than the auxiliary machines of the engine, for example, in the case of an automatic tensioner as well, when an increase in the rotation thereof or a reduction in the axial-direction dimension is required, in a rolling element bearing for supporting a pulley which is used in such machine, similarly, the seizure life of grease can be shortened or the rolling elements are easy to run up onto the shoulder portions of the outer raceway and inner raceway. Therefore, in a rolling element bearing to be used in the machine such as an engine auxiliary machine which is required for an increase in the rotation and capacity thereof as well as is required for a reduction in the size thereof, when no consideration is given at all to an increase in the seizure life of the grease and a run-up allowance of the rolling element (a ratio which expresses the difficulty for the rolling element to run up onto the shoulders of the raceways), there is a possibility that these performances of the rolling element bearing can be insufficient. By the way, in case where the seizure life of the grease is sufficiently long, since the life of the bearing is determined by the rolling fatigue lives of the inner ring and outer raceways, to enhance the seizure life of the grease is not specially important. However, in case where the seizure life is not long so much, because there is a possibility that the bearing life can be determined by this seizure life, from the viewpoint of securing the bearing life, to enhance the seizure life is especially important.

In view of the above circumstances of the conventional pulley rotation support apparatus, according to the invention, there is provided a pulley rotation support apparatus which not only can secure the durability of a rolling bearing and an endless belt arranged on a pulley but also, even when it is used in a machine required for an increase in the rotation and capacity thereof as well as for a reduction in the size thereof, can fully secure the seizure life of grease to be charged into the interior of the rolling bearing as well as the run-up allowance of a rolling element.

Patent Reference 1
JP-A-9-119510

Patent Reference 2
JP-A-11-336795

Patent Reference 3
JP-A-11-210619

Patent Reference 4
JP-UM-A-64-27482

DISCLOSURE OF THE INVENTION

A pulley rotation support apparatus according to the invention, similarly to the previously described conventionally known pulley rotation support apparatus, comprises a fixed support portion, a rolling bearing supported on the fixed support portion, and a pulley which is rotatably supported by the rolling bearing and also on which an endless belt is to be disposed.

And, the above rolling bearing, similarly to the above-mentioned patent reference 1 and patent reference 2, is a single-row three-point-contact-type or four-point-contact-type radial ball bearing which includes an inner ring having in the outer peripheral surface thereof an inner raceway formed so as to be contactable with the rolling surface of a rolling element at one or two points, an outer ring having in the inner peripheral surface thereof an outer raceway formed so as to be contactable with the rolling surface of a rolling element at one or two points, two or more rolling elements rotatably interposed between the inner raceway and outer raceway, a retainer having pockets for holding the rolling elements in a freely rotatably manner, and a seal plate having an outer peripheral edge portion secured to the inner peripheral surface of the outer ring and also having the leading end portion of a seal lip disposed in the inner peripheral edge portion thereof slidably contacted with the outer peripheral surface of the inner ring, wherein the rolling bearing can be lubricated by a lubricant, and also wherein at least one of the inner raceway and outer raceway is to be contacted with the rolling surfaces of the rolling elements respectively at two points. That is, the present invention provides a pulley rotation support apparatus using the present single-row three-point-contact-type or four-point-contact-type radial ball bearing.

Especially, according to a pulley rotation support apparatus as set forth in a first aspect an offset quantity, which is an axial-direction distance between the width-direction central portion position of the portion to be contacted with the above endless belt on the outer peripheral surface of the pulley and the center of the above radial ball bearing, is 40% or less of the pitch circle diameter of the radial ball bearing, the radial clearance of this radial ball bearing when it exists alone is 0.2% or less of the pitch circle diameter of the radial ball bearing, and the pocket opening of the retainer is disposed so as to face in a direction where an offset load is applied to the center of this bearing.

Also, in a pulley rotation support apparatus as set forth in a second aspect, an offset quantity consisting of an axial-direction distance between the width-direction central portion position of the outer peripheral surface of the pulley that is contacted with the endless belt and the center of the radial ball bearing is 40% or less of the pitch circle diameter of the radial ball bearing, the radial clearance of the radial ball bearing when it is alone is 0.2% or less of the pitch circle diameter of the radial ball bearing, and the above seal plate is structured such that, of the inner surfaces thereof, at least the near-to-outside-diameter portion thereof close to the inner peripheral surface of the outer ring is formed as an inclined surface which is inclined inwardly in the axial direction as it goes outwardly in the diameter direction, or a concavely curved surface which is curved in this direction.

Also, in a pulley rotation support apparatus as set forth in a third aspect, an offset quantity consisting of an axial-direction distance between the width-direction central portion position of the outer peripheral surface of the pulley that is contacted with the endless belt and the center of the radial ball bearing is 40% or less of the pitch circle diameter of the radial ball bearing, the radial clearance of the radial ball bearing when it is alone is 0.2% or less of the pitch circle diameter of the radial ball bearing, and at least one of the seal lips of the seal plate includes a substantially-circular-ring-shaped main body portion and a projecting portion formed in the inner peripheral edge portion of the main body portion so as to project outwardly in the axial direction substantially over the entire periphery thereof, the main body portion of the present seal lip except for the projecting portion thereof, in its free state, is inclined outwardly in the axial direction as it goes toward the inner peripheral edge portion thereof, and, in the assembled state thereof, the leading end edge of the projecting portion is slidably contacted with the axial-direction outer side wall surface of a seal groove formed over the entire periphery of part of the outer peripheral surface of the inner ring substantially over the entire periphery of the present side wall surface.

And, in a pulley rotation support apparatus as set forth in a fourth aspect, an offset quantity consisting of an axial-direction distance between the width-direction central portion position of the outer peripheral surface of the pulley that is contacted with the endless belt and the center of the radial ball bearing is 40% or less of the pitch circle diameter of the radial ball bearing, the radial clearance of the radial ball bearing when it is alone is 0.2% or less of the pitch circle diameter of the radial ball bearing, and at least one of the two seal plates is structured such that, in the portion of the leading end face of the seal lip that is opposed to the axial-direction outer side wall surface of a seal groove, there is formed a rectangular-shaped or arc-shaped cut-away portion allowing the air to pass into the inside thereof, the leading end portion of this seal lip is surface contacted with the axial-direction outer side wall surface of a seal groove substantially over the entire periphery thereof, and, regarding to the cut-away portion, in case where the depth thereof from the leading end edge of the seal lip is expressed as $L_1$, the length in the circumferential direction thereof is expressed as $L_2$, and the diameter of the rolling element is expressed as $D_a$, the relationship "$L_1 \leq 0.09 D_a$, and $L_2 \leq 0.18 D_a$," can be satisfied.

According to the above-structured pulley rotation support apparatus of the invention, it is possible to prevent the center axes of the inner ring and outer ring respectively constituting the radial ball bearing from shifting from each other. That is, since the offset quantity of the winding position of the endless belt with respect to the center of the above radial ball bearing is restricted to 40% or less of the pitch circle diameter of this radial ball bearing, the moment load to be applied to the above outer ring through the pulley can be controlled down to a small value. Due to this, the inclination of the pulley and outer ring with respect to the above inner ring can be controlled to thereby prevent an excessive surface pressure from acting on the rolling contact portion of the above radial ball bearing, which makes it possible to secure the durability of this radial ball bearing. Also, the partial wear of the endless belt provided on the above pulley can be controlled to thereby be able to secure the durability of this endless belt as well. Also, because the radial clearance of the above radial ball bearing when it exists alone is restricted to 0.2% or less of the pitch circle diameter of this radial ball bearing, the above two center axes are hard to shift from each other, so that the above operation can be obtained in a better condition. Therefore, even when the present radial ball bearing is used in an apparatus required for an increase in the rotation thereof, an increase in the capacitance thereof and a reduction in the size thereof, such as a compressor for a car air conditioner, the seizure life of grease to be charged into the interior of the rolling bearing and the run-up allowance of the ball can be secured sufficiently.

Also, since the pocket opening of the above retainer is disposed to face in the direction where the offset load is applied to the center of the bearing and thus an offset radial load is applied to the center of the bearing, the grease existing around the load area, during the operation of the bearing, is circulated actively from the inner raceway on the pocket opening side of the retainer to the outer raceway; and, therefore, when the bearing receives the offset load, the seizure life of the grease can be extended and thus the performance of the bearing can be enhanced.

Also, since, of the inner surfaces of the above seal plate, at least the near-to-outside-diameter portion thereof close to the inner peripheral surface of the outer ring is formed as an inclined surface which is inclined inwardly in the axial direction as it goes outwardly in the diameter direction, or a concavely curved surface which is curved in this direction, there is eliminated the possibility that a large quantity of grease can stay on the inner surface of the seal plate, so that the grease, which exists between the above outer raceway and inner raceway and is charged into the space with the above respective rolling elements stored therein, can be circulated smoothly within this space. That is, because, of the inner surfaces of the above seal plate, the near-to-outside-diameter portion thereof close to the inner peripheral surface of the outer ring is formed as an inclined surface which is inclined inwardly in the axial direction as it goes outwardly in the diameter direction, or a concavely curved surface which is curved in this direction, the grease, which has adhered to the inner surface of the above seal plate and has moved to the outside-diameter side of the seal plate due to a centrifugal force, is guided to the above outer raceway formed in the inner peripheral surface of the above outer ring. This can prevent a large quantity of grease from staying on the inner surface of the seal plate, so that the grease charged into the above space can be circulated within the above space including the rolling contact portions between the above outer ring and inner raceways and the rolling surfaces of the respective rolling elements. Due to this, all of the grease charged into the above space is used for lubrication of the above rolling contact portions, thereby being able to retard the degradation of the grease (being able to enhance the durability of the grease) for lubrication of these rolling contact portions when compared with the conventional structure.

Also, according to the invention, at least one of the seal lips of the seal plate includes a substantially-circular-ring-shaped main body portion and a projecting portion formed in the inner peripheral edge portion of the main body portion so as to project outwardly in the axial direction substantially over the entire periphery thereof (except for the slight cut-away portion), the main body portion of the present seal lip except for the projecting portion thereof, in its free state, is inclined outwardly in the axial direction as it goes toward the inner peripheral edge portion thereof, and, in the assembled state thereof, the leading end edge of the projecting portion is slidably contacted with the axial-direction outer side wall surface of a seal groove formed over the entire periphery of part of the outer peripheral surface of the inner ring substantially over the entire periphery of the present side wall surface. Thanks to this, even in case where the pressure (internal pressure) of the space with the respective rolling elements stored therein is increased due to an increase in the temperature or the like when the bearing is in operation, there is eliminated the possibility that the contact pressure between the leading end edge of the projecting portion formed in the seal lip and the outer side wall surface of the seal groove formed in the outer peripheral surface of the inner ring can lower, or there can be generated a clearance between them. Rather, when the above internal pressure rises, since the leading end edge of the above projecting portion is pressed against the outer side wall surface of the above seal groove, the sealing performance of the bearing can enhanced further. Also, because the leading end edge of the projecting portion formed in the peripheral edge portion of the above seal lip so as to project in the axial direction is slidably contacted with the above outer side wall surface, the present leading end edge and outer side wall surface can be easily contacted with each other in a stable manner. Further, in a state where the above seal lip is held in its free condition, the main body portion of the seal lip except for the projecting portion thereof is inclined outwardly in the axial direction as it goes for the inner peripheral edge portion thereof. This can increase the force for pressing the above projecting portion against the above outer side wall surface. Also, in a state where the leading end edge of this projecting portion is slidably contacted with this outer side wall surface, the main body portion except for the above projecting portion can be easily inclined outwardly in the axial direction as it goes for the inner peripheral edge portion, or can be made to coincide with a virtual plane which intersects the center axis of the present seal plate at right angles. Thanks to this, even in case where the bearing is used while the outer ring is rotating at high speed and thus a centrifugal force is applied to the inner peripheral edge portion of the seal lip including the above projecting portion, this inner peripheral edge portion can be prevented from shifting in a direction where it parts away from the outer side wall surface of the above seal groove. As a result of this, even under severe conditions where a large partial load is applied, the temperature rises, the outer ring rotates at a high speed, and the like, the sealing performance of the rolling bearing with a seal plate can be secured sufficiently. Therefore, when the rolling bearing is used with grease charged into the interior thereof, not only base oil contained in this grease can be prevented from leaking out to the outside but also this base oil can be prevented from being oxidized by the air in the outside, thereby being able to enhance the life of this grease. Further, various foreign substances existing in the outside can be prevented from entering the space with the respective rolling elements stored therein, thereby being able to prevent the respective raceways and the rolling surfaces of the respective rolling elements against damage.

Also, according to the invention, at least one of the two seal plates is structured such that, in the portion of the leading end face of the seal lip that is opposed to the axial-direction outer side wall surface of a seal groove, there is formed a rectangular-shaped or arc-shaped cut-away portion allowing the air to pass into the inside thereof, the leading end portion of this seal lip is surface contacted with the axial-direction outer side wall surface of a seal groove substantially over the entire periphery thereof, and, regarding to the cut-away portion, in case where the depth thereof from the leading end edge of the seal lip is expressed as $L_1$, the length in the circumferential direction thereof is expressed as $L_2$, and the diameter of the rolling element is expressed as $D_a$, the relationship "$L_1 \leq 0.09 D_a$, and $L_2 \leq 0.18 D_a$," can be satisfied. Thanks to this structure, the contact area between the leading end edge of the seal lip and the side wall surface of a seal groove formed in the outer peripheral surface of a portion of the inner ring can be increased. Therefore, sufficient sealing performance can be secured under the severe conditions and, when the ball bearing is used while grease is charged into the interior thereof, not only the base oil contained in this grease can be prevented from leaking out to the outside but also this base oil can be prevented against oxidization, thereby being able to enhance the life of this grease. Further, various foreign substances existing in the outside can be prevented from entering the space with the respective rolling elements stored therein, thereby being able to prevent the respective raceways and the rolling surfaces of the respective rolling elements against damage. Further, when in use, even in case where the internal pressure of the ball bearing with a seal plate tends to rise, the air of the interior of the ball bearing can be discharged to the outside, thereby being able to prevent the internal pressure from rising. This can prevent the seal lip from turning up, so that the sealing performance by this seal lip can be stabilized. Also, because the dimension of the above cut-away portion is restricted down to a small value, invasion of the air from the outside through this cut-away portion can be restricted (down to a small level). Therefore, regardless of the existence of this cut-away portion, the grease charged into the interior of the ball bearing can be prevented against oxidization.

Figure 1:
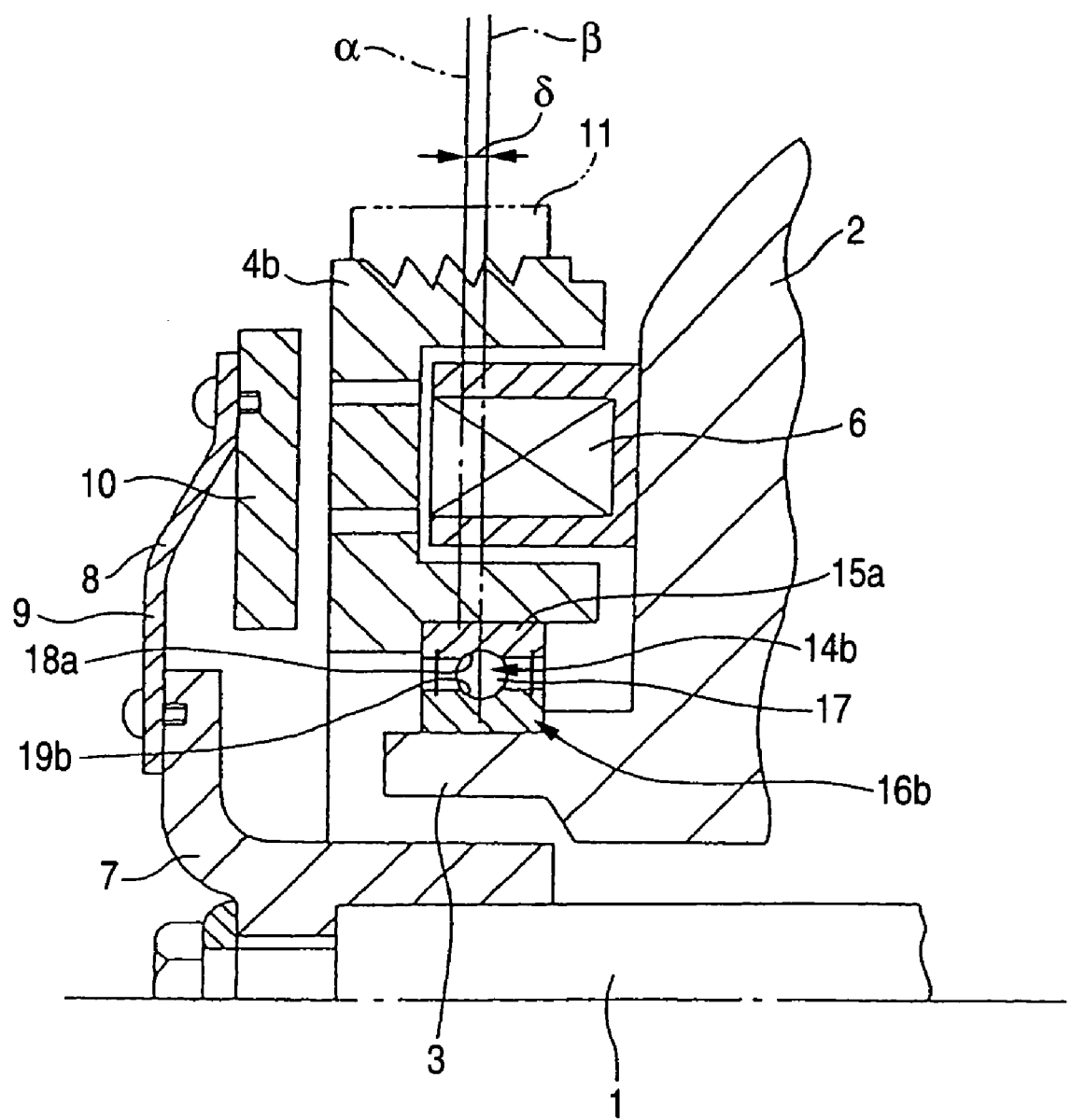
FIG. 1 is a partial section view of a first embodiment of the mode for carrying out the invention.

By the way, referring to the reference characters in the drawings, 1 designates a rotary shaft, 2 a casing, 3 a support tube part, 4, 4a, 4c a driven pulley, 5 a double-row radial ball bearing, 6 a solenoid, 7 a mounting bracket, 8 a ring-shaped plate, 9 a plate spring, 10 an electromagnetic clutch, 11 an endless belt, 12 an outer ring, 13 an inner ring, 14, 14a~14d a radial ball bearing, 15, 15a, 15b an outer ring, 16, 16a~16c an inner ring, 17 a rolling element, 18, 18a, 18b an outer raceway, 19, 19a~19c an inner raceway, 20 a securing groove, 21 a seal ring, 22 a core metal, 23 an elastic member, 24 a seal lip, 25 an internal space, 26 a retainer, 27 a rim portion, 28 a pocket, 29 a rolling bearing, 30 a damping member, 40 a single-row ball bearing, 41 an inner ring, 41a a first groove, 41b a second groove, 42 an outer ring, 42a a first groove, 42b a second groove, 43 a ball (rolling element), 44 a pocket, 45 a crown-type retainer (retainer), 46 a seal member, 46a a core metal, 46b rubber, 47 a retainer main body, 48 a mark, 60 an electromagnetic clutch, 61 a pulley, 62 a compressor housing, 63 a drive shaft, 64 a rotary disk, 65 a flexible member, 66 an armature, 67 a cylindrical shaft, 68 a rotor, 69 a driven pulley, 70 an endless belt, 71 a friction surface, 72 a recessed portion, 73 an electromagnetic coil, 81a a rolling bearing with a seal plate, 82 an inner raceway, 83 an inner ring, 84 an outer raceway, 85, 85a an outer ring, 86 a rolling element, 87 a retainer, 87a a retainer, 88 a rim portion, 90 a securing groove, 91a a seal plate, 91b a seal plate, 92 a space, 93, 93a a core metal, 94, 94b, 94c an elastic member, 98 an outside-diameter-side inclined surface, 99 a shoulder portion, 100 a chamfered portion, 101 an inside-diameter-side inclined surface, 102 a shoulder portion, 103, 103a an outside-diameter-side concavely curved surface, 104 a curved surface portion, a guide portion, 105 an inclined surface, 106 an inside-diameter-side concavely curved surface, 108 a flat surface, 109 an outer surface, 110 a clearance, 111 an outer surface, 121 a rotary shaft, 122 a casing, 123 a support tube part, 124a a driven pulley, 125a, 125b, 125c a rolling bearing with a seal plate, 130 an electromagnetic clutch, 132 an outer ring, 133 an inner ring, 134 a rolling element, 135 an outer raceway, 136 an inner raceway, 137 a securing groove, 138a a seal plate, 139 a core metal, 140, 163 an elastic member, 143 a seal groove, 144a, 144b a side wall surface, 148, 148a a bracket, 149 a ring-shaped member, 150 a small-diameter portion, 151 a large-diameter portion, 152 a stepped portion, 153, 156a~156c, 157, 160a~160c a seal lip, 154 a main body portion, 155, 155a a projecting portion, 158 a flat surface portion, 159 a cut-away portion, 161, 164 a tube-shaped member, 163, 165 a ring-shaped plate, 166 a ring-shaped member, 168 a pulley, 170 an inside-diameter-side cylindrical portion, and 171 a retaining ring, respectively.

BEST MODE FOR CARRYING OUT THE INVENTION

Figure 2:
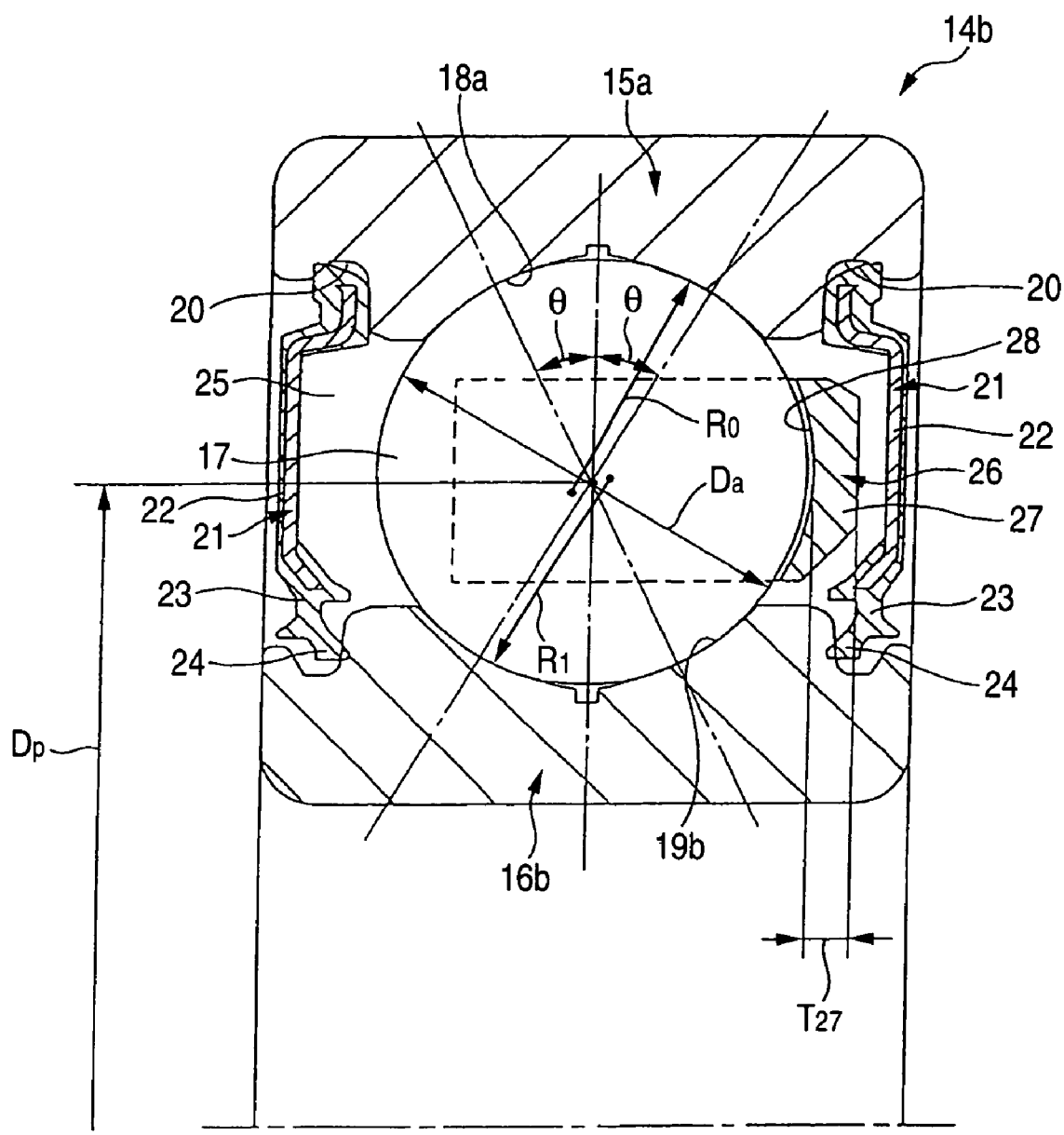
FIG. 2 is a partially enlarged section view of only the radial ball bearing taken out from the first embodiment.
Figure 32:
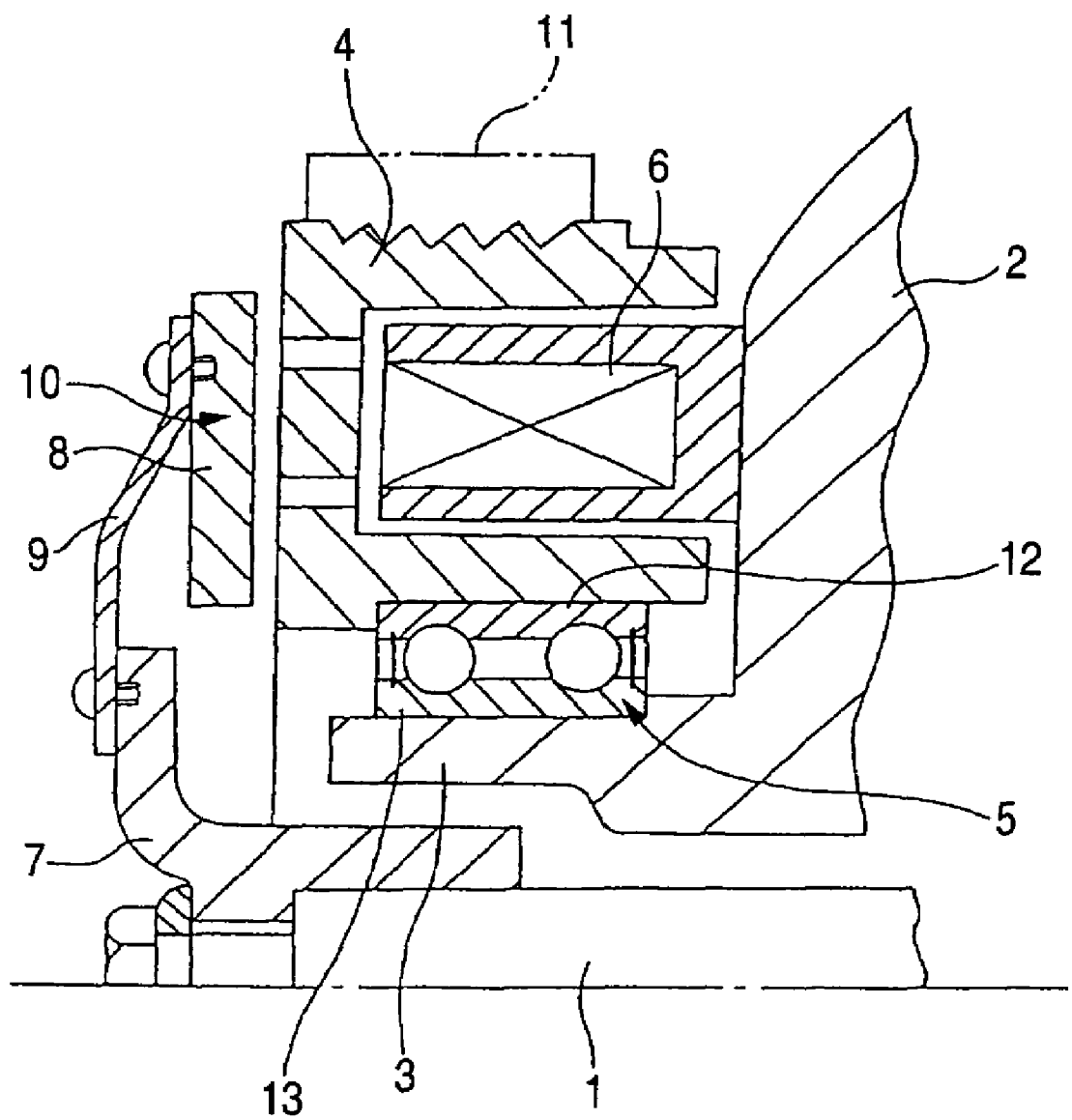
FIG. 32 is a partial section view of a first example of conventional structures.
Figure 33:
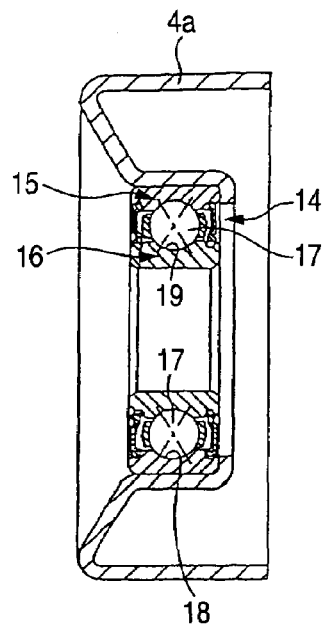
FIG. 33 is a section view of a second embodiment of the conventional structures.
Figure 34:
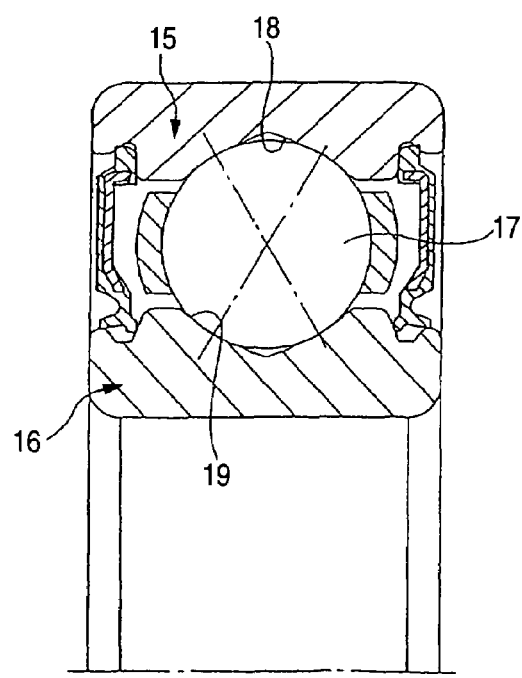
FIG. 34 is a partially enlarged section view of only the four-point-contact-type radial ball bearing taken out the conventional pulley rotation support apparatus; and, FIG. 35 is a partially enlarged section view of only the three-point-contact-type radial ball bearing taken out from the conventional pulley rotation support apparatus.
Figure 35:
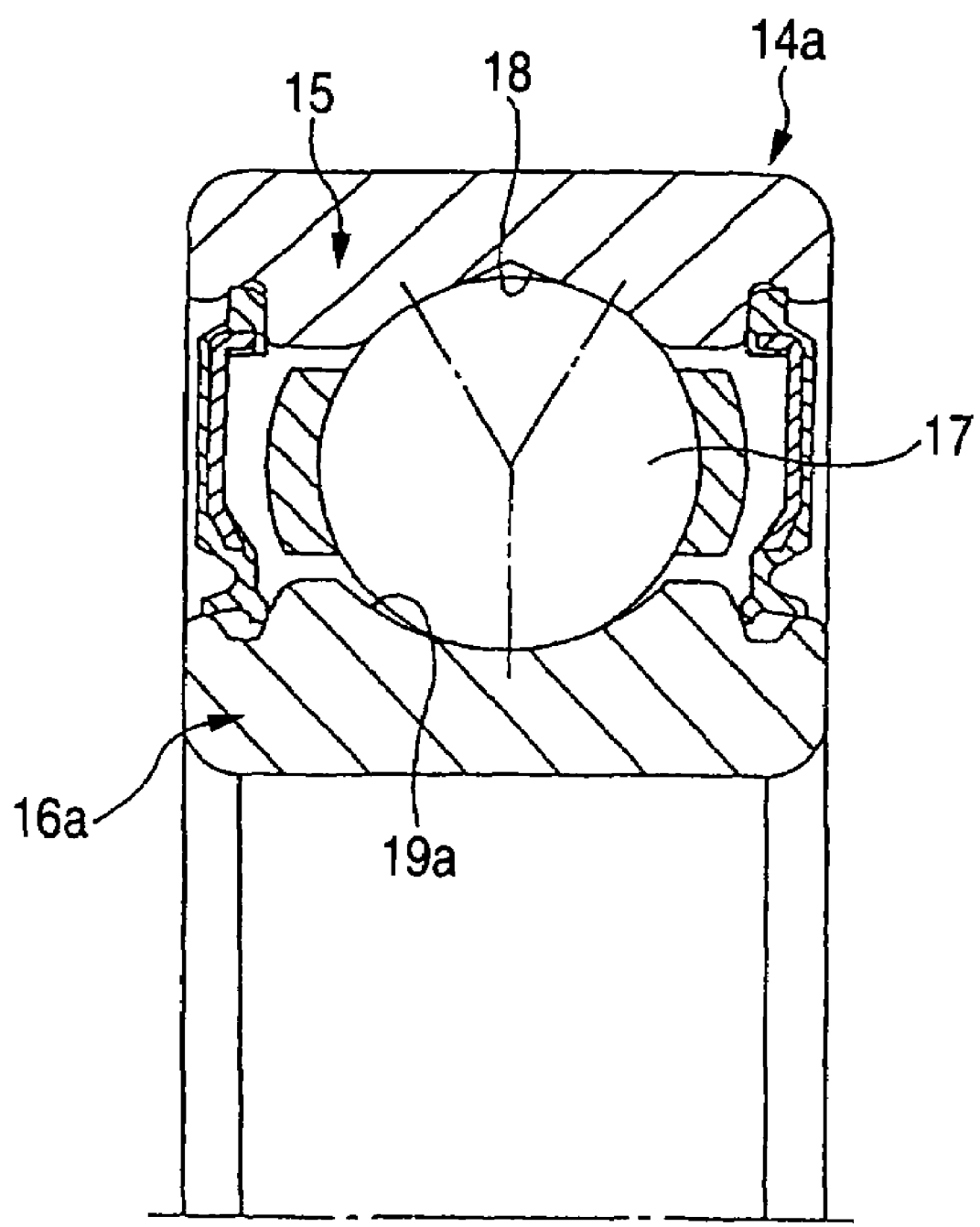

Now, FIGS. 1 and 2 show a first embodiment of the mode for carrying out the invention, which corresponds to the first aspect. By the way, the present embodiment is characterized in that, in a structure using a four-point-contact-type radial ball bearing 14b as a rolling bearing in a rotation support part for a driven pulley 4b, not only the factors of the radial ball bearing 14b are restricted properly but also the position relationship between this radial ball bearing 14b and the above driven pulley 4b is restricted properly in connection with the factors of the radial ball bearing 14b, thereby being able to secure the durability of this radial ball bearing 14b and an endless belt 11 arranged on and over the above driven pulley 4b. The structures and operations of the other parts of the present embodiment are similar to those of the conventional structure shown in the previously described FIG. 32. Therefore, the same designations are given to the same parts and thus the duplicate description thereof is omitted or simplified here. Accordingly, description will be given below mainly of the characteristic portions of the present embodiment.

The radial ball bearing 14b includes an outer ring 15a and an inner ring 16b supported so as to be concentric with each other, and two or more rolling elements 17. Of these composing elements, in the inner peripheral surface of the outer ring 15a, there is formed an outer raceway 18a so as to extend over the entire periphery thereof; and, in the outer peripheral surface of the inner ring 16b, there is formed an inner raceway 19b so as to extend over the entire periphery thereof. The shapes of the sections of the two raceways 18a, 19b are so called Gothic-arch-like shapes which can be obtained when a pair of arcs respectively having the radii of curvature Ro, Ri larger than one half of the diameter Da of each of the rolling elements 17 and also having different centers are crossed with each other in the middle portions thereof. Especially, in the case of the invention, the radius of curvature Ro of the outer raceway 18a is set for a value 0.56 times the diameter Da of each of the rolling elements 17 (Ro≧0.56Da). Also, the radius of curvature Ri of the inner raceway 19b is also set for a value 0.56 times the diameter Da of each of the rolling elements 17 (Ro≧0.56Da). On the other hand, in the case of the conventional pulley supporting radial ball bearing, the radius of curvature of each of the outer and inner raceways is set for a value smaller than a value 0.56 times the diameter of each of the rolling elements and, generally, it is set for a value about 0.52 times the diameter of each rolling element.

When the composing elements of the present embodiment are formed in the above-mentioned manner, the two raceways 18a, 19b can be contacted with the rolling surfaces of the rolling elements respectively at two points, that is, at a total of four points for each rolling element 17. In the case of the present embodiment, the positions of the rolling contact portions between the two raceways 18a, 19a and the rolling surfaces of the rolling elements 17 are expressed as rest angles θ, that is, the angles that are shifted from the centers of the respective raceways 18a, 19b; and, the rest angles θ are respectively set for 20 degrees. Also, in a state where the radial ball bearing 14b is structured by combining together the outer ring 15a and inner ring 16b with the two or more rolling elements 17, in the radial ball bearing 14b, there exists a positive or negative radial clearance; and, even when the positive clearance exists, the value thereof is restricted to 0.2% or less of the pitch circle diameter Dp of the radial ball bearing 14b.

Also, as shown in FIG. 2, to securing grooves 20, 20 which are respectively formed in the inner peripheral surfaces of the two end portions of the outer ring 15a, there are secured the outer peripheral edge portions of seal rings 21, 21, respectively. The seal rings 21, 21 are structured in such a manner that elastic members 23 are respectively reinforced with core metals 22, while the outer peripheral edges of the elastic members 23 are elastically engaged with the securing grooves 20, 20. In this state, the leading end edges of seal lips 24 disposed on the inner peripheral edge portions of the elastic members 23 are slidably contacted with a portion of the inner ring 16b over the entire periphery thereof to thereby seal off the opening portions of the two end portions of an internal space 25 in which the rolling elements 17 are disposed. By the way, as the elastic members 23 which constitute the seal rings 21, 21, preferably, there may be used nitrile rubber or acrylic rubber.

And, grease (not shown) is charged into the internal space 25 that is sealed off from an external space in this manner. Also, in the case of the present embodiment, the respective rolling elements 17 are rotatably held by a crown-type retainer 26. This retainer 26 is formed as an integral body by injection molding synthetic resin such as polyamide resin or polyphenylene sulfide containing therein 5-35 weight percent (preferably, 10-25 weight percent) of glass fibers as reinforcing material. The axial-direction thickness $T_{27}$ of the bottom portion of this retainer 26 (that is, the portion of the retainer 26 that is the thinnest in the circular-ring-shaped rim portion 27 and corresponds to the deep portion of a pocket 28) is set for 10-40% of the diameter Da of the respective rolling elements 17 $\{T_{27}=(0.1\text{-}0.4)Da\}$. By restricting the factors of the retainer 26 in this manner, while preventing an increase in the axial-direction dimension of the retainer 26, the strength of the retainer 26 can be secured and thus, regardless of a centrifugal force applied to the retainer 26 when the driven pulley 4b is in high-speed rotation, the elastic deformation of the retainer 26 can be controlled down to such degree that can prevent occurrence of any practical problem.

The radial ball bearing 14b having the above-mentioned structure, as shown in FIG. 1, is assembled into between the inner peripheral surface of the driven pulley 4b and the support tube part 3 of the casing 2 to thereby constitute a pulley rotation support apparatus for a compressor. In case where a pulley rotation support apparatus for a compressor is structured in this manner, the width-direction central position (in FIG. 1, a chained line α) of an endless belt 11 to be disposed on the outer peripheral surface of the above driven pulley 4b is shifted from the width-direction central position of the above radial ball bearing 14b (that is, the central position of the rolling element 17 shown by a chained line β in FIG. 1) by δ (an offset quantity) in the axial direction (in FIG. 1, in the right and left direction). In the case of the pulley rotation support apparatus according to the invention, the offset quantity δ is set as 40% or less of the pitch circle diameter Dp (FIG. 2) of the radial ball bearing 14b (0.4Dp≧δ). By the way, preferably, the offset quantity δ may be set as 20% or less of the pitch circle diameter (0.2Dp≧δ), more preferably, may be set 10% or less (0.1Dp≧δ), which makes it possible to secure the durability of the radial ball bearing 14b.

Figure 3:
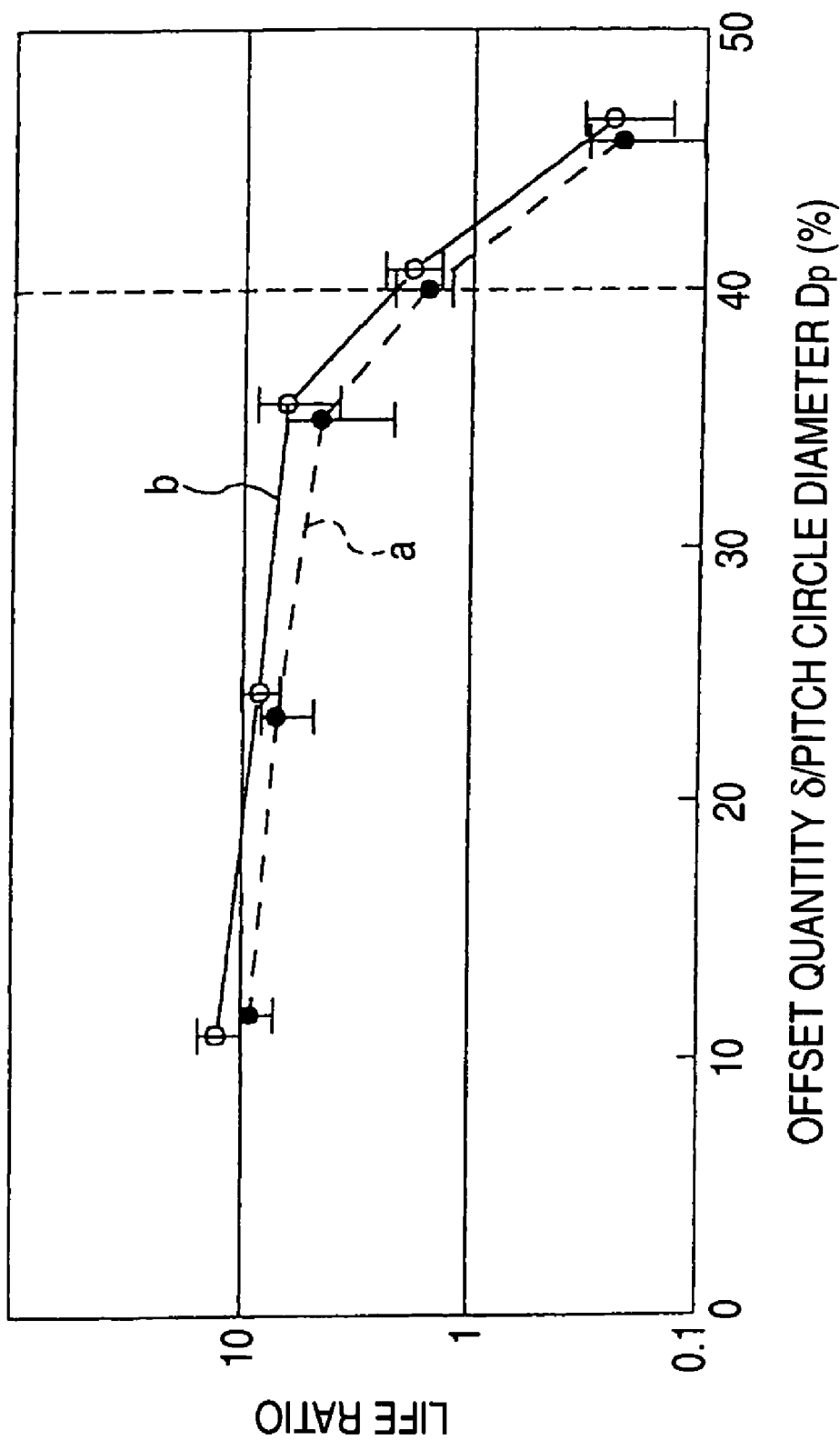
FIG. 3 is a diagrammatic view of the results of an endurance test conducted in order to know the influence of a ratio between an off-set quantity and pitch circle diameter on the durability of the radial ball bearing.

This will be described below with reference to FIG. 3 which shows the results of a test conducted by the present inventors. FIG. 3 is a diagrammatic view of the results of an endurance test conducted in order to know the influence of the ratio of the offset quantity δ of the operation position of a radial load with respect to the center of the radial ball bearing 14b to the pitch circle diameter Dp of the two or more rolling elements 17 constituting the radial ball bearing 14b on the life of the radial ball bearing 14b. In FIG. 3, the horizontal axis thereof expresses the ratio (%) of the offset quantity δ and pitch circle diameter Dp, while the vertical axis expresses the life ratio (a dimensionless number). Also, in the case of the life ratio expressed in the vertical axis, 1 expresses the life that is practically necessary. That is, in case where the life ratio is equal to or more than 1, there can be provided a structure which can withstand practical use; and, in case where the life ratio is less than 1, the structure is not able to with stand practical use. By the way, this life ratio was obtained in the following manner: that is, in a state that the inner ring 16b was fixed and the outer ring 15a was rotating, the radial ball bearing 14b was operated under the following conditions.

Rotation speed: 10000 $min^{-1}$
Temperature: Normal temperature
Radial load: 2254N The present inventors caused the offset quantity δ to vary in a total of five manners in the range of 11.5%-46% and measured the lives (durability) of the radial ball bearing in the respective five cases, using two or more samples for each case. The results of the test are shown by a broken line a in FIG. 3. By the way, in the intermediate portion of the broken line a of FIG. 3, line segments shown in the portions which respectively correspond to the above-mentioned five kinds of offset quantities δ respectively express the ranges of the variations of the test results regarding the above-mentioned two or more samples for each case, while black points on the respective line segments respectively express the means values thereof. As can be clearly seen from FIG. 3 which shows such test results, in case where the offset quantity δ is restricted to 40% or less of the pitch circle diameter Dp of the radial ball bearing 14b, there can be realized a structure which is able to secure a practically necessary life and withstand practical use. On the other hand, in case where the offset quantity δ exceeds 40% of the pitch circle diameter Dp of the radial ball bearing 14b, the durability of the radial ball bearing 14b is lowered suddenly. Also, in case where the offset quantity δ is restricted to 20% or less of the above-mentioned pitch circle diameter, for the life of the radial ball bearing 14b, there can be secured a value eight times the value that is necessary for practical use. Further, in case where the offset quantity δ is restricted to 10% or less of the above-mentioned pitch circle diameter, for the life of the radial ball bearing 14b, there can be secured a value ten times the value that is necessary for practical use.

When the above-mentioned compressor pulley rotation support apparatus is in use, the moment load proportional to the offset quantity δ is applied through the driven pulley 4b to the radial ball bearing 14b due to the tension of the endless belt 11. And, the center axes of the outer ring 15a and inner ring 16b respectively constituting the radial ball bearing 14b tend to be incongruous with each other (to be inclined with respect to each other). However, according to the invention, even in this case, the center axes of the outer ring 15a and inner ring 16b can be prevented from being incongruous with each other.

That is, since the radial clearance of the radial ball bearing 14b when it exists alone is restricted to 0.2% or less of the pitch circle diameter Dp of the radial ball bearing 14b, the above-mentioned two axes are difficult to shift from each other. Also, because the offset quantity δ of the winding position of the endless belt 11 with respect to the radial ball bearing 14b is restricted to 40% or less of the pitch circle diameter Dp, preferably, to 20% or less, more preferably, to 10% or less, the moment load to be applied through the driven pulley 4b to the outer ring 15a can be controlled down to a small value. For these reasons, the inclination of the driven pulley 4b and outer ring 15a with respect to the inner ring 16b can be controlled and thus an excessively large surface pressure can be prevented from acting onto the rolling contact portion of the radial ball bearing 14b, thereby being able to secure the durability of the radial ball bearing 14b. Also, the partial wear of the endless belt 11 arranged on the driven pulley 4b can be reduced, thereby being able to secure the durability of the endless belt 11.

By the way, in order to eliminate the above-mentioned moment load that gives rise to the occurrence of the mutual deviation between the above-mentioned two axes, there may be employed the idea that the offset quantity δ is set for zero; that is, the axial-direction central position α of the winding position of the endless belt 11 on the outer peripheral surface of the driven pulley 4b is made to coincide with the axial-direction central position β of the radial ball bearing 14b. However, in this case, wear and heat generation, which are caused by slippage at the contact points between the rolling surfaces of the rolling elements 17 and the outer ring and inner raceways 18a, 19b, are easy to increase. That is, in case where the offset quantity δ is set for zero in order to eliminate the moment load, the surface pressures of the contact points, namely, two contact points for each rolling element 17 and thus a total of four points existing between the rolling surfaces of the rolling elements 17 and the outer ring and inner raceways 18a, 19b, are substantially equal on the axial-direction two sides. In this state, in case where the driven pulley 4b is rotated, the slippage at the respective contact points is easy to increase, so that the rotation resistance of the radial ball bearing 14b is easy to increase and thus the heat generation is easy to increase. And, as the result of the heat generation and the like, there is a possibility that the rolling fatigue life of the radial ball bearing 14b can be lowered. In view of this, when enforcing the invention, in consideration of such circumstances, the minimum value of the offset quantity δ may also be set for 1 mm or more (δ≧1 mm). By setting the minimum value of the offset quantity δ for 1 mm or larger, there can be provided a difference between the surface pressures of the contact points on the axial-direction two sides, which not only can prevent the occurrence of large slippage at the respective contact points to thereby prevent the rotation resistance of the radial ball bearing 14b from increasing, but also can extend the rolling fatigue life of the radial ball bearing 14b further.

Also, according to the invention, the radii of curvature Ri, Ro of the inner raceway 19b and outer raceway 18a are set 0.56 times the diameter Da of the rolling elements 17 or more (Ri, Ro≧56Da). Thanks to this, even when the invention is used a compressor which is an apparatus requiring an increase in the rotation thereof, an increase in the capacity thereof and a reduction in the size thereof, there can be secured sufficiently not only the seizure life of grease to be charged into the interior of the radial ball bearing 14b but also the run-up allowance of the rolling elements 17.

According to a calculation made by the inventors of the invention, in the case of the pulley rotation support apparatus of the invention, when compared with a conventional apparatus in which the radii of the inner ring and outer raceways are 0.55 times the diameter of the respective rolling elements, a PV value having a great influence on the seizure life of the grease can be reduced by 5% or more. Here, the PV value is the product of the pressure P of the contact portion between the rolling surfaces of the rolling elements 17 and the inner, outer raceways 19b, 18a and the maximum slip speed V of the respective parts of the present contact ellipse. And, the pressure P increases as the ratios Ri/Da, Ro/Da of the radii of curvature Ri, Ro of the inner ring, outer raceways 19b, 18a with respect to the diameter Da of the respective rolling elements 17 increase, whereas the maximum slip speed V decreases as the above ratios Ri/Da, Ro/Da increase. And, because, when these ratios Ri/Da, Ro/Da are 0.56, the degree of the reduction in the above maximum slip speed has a great influence on the PV value, the PV value is reduced suddenly as described above. Further, according to a calculation made by the inventors of the invention, when compared with the above-mentioned conventional apparatus, the run-up allowance of the rolling element 17 onto the shoulder can be enhanced by 12% or more. Thanks to these calculations, the effects of the invention can be confirmed.

Figure 4:
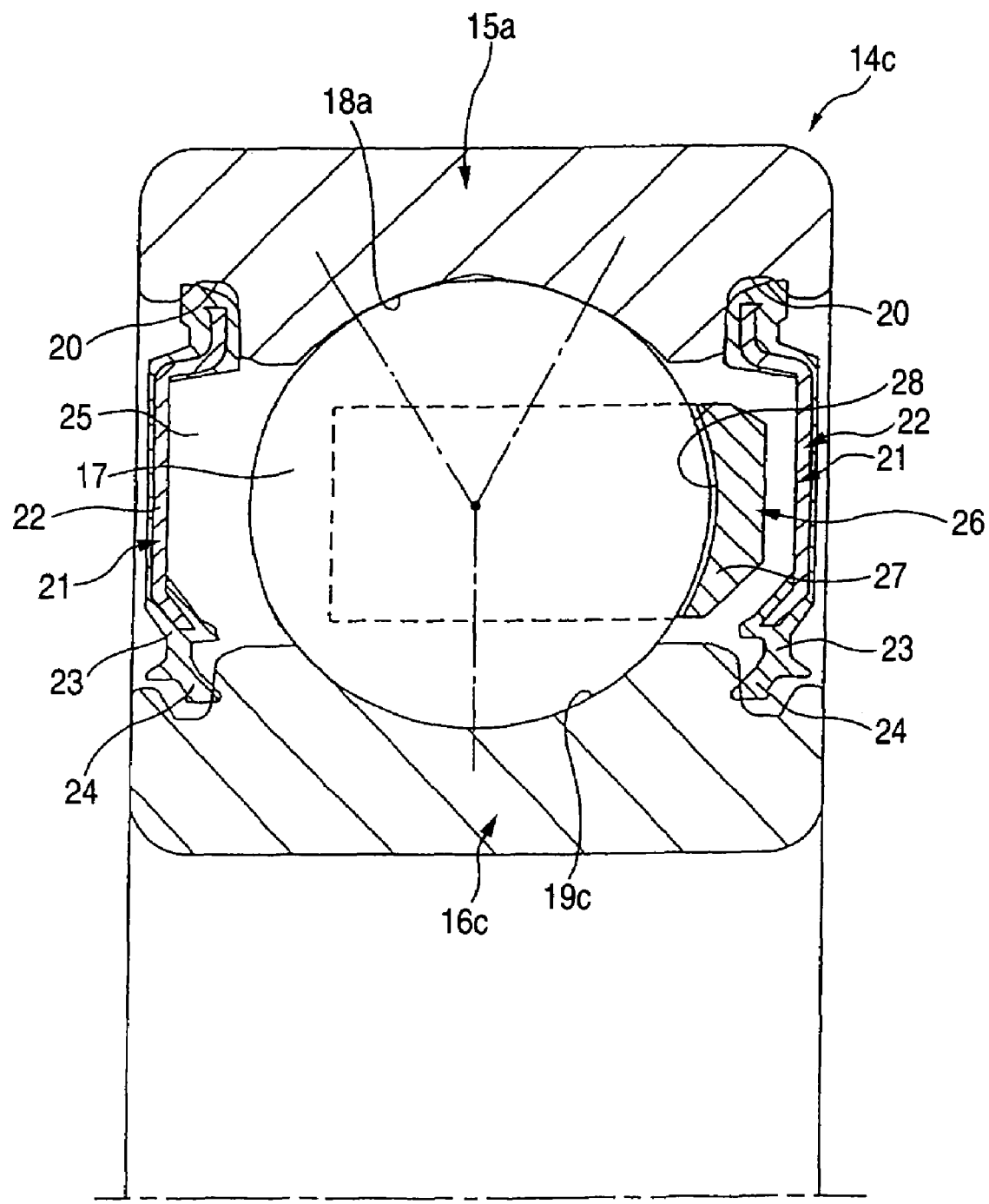
FIG. 4 is a partially enlarged section view of a first example of a three-point-contact-type radial ball bearing.

Also, the foregoing description has been given based on the embodiment of the invention using a four-point-contact-type radial ball bearing 14b in which the rolling surfaces of the rolling elements 17 are contacted with the outer raceway 18a and inner raceway 19b respectively at two points, a total of four points, and the test results thereof. However, even in the case of such a three-point-contact-type radial ball bearing 14c as shown in FIG. 4 in which the rolling surface of a rolling element 17 is contacted with an inner raceway 19c formed in the outer peripheral surface of an inner ring 16c at a point and the rolling surface of the rolling element 17 is contacted with an outer raceway 18a formed in the inner peripheral surface of an outer ring 15a at two points, in case where the embodiment is structured similarly to the above case, similar effects can be obtained. The present inventors conducted a test also on the above three-point-contact-type radial ball bearing 14b and obtained the relationship between the offset quantity and the life ratio. The results of this test, together with those of the previously-described four-point-contact-type radial ball bearing 14b, are shown by a solid b line in FIG. 3. In the intermediate portion of the solid line b of FIG. 3, vertical-direction line segments, which are respectively shown in the portions corresponding to the above-mentioned five kinds of offset quantities δ, express the ranges of variations in the test results regarding to the three-point-contact-type radial ball bearing 14b using two or more test samples for each case, whereas white points on these line segments express the mean values of the respective variation ranges.

As can be seen clearly from FIG. 3 which shows the above-mentioned test results, in the three-point-contact-type radial ball bearing 14c as well, in case where the offset quantity δ is restricted to 40% or less of the pitch circle diameter Dp of the radial ball bearing 14c, there can be secured the life that is practically necessary, thereby being able to realize a structure which can withstand practical use. On the other hand, in case where the offset quantity δ exceeds 40% of the pitch circle diameter Dp of the radial ball bearing 14c, the durability of the radial ball bearing 14c is worsened suddenly. Also, in case where the offset quantity δ is restricted to 20% of or less than the pitch circle diameter Dp of the radial ball bearing 14c, the durability of the radial ball bearing 14c can be enhanced up to a value which is 12 times the practically necessary value or more. Further, in case where the offset quantity δ is restricted to 10% of or less than the pitch circle diameter Dp of the radial ball bearing 14c, the durability of the radial ball bearing 14c can be enhanced up to a value which is about 13 times the practically necessary value or more. As can be seen obviously from such FIG. 3, when the lives of the two kinds of radial ball bearings are compared with each other, the life of the three-point-contact-type radial ball bearing 14c is longer than the life of the four-point-contact-type radial ball bearing 14b.

However, when a moment load is applied to driven pulleys respectively supported by these two rolling element bearings 14c, 14b, the inclination angle of the driven pulley supported by the three-point-contact-type radial ball bearing 14c is larger than the inclination angle of the driven pulley supported by the four-point-contact-type radial ball bearing 14b. Therefore, the life of an endless belt arranged on the driven belt supported by the three-point-contact-type radial ball bearing 14c is shorter than the life of an endless belt arranged on the driven belt supported by the four-point-contact-type radial ball bearing 14b. For this reason, actually, according to uses, while taking into account the balance between the lives of the endless belts of the radial ball bearings 14c, 14b, one of the three-point-contact-type or four-point-contact-type radial ball bearing 14c, 14b can be selected.

Figure 5:
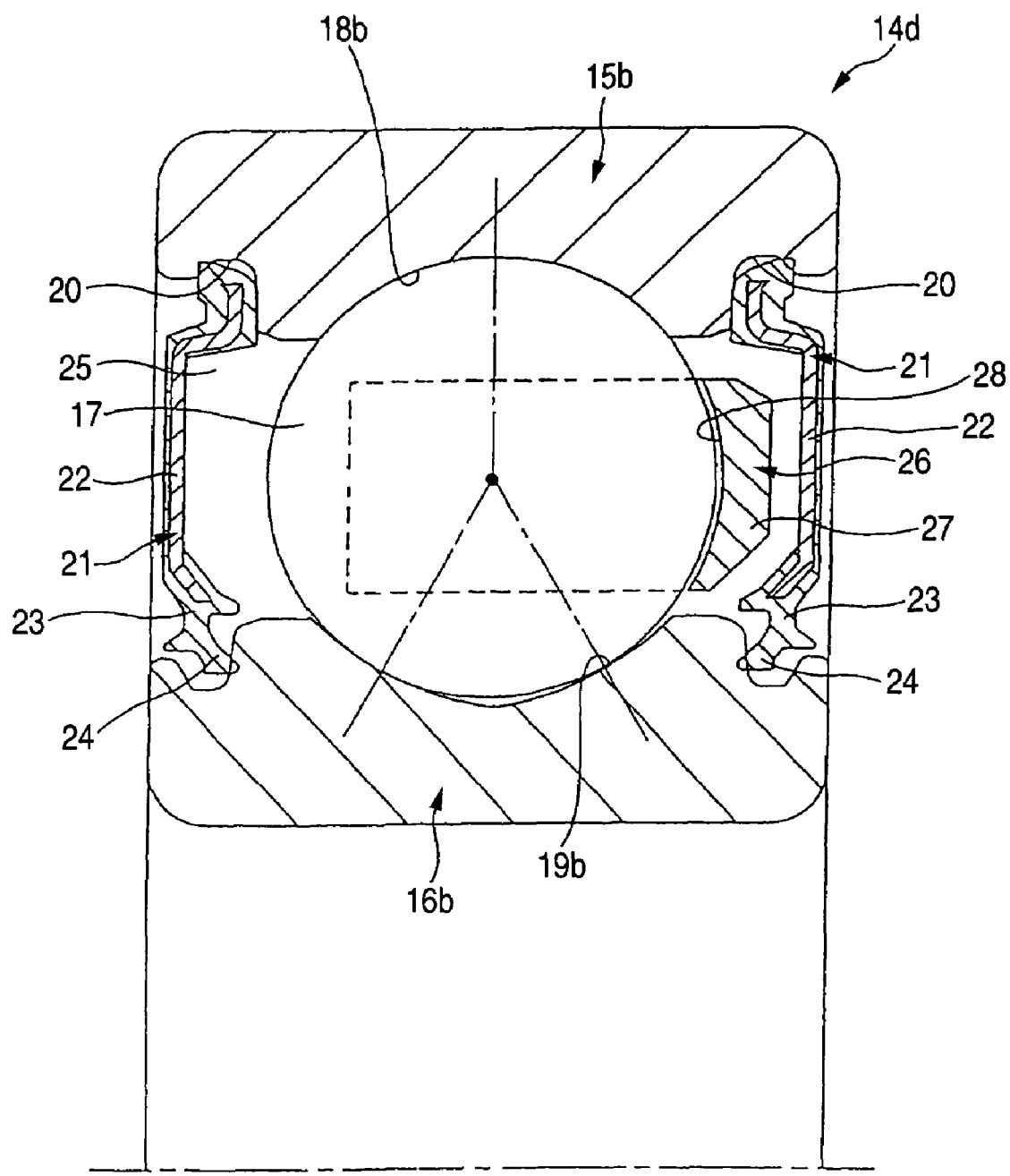
FIG. 5 is a partially enlarged section view of a second example of the radial ball bearing.

Also, a three-point-contact-type radial ball bearing is not limited to the above-mentioned structure shown in FIG. 4 but, in the case of such a three-point-contact-type radial ball bearing 14d as well shown in FIG. 5 in which the rolling surface of a rolling element 17 is contacted with an outer raceway 18b formed in the inner peripheral surface of an outer ring 15b at a point and the rolling surface of the rolling element 17 is contacted with an inner raceway 19b formed in the outer peripheral surface of an inner ring 16b at two points, when the embodiment is structured similarly to the three-point-contact-type radial ball bearing 14c, there can be obtained similar effects.

The present embodiment is based on the Japanese patent application (Patent Application 2002-015428) filed on Jan. 24, 2002 and thus the contents thereof are incorporated into the present embodiment for reference.

Now, FIGS. 7 to 11 show a second embodiment according to the mode for carrying out the invention, corresponding to the first aspect. By the way, the present embodiment is characterized in that the opening direction of a pocket 44 of a retainer 45 used in a single-row ball bearing 40 is set to thereby decide a direction in which a radial load F is applied to a bearing central line β, and the radial load F offset with respect to the bearing central line β is applied to thereby allow grease existing around the periphery of the load area during the operation of the bearing to circulate actively from an inner raceway on the opening side of the pocket 44 of the retainer 45 to an outer raceway.

The single-row ball bearing 40 according to the second embodiment is a four-point-contact-type ball bearing with its inner and outer rings each having a Gothic-arch-like shape; and it comprises an inner ring 41, an outer ring 42, two or more balls (rolling elements) 43 interposed between the inner ring 41 and outer ring 42, a crown-type retainer (which is hereinafter referred to as a retainer) 45 for holding the two or more balls 43 at regular intervals in the peripheral direction thereof, and a pair of seal members (seal plates) 46, 46 disposed on the axial-direction two sides of each of the balls 43.

Also, in the outside diameter surface of the inner ring 41, there are formed a first groove 41a providing a first contact point with the ball 43 and a second groove 41b providing a second contact point with the ball 43, thereby forming an inner raceway. And, in the inside-diameter surface of the outer ring 42 as well, there are formed a first groove 42a providing a first contact point with respect to the balls 43 and a second groove 42b providing a second contact point with respect to the balls 43, thereby forming an outer raceway.

The shape of the section of the inner raceway is formed as a Gothic-arch-like shape to be contacted with the ball 43 at a given rest angle, and this shape is symmetric with respect to the axial-direction central line β of the bearing.

The radius of curvature of the first groove 41a of the inner ring 41 is equal to the radius of curvature of the second groove 41b thereof.

Also, the shape of the section of the outer raceway is formed as a Gothic-arch-like shape to be contacted with the ball 43 at a given rest angle, and this shape is symmetric with respect to the axial-direction central line β of the bearing. The radius of curvature of the first groove 42a of the outer ring 42 is equal to the radius of curvature of the second groove 42b thereof.

The retainer 45 is structured such that, on a retainer main body portion 47 having a circular-ring shape, there are formed two or more pockets 44 at regular intervals in the circumferential direction thereof through pillar portions. Since the single-row ball bearing 40 is used when the radial load F is applied to the axial-direction central line β of the bearing toward the right middle side in FIG. 7, the opening of the pocket 44 of the retainer 45 is formed so as to face in the direction where the radial load F is applied.

The seal member 46 is formed such that a core metal 46a composed serving as a core member is covered with rubber 46b made of elastic material. The seal member 46 is a member which is mounted on the outer ring 42 after the balls 43 are mounted between the inner and outer rings, and it is of a contact type that the leading end portion thereof can be contacted with the inner ring 41.

And, grease serving as a lubricant is charged into a bearing space enclosed by the pair of seal members 46, 46.

In the single-row ball bearing 40, the opening side of the pocket 44 of the retainer 45 is displaced so as to face in the direction where the radial load F is applied; however, in the assembled state of the bearing, since the existence of the seal member 46 makes it difficult to confirm the assembling direction of the retainer 45, it is necessary to be able to confirm the assembling direction of the retainer 45 from the outer appearance of the bearing.

Figure 8:
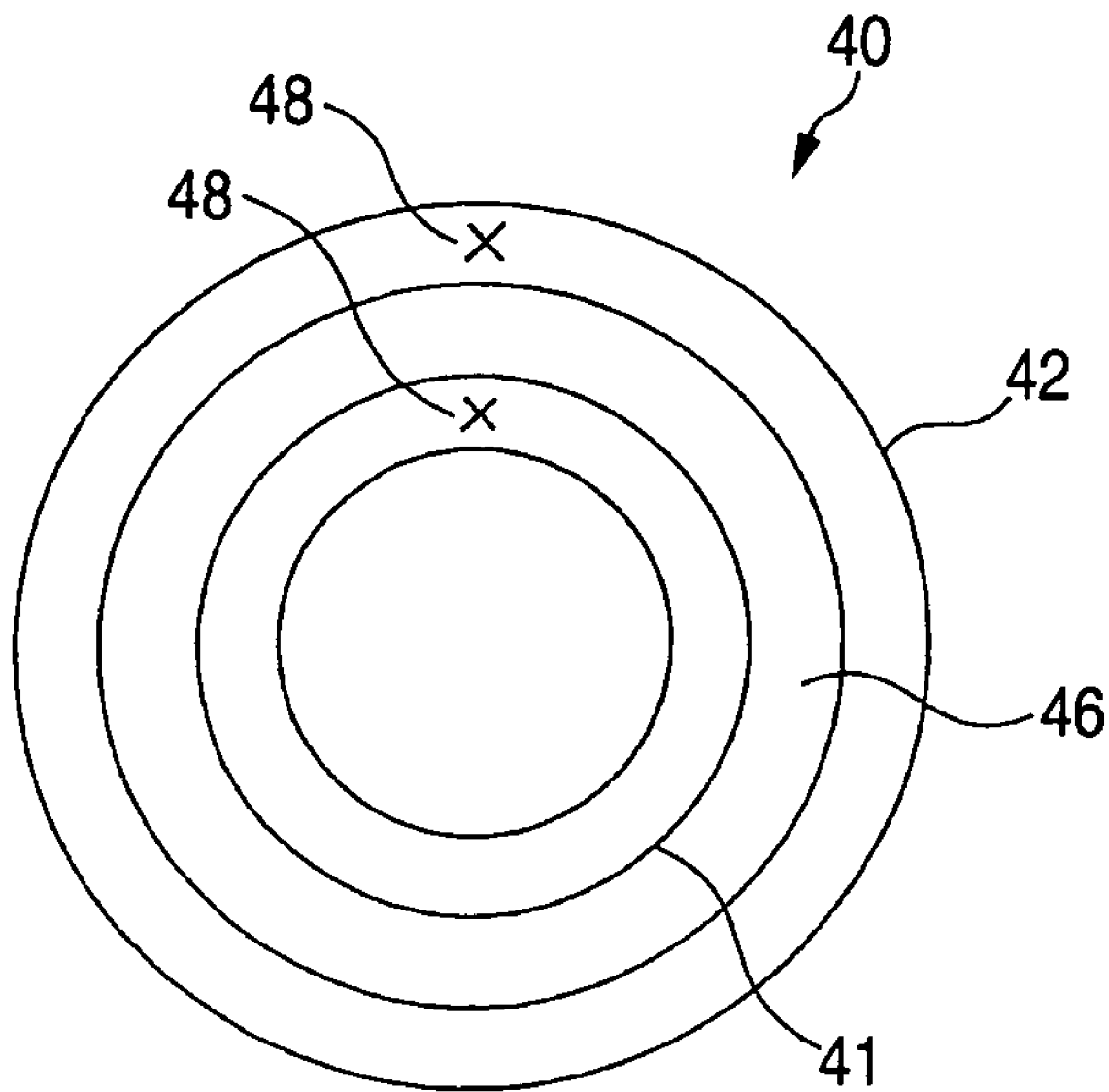
FIG. 8 is a front view of FIG. 7.

That is, as shown in FIG. 8, signs 48 serving as marks showing the opening side of the pocket 44 of the pocket 44 of the retainer 45 are applied to the end faces (front surfaces) of the inner ring 41 and outer ring 42 that are disposed on the opening side of the pocket 44. Thus, even when the bearing 40 is held in the assembled state thereof, the opening side of the pocket 44 of the retainer 45 can be confirmed simply and instantaneously, which can positively eliminate the wrong confirmation of the assembling direction of the bearing.

By the way, the sings 48 may also be applied to the end faces of the inner ring 41 and outer ring 42 that are disposed on the counter-opening side of the pocket 44 of the retainer 45 disposed on the opposite side to FIG. 8. In this case, the side, to which the marks 48 are applied, shows the assembling start position side of the retainer 45, while the side with no marks 48 applied thereto shows the opening side of the pocket 44 of the retainer 45 necessarily.

Also, the marks 48 shown in FIG. 8 are simply an example and the marks are not limited to them, that is, they can be selected arbitrarily. For example, a seal-like member produced separately may be bonded to the end face, or the end face may be directly carved. Further, the mark may also be formed in a plane manner or in a projecting manner, while the number and position of the marks may be selected arbitrarily.

Also, the mark 48 may also be applied to one of the end faces of the inner ring 41 and outer ring 42. And, the mark 48 may also be applied to the seal member 46 which is opposed to the opening side or back surface side of the pocket 44 of the retainer 45.

Also, as the mark, the colors or materials of the seal members 46 may be changed to thereby vary the structures of the bearing-one-end-side and the other-end-side seal members from each other. For example, the colors or patterns of the two seal members 46 may be different from each other.

Further, uneven portions such as notches may be formed in one or both of the axial-direction end edge portions of the inner ring 41 and outer ring 42 to thereby distinguish from each other.

Figure 7:
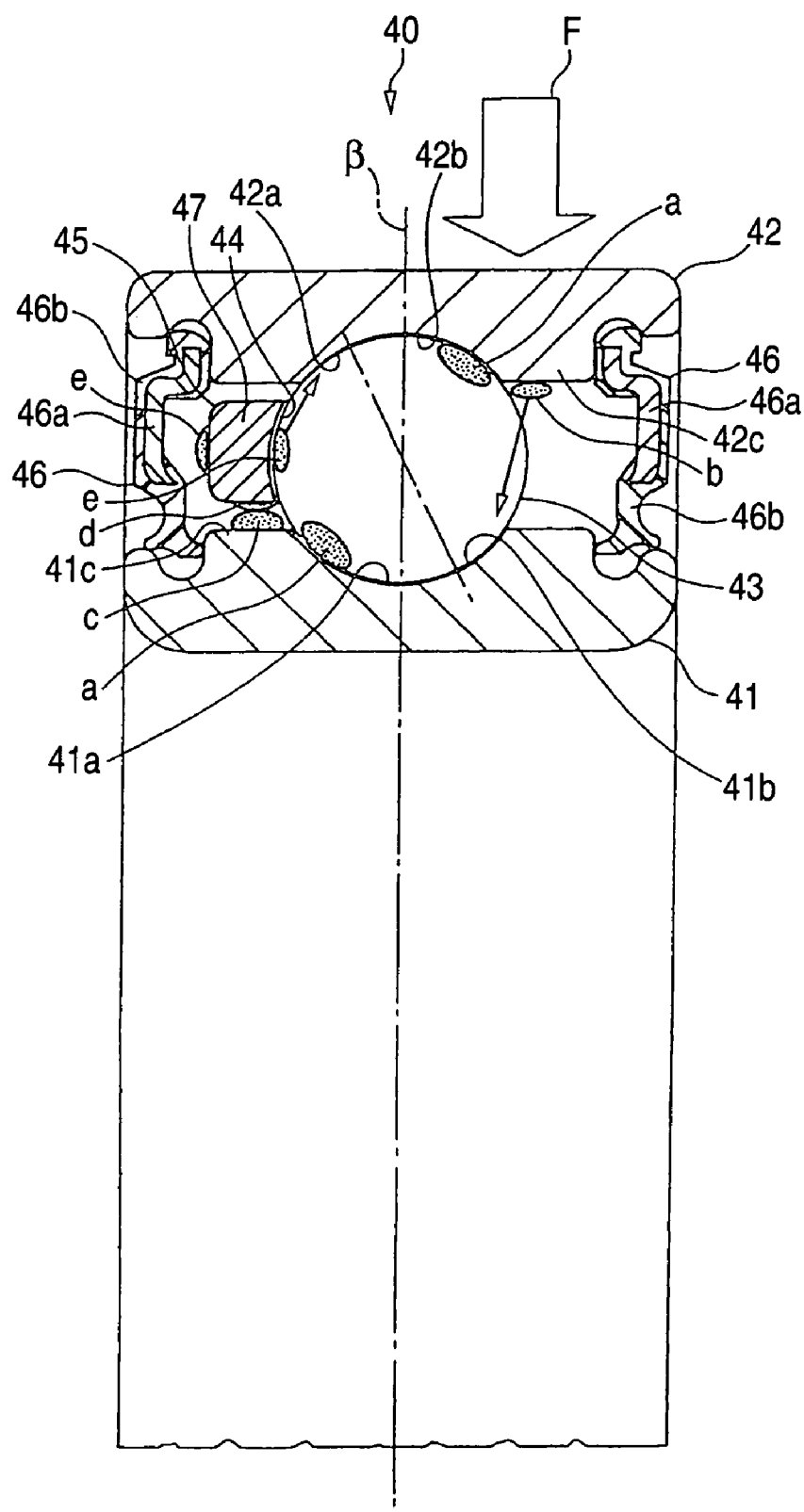
FIG. 7 is a section view of a half section of a second embodiment of the mode for carrying out the invention.

According to the thus-structured single-row ball bearing 40, in case where, while it is in operation, the radial load F is applied to the axial-direction central line β of the bearing on the right side in FIG. 7, the outer ring 42 is inclined due to the radial load F. As the outer ring 42 is inclined, the ball 43 is contacted with the inner and outer rings with a certain contact angle, so that grease poured into the second groove 42b of the outer raceway is moved to the counter-contact side where a clearance between the ball 43 and raceway groove is wide.

At the then time, in the bearing space on the opening side of the pocket 44, the grease existing in the first groove 42b, as shown by b in FIG. 7, piles up on the outer ring shoulder portion 42c and then, due to the rotation of the ball 43 on its own axis, it moves toward the inner raceway.

On the other hand, in the bearing space existing on the counter-opening side of the pocket 44, grease existing in the first groove 41a of the inner raceway shown by a in FIG. 7, as shown by c in FIG. 7, accumulates on the inner ring shoulder 41c and, when it is moved toward the outer raceway due to the rotation of the ball 43 on its own axis, as shown by d in FIG. 7, it is scraped by the edge portion of the pocket 44 of the retainer 45 and piles up on the inside diameter portion of the retainer 45.

And, the grease piled up on the inside diameter portion of the retainer 45 and shown by d in FIG. 7, as shown by e in FIG. 7, moves into the interior of the pocket 44 of the retainer 45 and, at the same time, due to a centrifugal force generated by the rotation of the retainer 45, the grease moves from the outside diameter portion of the retainer 45 to the first groove 42a of the outer raceway along the end face of the retainer main body 47 of the retainer 45.

Thanks to this, while the bearing is in operation, the grease existing around the load area is circulated from the inner raceway on the pocket 44 opening side of the retainer 45 to the outer raceway. As a result of this, much grease flows into the inner raceway and outer raceway to thereby realize the active circulation of the grease.

By the way, in the case of the grease existing around the no-load area, since the contact surface pressure between the ball 43 and outer raceway and inner raceway is small and thus they are little contacted with each other, they have only a small influence on the seizure of the grease.

As described above, in the single-row ball bearing 40 according to the second embodiment, since the opening of the pocket 44 of the retainer 45 is disposed so as to face in the direction where the radial load F is applied to the bearing center line β, in case where the radial load F offset with respect to the bearing center line β is applied, during the operation of the bearing, the grease existing around the load area is actively circulated from the inner raceway on the opening side of the pocket 44 of the retainer 45 to the outer raceway.

Therefore, when the bearing receives the offset load, the bearing seizure life can be extended and thus the bearing performance can be enhanced.

Also, because the marks 48 showing the direction of the opening of the pocket 44 of the retainer 45 are applied to the inner ring 41 and outer ring 42 of the inner ring 41, outer ring 42 and seal members 46, when assembling the single-row ball bearing 40, there is no possibility that the direction of the opening of the pocket 44 of the retainer 45 can be mistaken, so that the assembling operation allowing the single-row ball bearing 40 to fulfill the performance thereof can be carried out very simply.

Next, as a comparative example for the second embodiment, there is taken an example in which the assembling direction of the retainer 45 is reversed and the comparative example will be described below with reference to FIG. 9. By the way, in the present comparative example, parts thereof having similar structures and operations to those that have been already described are given the same designations or equivalent designations in FIG. 9 and thus the description thereof is simplified or omitted here.

Figure 9:
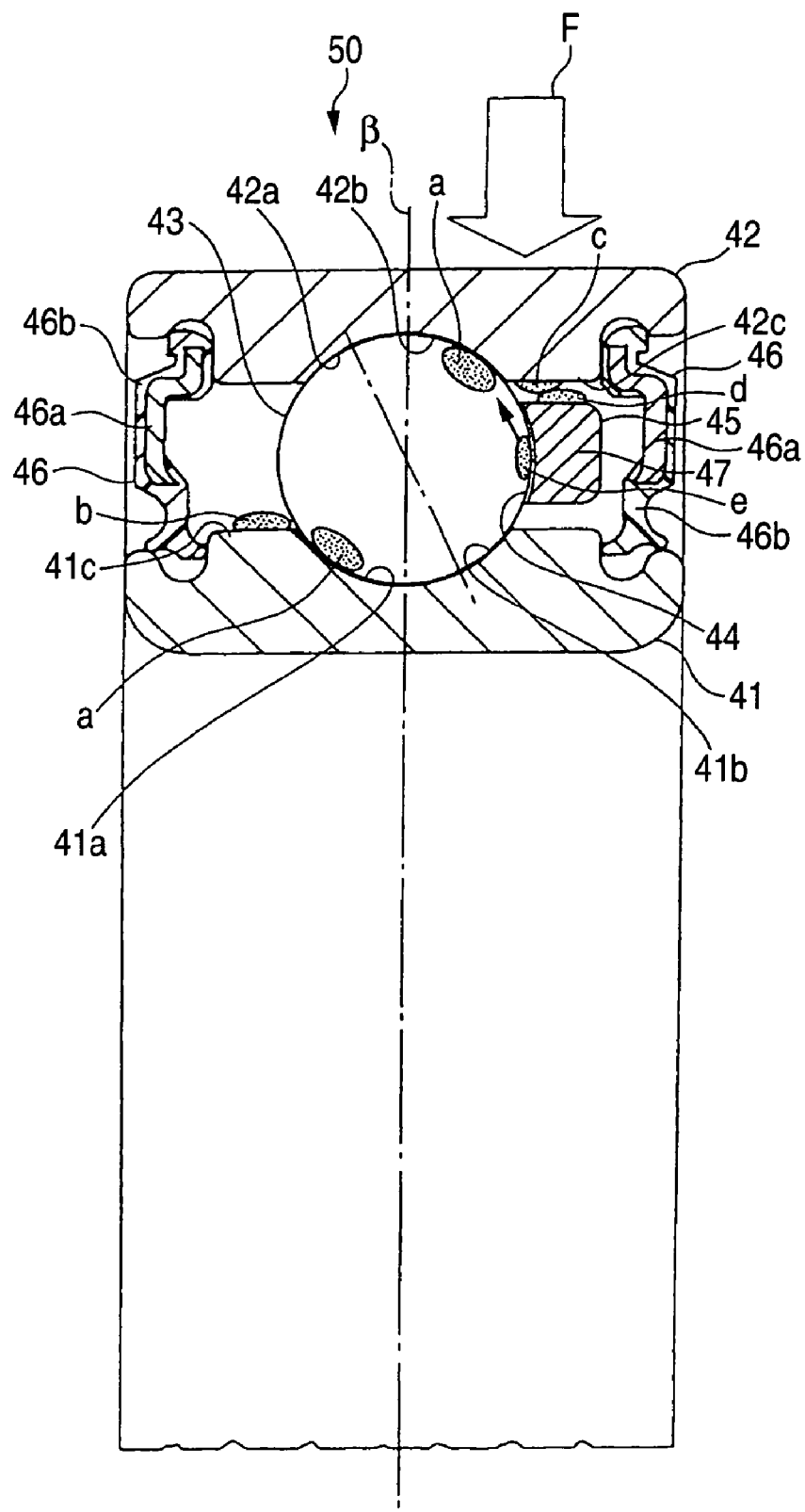
FIG. 9 is a half section view of the second embodiment applied to a comparative example.

As shown in FIG. 9, in a single-row ball bearing 50, a retainer main body 47 situated on the back surface of the retainer 45 is disposed on the side where the radial load F on the right side in FIG. 9 is applied to the axial-direction center line β of the bearing.

In the single-row ball bearing 50 according to the comparative example, in case where, during the operation of the bearing, the radial load F is applied to the axial-direction center line β of the bearing on the right side in FIG. 9, the outer ring 42 is inclined due to the radial load F. As the outer ring 42 is inclined, the ball 43 is contacted with the inner and outer rings with a certain contact angle, so that grease poured into the inner raceway and outer raceway is moved to the counter-contact side where a clearance between the ball 43 and raceway groove is wide.

At the then time, in the bearing space on the opening side of the pocket 44, the grease of the first groove 41a of the inner raceway shown by a in FIG. 9, as shown by b in FIG. 9, accumulates on the inner ring shoulder portion 41c and is then moved to the outer raceway due to the rotation of the ball 43 on its own axis.

On the other hand, in the bearing space on the retainer main body 47 side which is the back surface side of the pocket 44, the grease of the second groove 42b of the outer raceway shown by a in FIG. 9, as shown by c in FIG. 9, accumulates on the outer ring shoulder portion 42c and is going to move toward the inner raceway due to the rotation of the ball 43 on its own axis; however, as shown by d in FIG. 9, the grease is scraped off by the edge portion of the pocket 44 of the retainer 45 and thus it accumulates on the outside diameter portion of the retainer 45.

And, the grease, which accumulates on the outside diameter portion of the retainer 45 and is shown by d in FIG. 9, as shown by e in FIG. 9, moves into the interior of the pocket 44 of the retainer 45, or, due to a centrifugal force generated by the rotation of the retainer 45, the grease is returned again to the outer raceway shown by a in FIG. 9.

In this manner, when the retainer main body 47 situated on the back surface of the retainer 45 is disposed on the side where the radial load F is applied to the axial-direction center line β of the bearing, during the operation of the bearing, the grease existing in the second groove 42b of the outer raceway on the retainer main body 47 side, which is the counter-opening side of the pocket 44 of the retainer 45, does not move from the outer raceway to the inner raceway but stagnates around the outer raceway.

Figure 10:
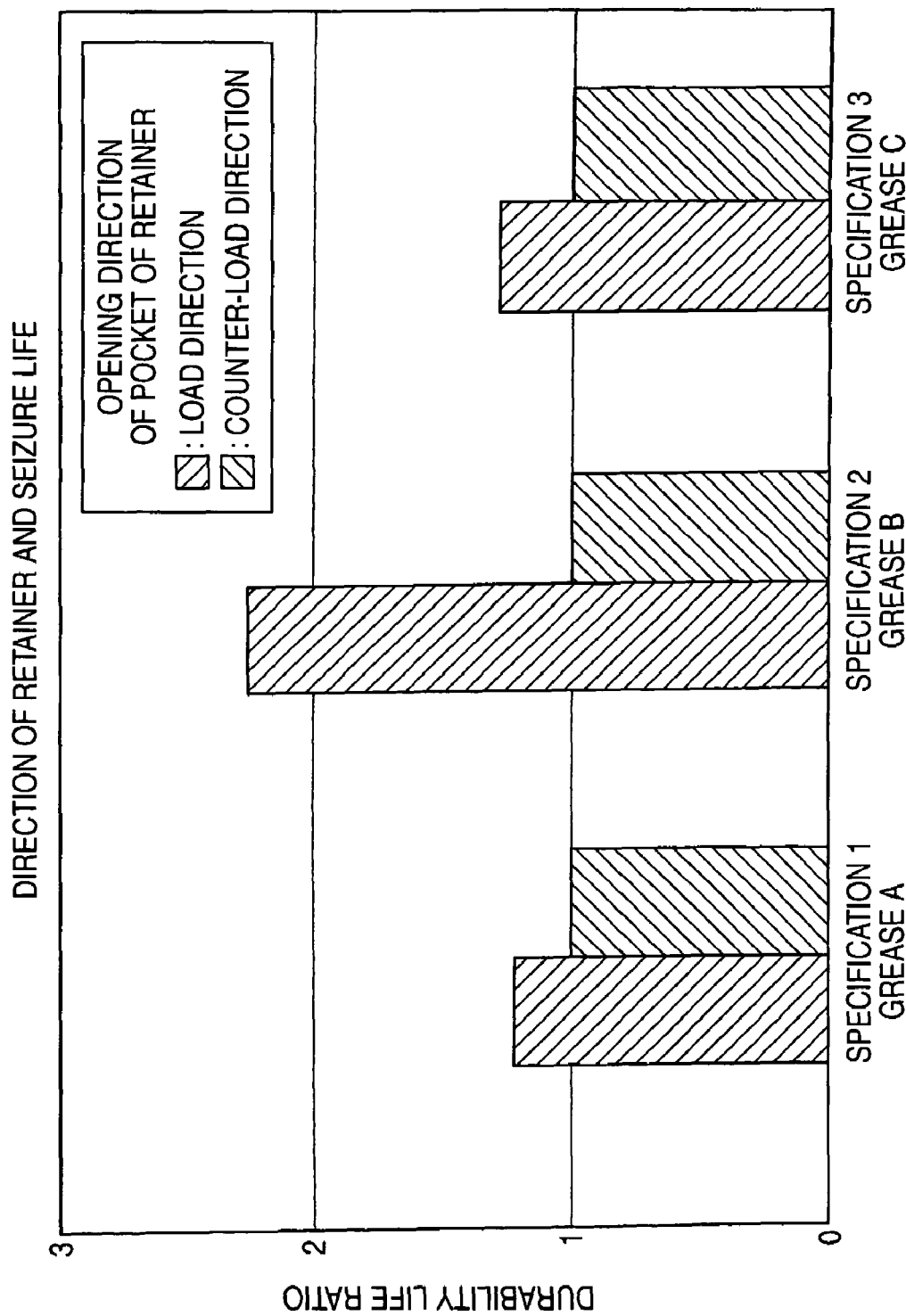
FIG. 10 is an explanatory view of the results of a durability test.

Next, FIG. 10 shows the results of a high temperature and high speed durability test conducted using the single-row ball bearing 40 according to the second embodiment.

The test was conducted under the following conditions.
Outer ring rotation: 10,000 r/min
Moment load: 7,000~10,000 N·mm.
Evaluation was carried out using a combination of the following three kinds of specifications.
Specification 1: Grease A (Ether group)
Specification 2: Grease B (Ether group+Polyalphaolein group)
Specification 3: Grease C (Ether group+Polyalphaolein group+Ester group)

The results of the above test show that the specification 1 provides a value 1.22 times, specification 2 provides a value 2.26 times and specification 3 provides a value 1.28 times. That is, it is found that the specification, in which the opening of the pocket 44 of the retainer 45 is disposed such that the radial load F direction faces the bearing central line β, can withstand long-time use. Especially, when the grease B according to the specification 2 is used, it is found that it can provide an outstanding effect.

By the way, the second embodiment is not limited to the above-mentioned structure but it can be deformed or improved properly. For example, the present embodiment is not limited to the four-point-contact ball bearing used as the single-row ball bearing, but, also when a deep-groove ball bearing, an angular ball bearing, or a three-point-contact ball bearing is used, there can be obtained a similar effect to the above-mentioned case.

Also, the kinds of the components or the like of the grease, the shape and material of the pocket of the retainer, the shape, material and the like of the seal member are not limited to the above-mentioned ones at all.

Figure 11:
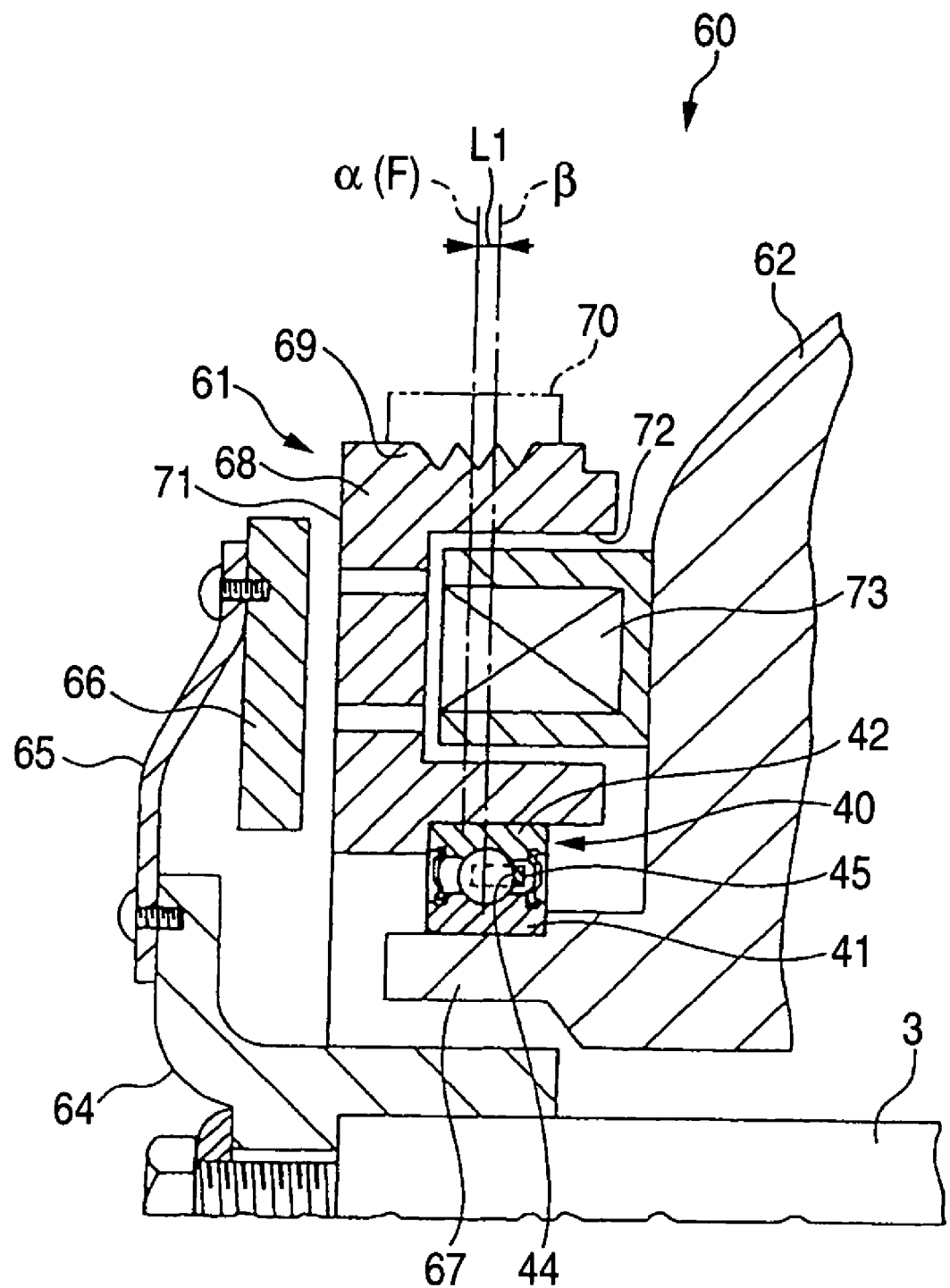
FIG. 11 is a section view of the second embodiment when it is applied to a pulley of an electromagnetic clutch for a car air conditioner compressor.

The single-row ball bearing 40 according to the second embodiment can also be applied to, for example, the pulley 61 of an electromagnetic clutch 60 for a car air conditioner compressor shown in FIG. 11. This electromagnetic clutch 60 is used to transmit the rotation power generated by an engine to a compressor disposed in a refrigerating cycle for a car air conditioner or cut off the rotation power.

In the case of the electromagnetic clutch 60, a rotary disk 64 is disposed on the leading end portion of a drive shaft 63 which projects rotatably from the center of a compressor housing 62 and, on the outer periphery side of the rotary disk 64, there is mounted an armature 65 through a flexible member 65. A cylindrical shaft 67 is disposed integrally with and projectingly from the compressor housing 62 in such a manner that it encloses the periphery of the drive shaft 63, and the inner ring 41 of the single-row ball bearing 40 is fitted with the outside of the outer peripheral surface of the cylindrical shaft 67.

A rotor 68 is fitted with the outer surface of the outer ring 42 of the single-row ball bearing 40 and a driven pulley 69 is formed integrally with the outer peripheral surface of the rotor 68. An endless belt 70 shown by an imaginary line is displaced on the outer peripheral surface of the driven pulley 69. Also, on the side surface of the rotor 68 on the opposite side to the compressor housing 62, there is formed a friction surface 71 which transmits the rotation power due to a friction force generated when it is contacted with the armature 66.

A recessed portion 72 is formed in the side surface of the rotor 68 on the compressor housing 62 side. In to the recessed portion 72, there can be stored an electromagnetic coil 73 in such a manner that it is not contacted with the rotor 68. The electromagnetic coil 73 is fixed to the compressor housing 62.

The single-row ball bearing 40 is assembled between the rotor 68 and driven pulley 69 in such a manner that the center of the radial load F, which is the width-direction center position α of the endless belt 70, is situated at a position shifted by an offset quantity L1 with respect to the bearing center line β; and, the opening of the pocket 44 of the retainer 45 is disposed so as to face in the direction where the radial load F is applied to the bearing center line β.

In the thus-structured electromagnetic clutch 60 for a car air conditioner compressor, when the electromagnetic coil 73 is not energized, the friction surface 71 is disposed in such a manner that it has a clearance with respect to the armature 66. And, in case where a current is allowed to flow in the electromagnetic coil 73, there is generated a magnetic field and, due to its magnetic field, the armature 66 is attracted toward the electromagnetic coil 73 against the elastic force of the flexible member 65 and is thereby pressure contacted with the friction surface 71. Thanks to this, the rotation power of the pulley 61 is transmitted to the compressor through the armature 66, rotary disk 64 and drive shaft 63, thereby driving the compressor.

The second embodiment disclosed in the present patent application is based on the Japanese Patent Application (Patent Application 2002-174268) filed on Jun. 14, 2002 and thus the contents of the present application are taken into the second embodiment for reference.

Figure 12:
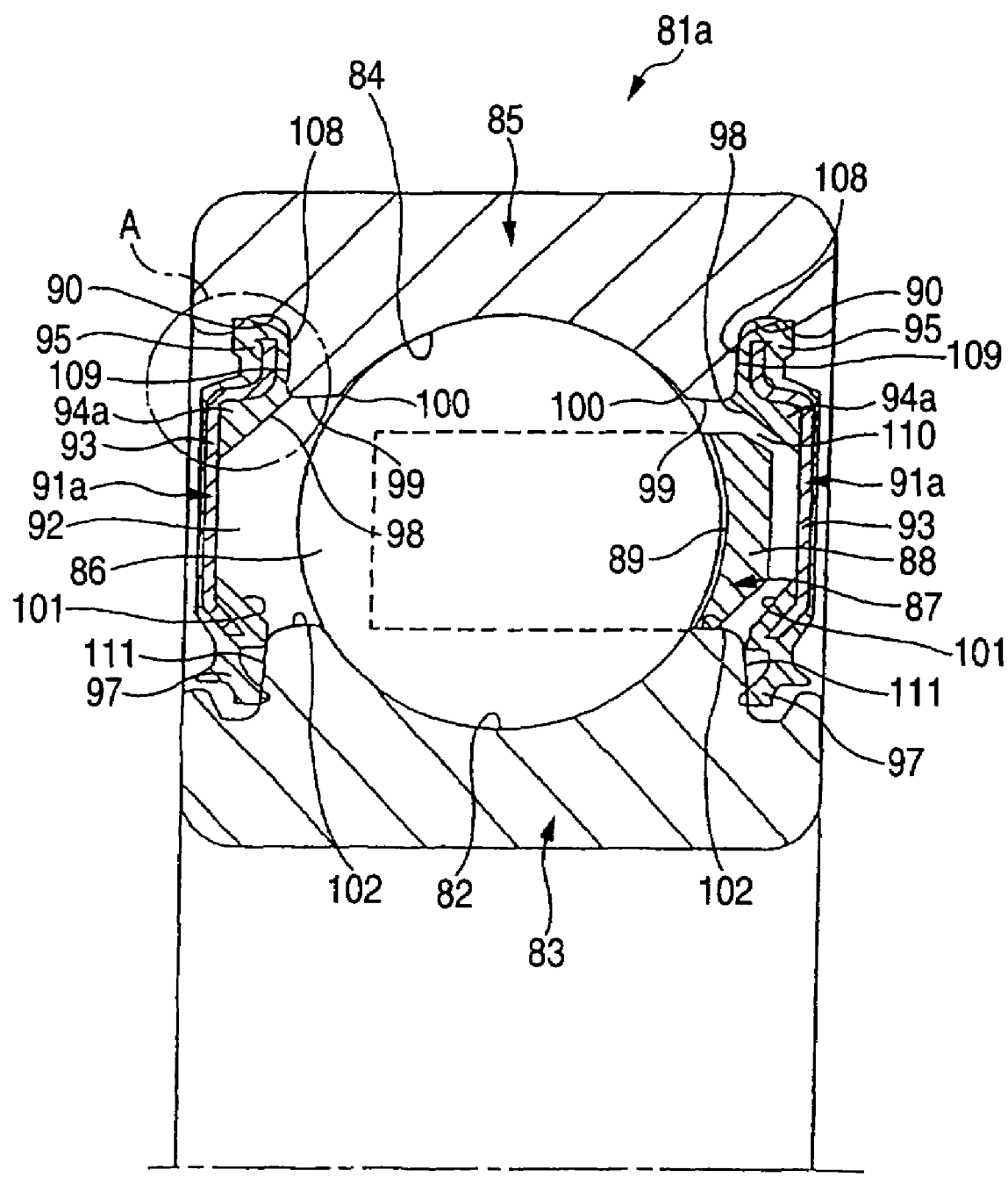
FIG. 12 is a section view of a half section of a third embodiment of the mode for carrying out the invention.
Figure 13:
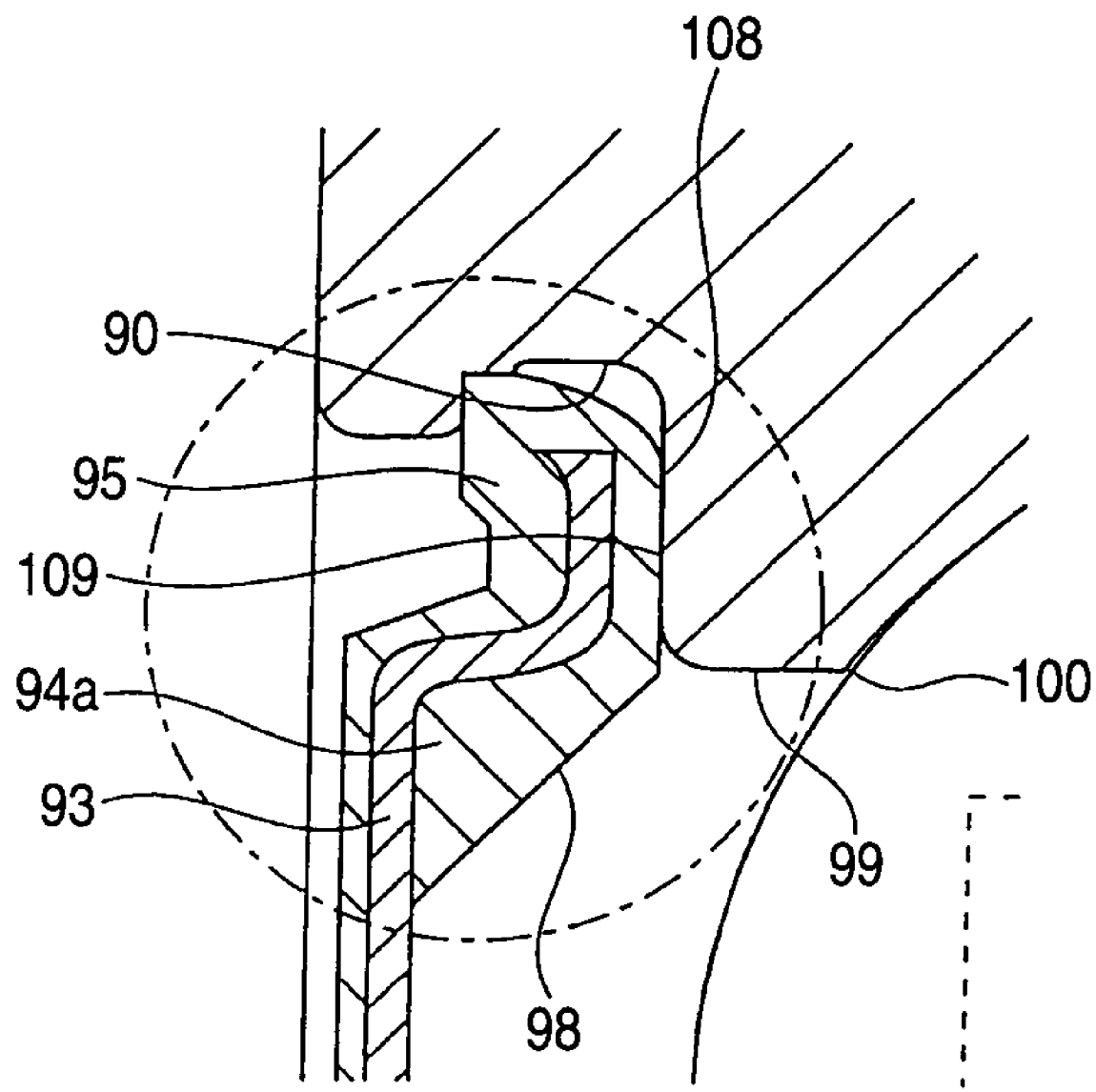
FIG. 13 is an enlarged view of the A portion shown in FIG. 12.

Now, FIGS. 12 and 13 show a third embodiment of the mode for carrying out the invention. By the way, the present embodiment is characterized by an improvement in the shape of a seal plate 91a which allows grease charged into the space 92 of a rolling bearing 81a with a seal plate to circulate within the space 92 to thereby delay the degradation of the grease used to lubricate the rolling contact portions of an inner raceway 82 and outer raceway 84 with the rolling surfaces of the respective rolling elements 86.

Of the inner surfaces of the seal plate 91a constituting the rolling bearing 81a with a seal plate according to the present embodiment, the near-to-outside-diameter portion close to the inner peripheral surface of an outer ring 85 (which exists in the portion of the inner surface of the seal plate 91a slightly nearer to the inside diameter portion than the inner peripheral surface of the outer ring) is formed as an outside-diameter-side inclined surface 98 which is inclined inwardly in the axial direction as it goes outwardly in the diameter direction thereof and also which corresponds to in inclined surface as set forth in the third aspect. This outside-diameter-side inclined surface 98 can be formed of a portion of an elastic member 94a constituting the above seal plate 91 in the following manner: that is, the inner surface of such portion of the elastic member 94a that is situated near to the outside-diameter portion of the seal plate 91a is inclined inwardly as it goes outwardly in the diameter direction thereof Also, a flat surface 108 existing on the periphery of the above outside-diameter-side inclined surface 98 is contacted with the entire periphery of the outer surface 109 of a shoulder portion 99 existing between the outer raceway 84 and a securing groove 90. Therefore, the outer peripheral edge of the outside-diameter-side inclined surface 98 is contacted with or is close to the outer edge of the outer peripheral surface of the above shoulder portion 99. By the way, the continuing portions between the inner peripheral surfaces of the above shoulder portions 99 and the outer raceway 84 are formed as chamfer portions 100, which makes it difficult for the respective rolling elements 86 to run up onto the shoulder portions 99. This chamfer portion 100 is chamfered, for example, by 0.02 mm or larger, or, is formed as a projectingly curved surface in which the radius of curvature of the section shape is 0.02 mm or larger.

Also, according to the present embodiment, the inclination angle α with respect to the axial direction of the above outside-diameter-side inclined surface 98 is set for an angle of 30° or larger, thereby making it possible for the grease charged into the space 92 to circulate more efficiently. The reason why the inclination angle α is set for 30° or larger will be explained with reference to the following table 1.

TABLE 1

| Inclination Angle α (°) | Ratio of Force F acting on grease to Centrifugal Force $F_r$ $F/F_r$ (%) |
|---|---|
| 10 | 17 |
| 20 | 34 |
| 30 | 50 |
| 50 | 77 |
| 90 | 100 |

This table 1 shows a ratio of a force, which varies according the above inclination angle α and acts on grease existing on the above outside-diameter-side inclined surface 98, to the centrifugal force $F_r$ in %. That is, as can be seen clearly from FIG. 13, since the force F acting on the grease acts in parallel to the above outside-diameter-side inclined surface 98, this force F can be expressed by the following equation.

$$F = F_r \sin \alpha$$

Therefore, from the above equation, there can be obtained the above table 1. As can be seen clearly from this table 1, assuming that the above inclination angle α is 30° or more (α≧30°), the force F acting on the grease existing on the above outside-diameter-side inclined surface 18 is 50% or more of the above-mentioned centrifugal force $F_r$ (F≧0.5$F_r$), the grease flowing on the outside-diameter-side inclined surface 98 is easy to flow outwardly in the diameter direction. By the way, as the inclination angle α is increased, the grease is easier to flow; and, with the shape, size and the like of the retainer 87 taken into account, the inclination angle α is decided in such a manner that the grease cannot be checked between the above outside-diameter-side inclined surface 98 and retainer 87 (in such a manner that a clearance 110 between the outside-diameter-side inclined surface 98 and retainer 87 cannot be narrowed too much). Generally, it is believed to be proper that the upper limit of the above inclination angle is about 50° (up to 60°).

Also, according to the present embodiment, of the inner surfaces of the above seal plate 91a, the inner surface of the near-to-inside-diameter portion is formed as an inside-diameter-side inclined surface 101 which is inclined outwardly in the axial direction thereof as it goes outwardly in the diameter direction thereof; and, the inner peripheral edge neighboring portion of the inside-diameter-side inclined surface 101 is slidably contacted with or is adjacently opposed to the near-to-outside-diameter portions of the outer surfaces of two shoulder portions 102 respectively formed on the axial-direction two sides of an inner raceway 82 formed in the outer peripheral surface of the inner ring 83 over the entire periphery thereof. Thanks to this, the grease, which is pushed out from the inner raceway 82 to the outer peripheral surface of the shoulder portion 102, is easy to adhere to the inner surface of the above seal plate 91a. Also, similarly to the above grease existing on the above outside-diameter-side inclined surface 98, a centrifugal force acts on the grease adhered to the above inside-diameter-side inclined surface 101, and the grease adhered to this insidediameter-side inclined surface 101 is easy to be sent outwardly in the diameter direction thereof. By the way, in case where the inclination angle of the above inside-diameter-side inclined surface 101 with respect to the axial direction is set for 30° or larger, similarly to the above outside-diameter-side inclined surface 98, of the centrifugal force, the rate of a component thereof acting on the grease adhered to the above inside-diameter-side inclined surface 101 increases, so that the grease adhered to this inside-diameter-side inclined surface 101 can be sent to the outside diameter side more easily.

According to the above-structured rolling bearing 81*a* with a seal plate of the present embodiment, there can be eliminated the possibility that a large quantity of grease can stay on the inner surfaces of the seal plate 91*a*; and thus the grease charged into the spaces 92 respectively existing between the above-mentioned outer raceway 84 and inner raceway 82 and formed in the respective rolling elements 86 can be circulated smoothly including the above-mentioned rolling contact portions. That is, since, of the inner surfaces of the above seal plate 91*a*, the near-to-outside-diameter portion is formed as the outside-diameter-side inclined surface 98 which is inclined inwardly in the axial direction as it goes outwardly in the diameter direction, the grease, which has adhered to the inner surface of the above seal plate 91*a* and has been moved to the outside diameter side of the above seal plate 91*a* due to the centrifugal force, is introduced into the above outer raceway 84 through the inner peripheral surfaces of the above shoulder portions 99. Thanks to this, there is eliminated a fear that a large quantity of grease can collect on the inner surfaces of the seal plate 91*a* and, therefore, the grease charged into the spaces 92 can be circulated with good efficiency including the above-mentioned rolling contact portions. Due to this, most of the grease charged into the above spaces 92 can be used sequentially for lubrication of the above rolling contact portions. This can further delay the degradation of the grease that is used to lubricate these rolling contact portions.

Especially, in case where the inclination angle of the above outside-diameter-side inclined surface 98 to the axial direction is set for 30° or larger, the grease moved along the inner surfaces of the seal plate 91*a* can be guided to the outer raceway 84 more efficiently. That is, as described above, since, when the inclination angle of the above outside-diameter-side inclined surface 98 is increased, a centrifugal force acting on the grease existing on this outside-diameter-side inclined surface 98 is increased, this grease can be guided to the outer raceway 84 side with good efficiency, so that prevention of the degradation of the grease due to the circulation of the grease can be realized more effectively.

Figure 14:
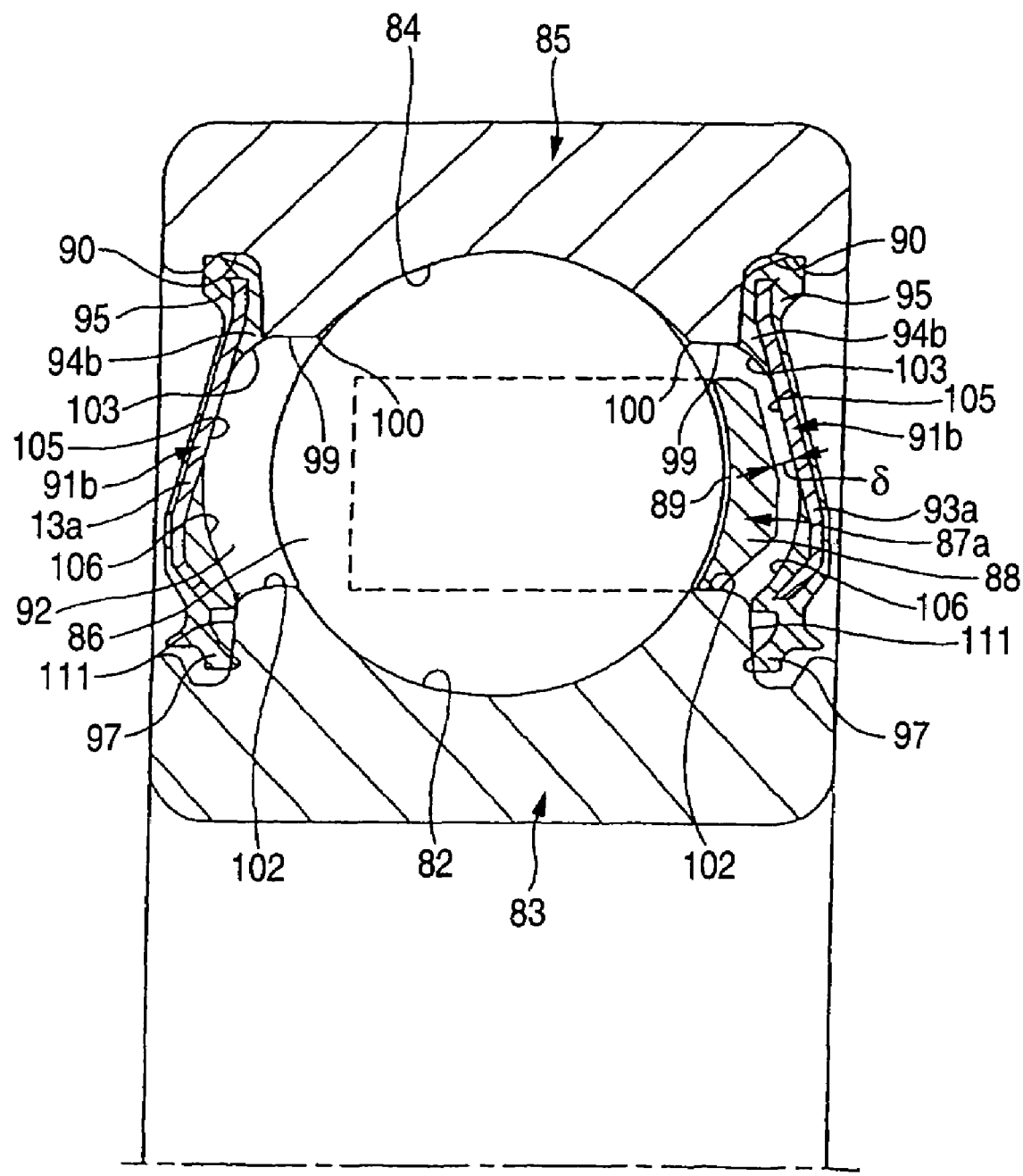
FIG. 14 is a section view of a half section of a fourth embodiment of the mode for carrying out the invention.

Next, FIG. 14 shows a fourth embodiment of the mode for carrying out the invention, corresponding to claim 2. According to the present embodiment, the inner surfaces of a seal plate 91*b* are composed of the inclined surfaces 105 of the diameter-direction middle portion thereof, the outside-diameter-side concavely curved surfaces 103 of the near-to-outside-diameter portions thereof, and the inside-diameter-side concavely curved surfaces 106 of the near-to-inside-diameter portions thereof. Of these surfaces, the inclined surfaces 105 are formed in such a manner that their associated core metals 93 are respectively inclined inwardly in the axial direction thereof as they go from the near-to-inside-diameter portions of the middle portion outwardly in the diameter direction, and the inner surfaces of the thus-inclined portions are used as the inclined surfaces 105. Also, the above outside-diameter-side concavely curved surfaces 103 are surfaces which are respectively formed in the outside-diameter-side portions of the above inclined surfaces 105, correspond to concavely curved surfaces as set forth in the third aspect, and are curved inwardly in the axial direction as they go outwardly in the diameter direction. Also, the above inside-diameter-side concavely curved surfaces 106 are disposed in the inside-diameter-side portions of the inner surfaces of the above seal plate 91*b* and are curved outwardly in the axial direction as they go outwardly in the diameter direction. The inner peripheral edge portion of each of the inside-diameter-side concavely curved surfaces 106 is slidably contacted with or adjacently opposed to the near-to-outside-diameter portion of its associated outer surface 111 of the shoulder portion 102 of the inner ring 83, while the outer peripheral edge portion thereof is extended up to the middle portion of the above seal plate 91*b*. That is, in the case of the inner surfaces of the above seal plate 91*b*, the outside-diameter-side and inside-diameter-side portions thereof are formed as the above-mentioned two outside-diameter-side and inside-diameter-side concavely curved surfaces 103, 106 which are produced by forming concavely curved surfaces respectively in the inner surfaces of elastic members 94*b*, and the middle portions of the inner surfaces of the seal plate 91*b* are formed as the above inclined surfaces 105 that can be obtained by inclining the above core metals 93*a*; and, the respective surfaces 103, 106 and 105 are connected together continuously and smoothly to thereby structure the inner surfaces of the seal plate 91*b*.

Also, in the present embodiment, the retainer 87*a* holding the respective rolling elements 86 has such a shape that can prevent the retainer 87*a* from interfering with the inner surfaces of the seal plate 91*b*. That is, the outer surface (in FIG. 12, the right side surface) of a rim portion 88 formed on the axial-direction one end side (in FIG. 12, on the right side) of the retainer 87*a* has a shape matched to the shape of the inner surface of the seal plate 91*b* to which the present outer surface is opposed. By the way, in the case of the illustrated embodiment, in order that, when the grease moves outwardly in the diameter direction on the inner surface of the above seal plate 91*b*, the flow of the grease cannot be retarded by the above rim portion 88, there is secured a clearance δ of 0.7 mm or more between the outer surface of this rim portion 88 and the inner surface of the above seal plate 91*a*.

Also, in the case of the present embodiment, of the inner surfaces of the above seal plate 91*b*, the near-to-outside-diameter portion thereof is formed as the above outside-diameter-side concavely curved surface 103 instead of the outside-diameter-side inclined surface 98 previously described with reference to FIG. 12. This outside-diameter-side concavely curved surface 103, similarly to the outside-diameter-side inclined surface 98, is also be able to guide the grease to the above-mentioned outer raceway 84. By the way, in the case of the above outside-diameter-side concavely curved surface 103, by increasing the radius of curvature thereof, the grease sent outwardly in the diameter direction along the inner surfaces of the seal plate 91*b* can be guided to the outer raceway 84 with more efficiency. Also, in the case of the present embodiment, since an inside-diameter-side concavely curved surface 106 is formed in the inside-diameter-side inner surface of each of the seal plates 91*b* and an inclined surface 105 is formed in the inner surface of the middle portion thereof as well as these surfaces 106, 105 are connected continuously with the above-mentioned outside-diameter-side concavely curved surface 103 smoothly, the grease pushed out from the inner raceway 82 to the outer peripheral surface of the shoulder portion 102 can be guided more easily. By the way, the above-mentioned outside-diameter-side concavely curved surface 103 and inside-diameter-side concavely curved surface 106 can be respectively formed of a single curved surface or a composite curved surface composed of two or more curved surfaces connected together continuously and smoothly. The remaining structures and operations of the present embodiments are similar to those of the previously described third embodiment.

Figure 15:
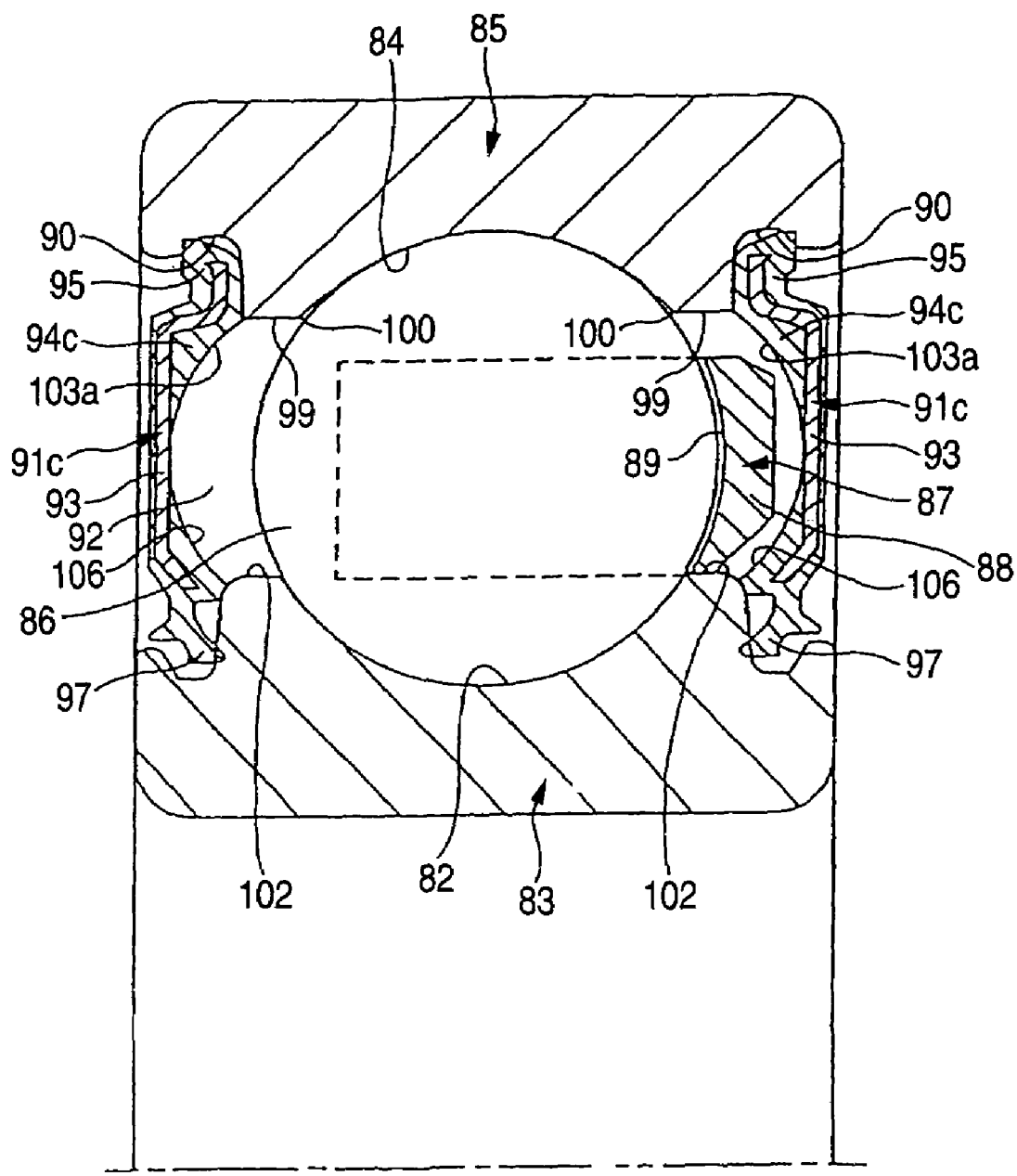
FIG. 15 is a section view of a half section of a fifth embodiment of the mode for carrying out the invention.

Next, FIG. 15 shows a fifth embodiment of the mode for carrying out the invention, corresponding to the second aspect. According to the present embodiment, an elastic member 94c is disposed on the entire area of the inner surface of a core metal 93 constituting a seal plate 91c, an outside-diameter-side concavely curved surface 103 is formed in the outside-diameter-side inner surface of the elastic member 94c, an inside-diameter-side concavely curved surface 106 is formed in the inside-diameter-side inner surface thereof respectively, while these concavely curved surfaces 103a, 106 are continuously connected with each other smoothly. That is, in the present embodiment, differently from the above-mentioned fourth embodiment, no inclined surface is formed in the inner surface of the middle portion of the seal plate, but the entire inner surface of the seal plate is composed of a single, continuously and concavely curved surface. The remaining structures and operations of the present embodiment are similar to those of the above-mentioned fourth embodiment.

Figure 16:
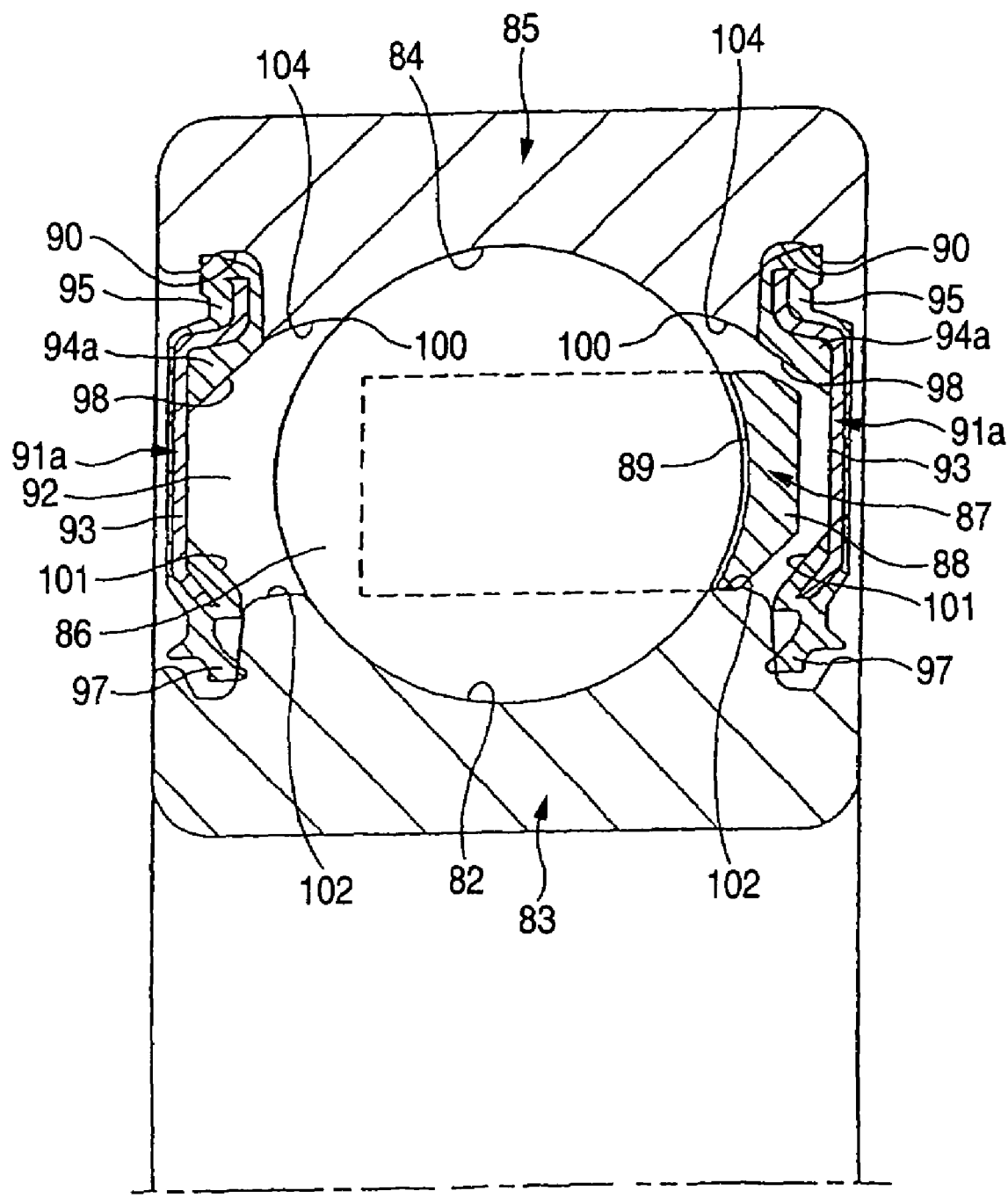
FIG. 16 is a section view of a half section of a sixth embodiment of the mode for carrying out the invention.

Next, FIG. 16 shows a sixth embodiment of the mode for carrying out the invention, corresponding to the second aspect. In the case of the present embodiment, in the structure according to the previously described third embodiment, the portions of the inner peripheral surface of the outer ring 85a that exist between the outer raceway 84 and securing grooves 90, 90 are formed as curved surface portions 104, 104 which are respectively curved toward the axial-direction two end edge portions of the outer raceway 84 as they go outwardly in the diameter direction. Each of the curved surface portions 104, 104 continues smoothly with its associated outside-diameter-side inclined surface 98 as well as the tangential direction of the portion thereof continuously connected with the chamfer portion 100 extends substantially in parallel to the axial direction. Thanks to this, not only grease, which has been sent outwardly in the diameter direction along the above-mentioned outside-diameter-side inclined surface 98, can be easily guided to the above outer raceway 84, but also there can be formed the above chamfer portion 100 which is used to prevent the rolling element 86 from running up onto the above curved surface portion 104. The remaining structures and operations of the present embodiment are similar to the above-described third embodiment.

Figure 17:
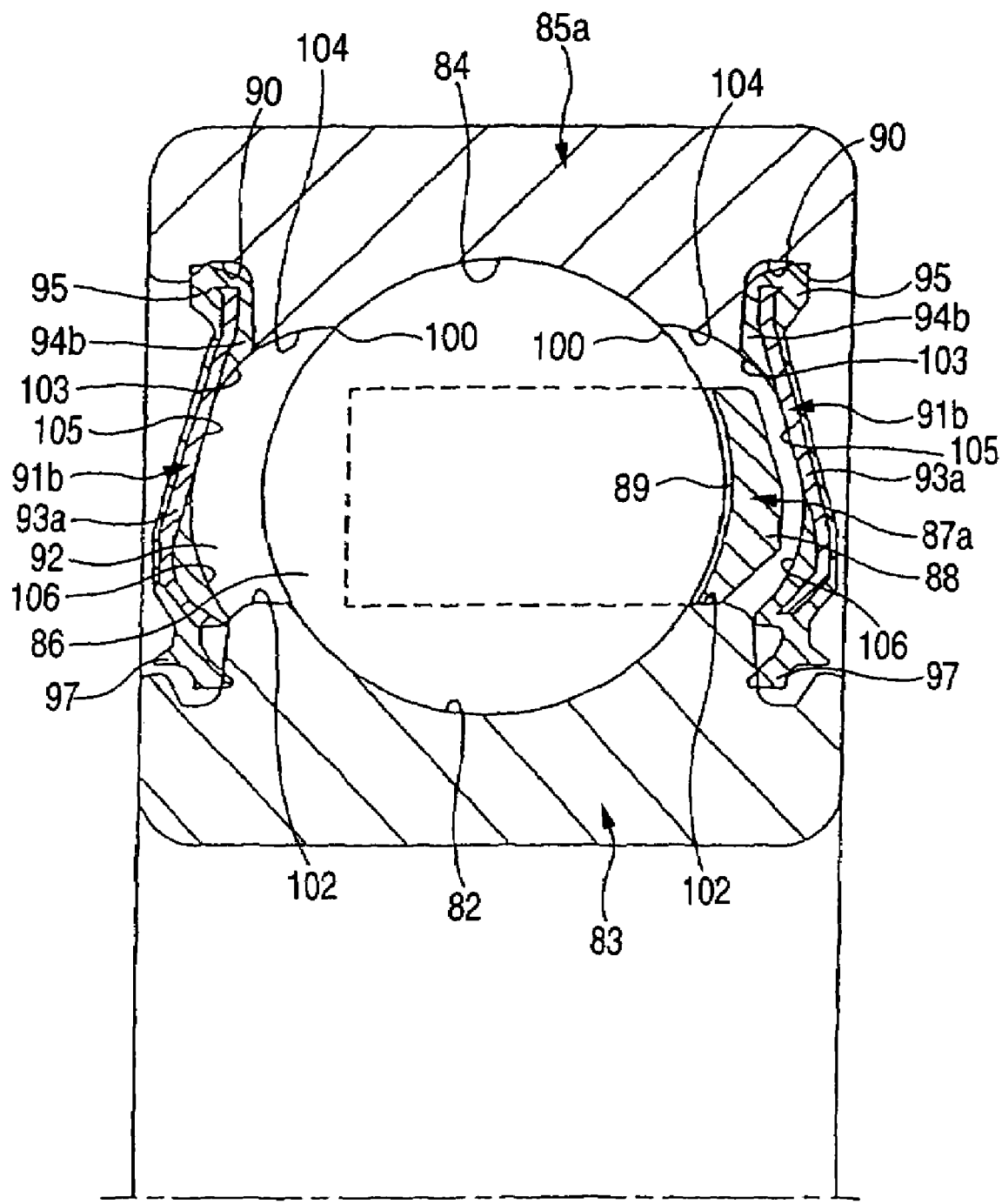
FIG. 17 is a section view of a half section of a seventh embodiment of the mode for carrying out the invention.

Next, FIG. 17 shows a seventh embodiment of the mode for carrying out the invention, corresponding to the second aspect. In the case of the present embodiment, there is employed a structure in which, in addition to the structure according to the previously described fourth embodiment shown in FIG. 14, similarly to the above-described sixth embodiment shown in FIG. 16, curved surface portions 104, 104 are formed in the inner peripheral surface of the outer ring 85a. The remaining structures and operations of the present embodiments are similar to those of the previously described fourth and sixth embodiments.

Figure 18:
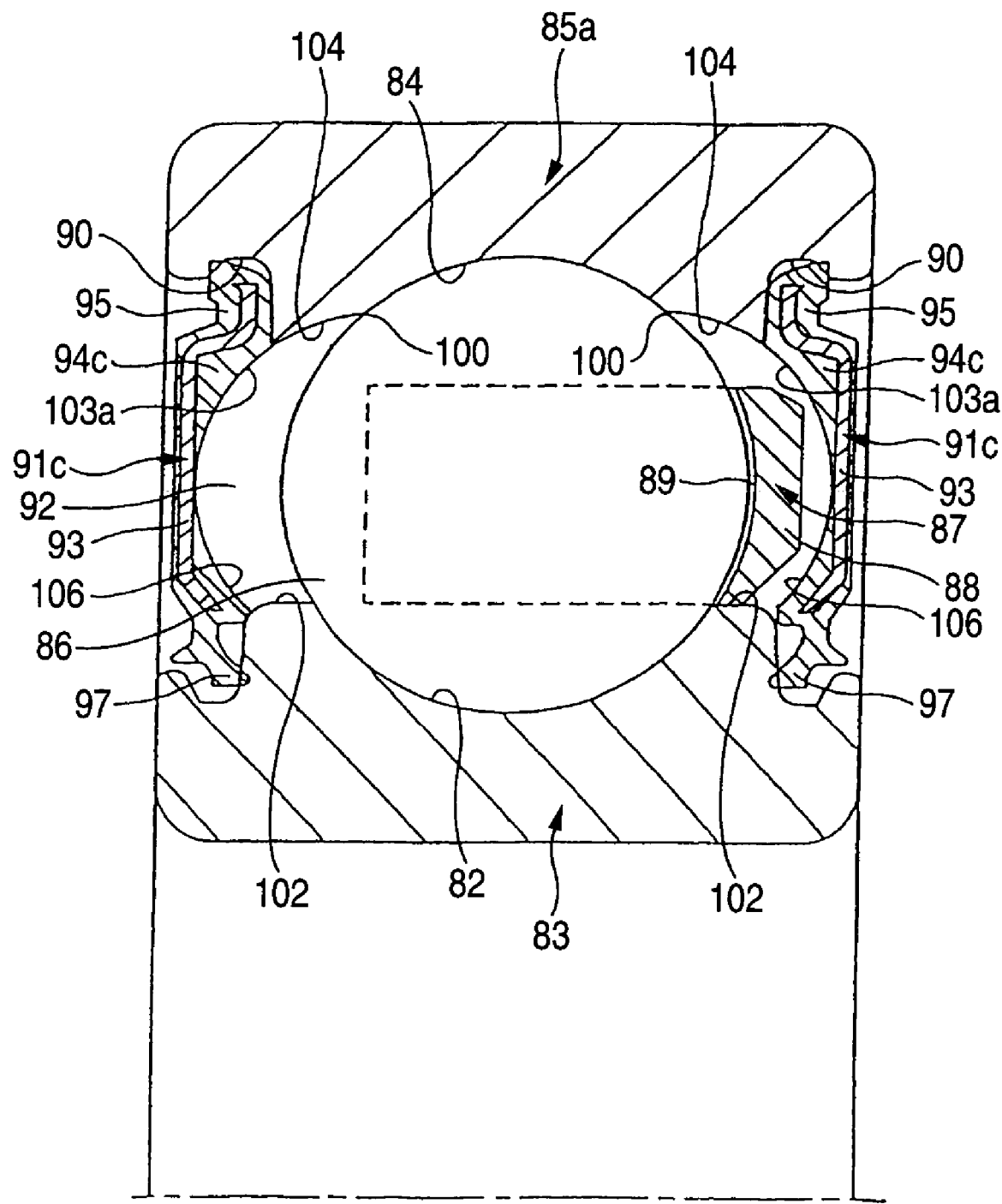
FIG. 18 is a section view of a half section of an eighth embodiment of the mode for carrying out the invention.

Next, FIG. 18 shows an eighth embodiment of the mode for carrying out the invention, corresponding to the second aspect. In the case of the present embodiment, there is employed a structure in which, in addition to the structure according to the previously described fifth embodiment shown in FIG. 15, similarly to the previously described sixth embodiment shown in FIG. 16, guide portions 104, 104 are respectively formed in the inner peripheral surface of an outer ring 85a. The remaining structures and operations of the present embodiments are similar to those of the previously described fiflh and sixth embodiments.

The present embodiment is based on the Japanese Patent Application (Patent Application 2001-283322) filed on Sep. 18, 2001 and thus the contents of this patent application are taken into the present embodiment as reference.

Figure 19:
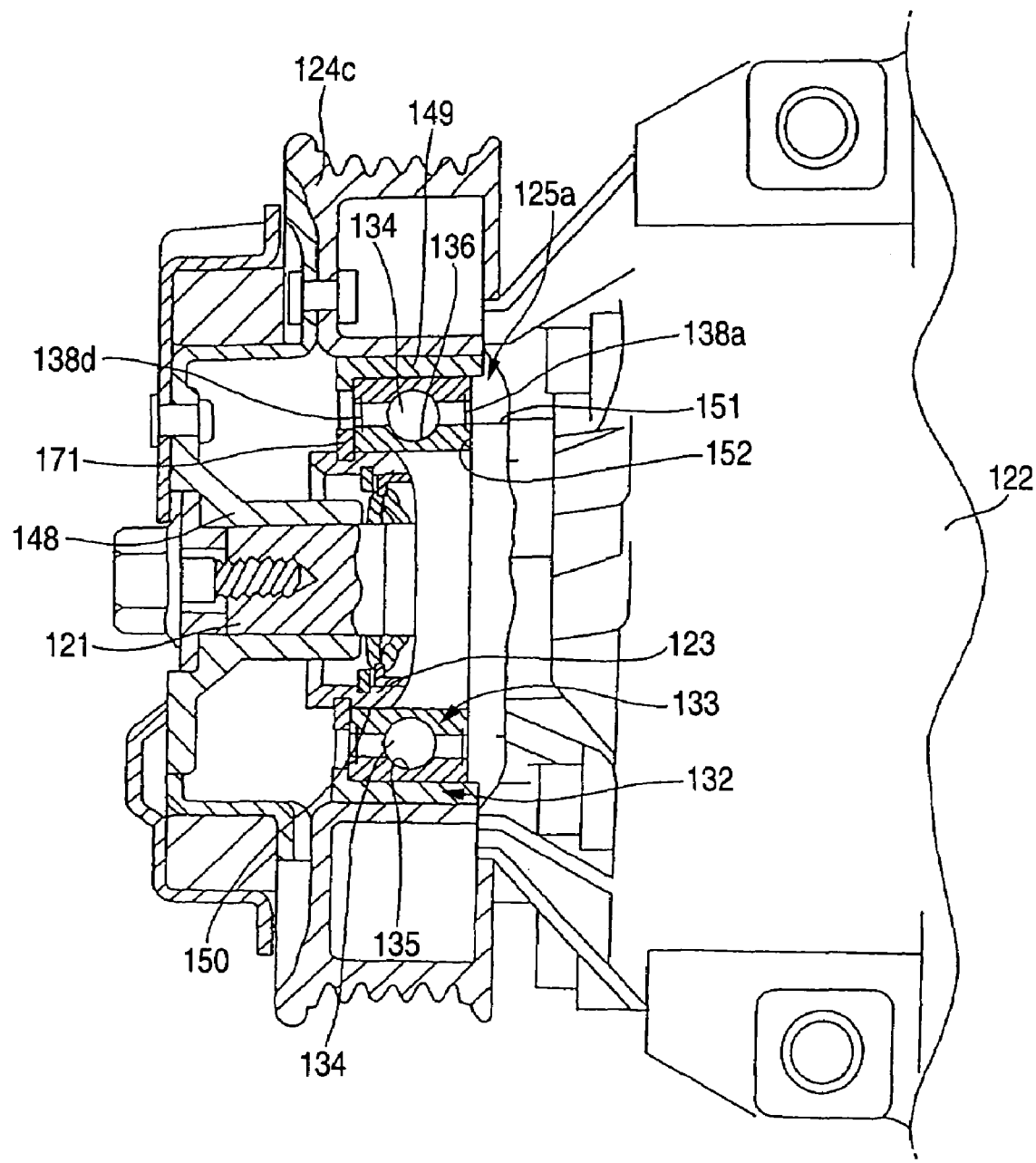
FIG. 19 is a section view of a ninth embodiment of the mode for carrying out the invention.
Figure 20:
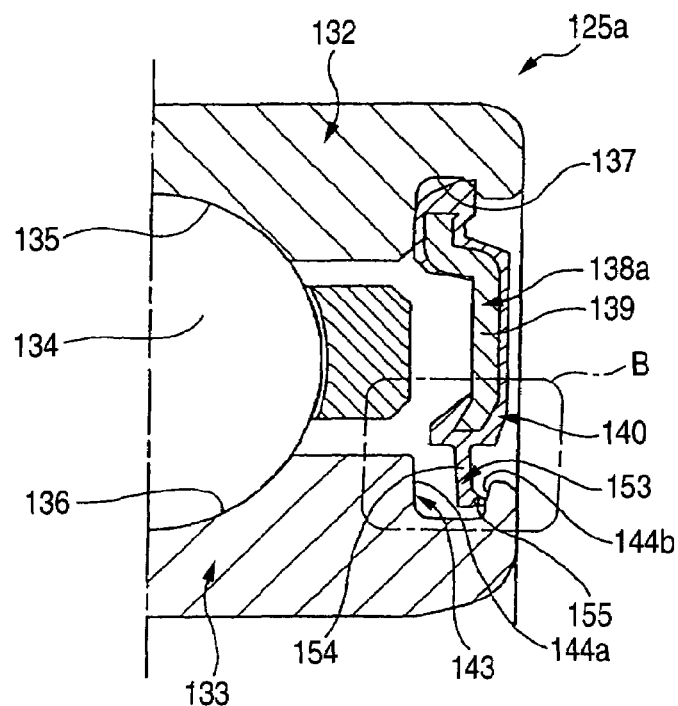
FIG. 20 is a partially enlarged section view of only the rolling bearing with a seal plate taken out from the pulley rotation support apparatus of the invention.
Figure 21:
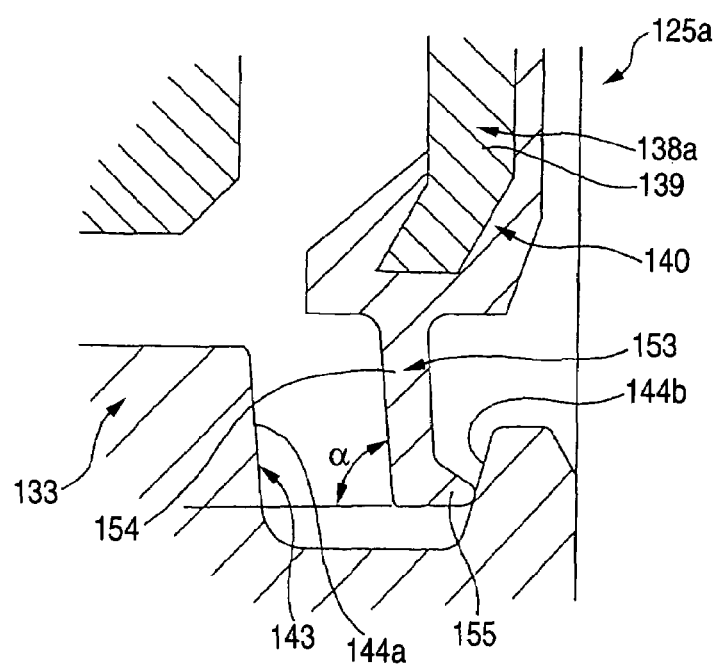
FIG. 21 is an enlarged section view of the B portion shown in FIG. 20.

Now, FIGS. 19~21 show a ninth embodiment of the mode for carrying out the invention, corresponding to the third aspect. A rolling bearing with a seal plate 125a according to the present embodiment is incorporated into the rotation support portion of a driven pulley 124a which is used to drive and rotate a compressor for a car air conditioner. By the way, in the case of the present embodiment, an electromagnetic clutch 130 is not disposed in the rotation support part of the pulley for a compressor. That is, in the case of the present embodiment, inside a casing 122, there is disposed a rotary shaft 121 in such a manner that it is rotatably supported by a rolling bearing (not shown). And, the near-to-inside-diameter portion of a bracket 148 is fitted with and fixed to the outer surface of the end portion of the rotary shaft 121 and, at the same time, the near-to-outside-diameter portion of the bracket 148 is connected (not through the electromagnetic clutch) to one side (in FIG. 19, the left side) of the above driven pulley 124a through a torque fuse or the like which can be idled only when an excessive torque is applied.

And, the driven pulley 124a is rotatably supported on the periphery of a support tube portion 123 formed in the end portion of the above casing 122 by the rolling bearing with a seal plate 125a. This rolling bearing with a seal plate 125a is structured such that, as shown in FIGS. 20 and 21 in detail, a pair of seal plates 138a, 138a are disposed on the two end portions of a single-row deep-groove-type radial ball bearing. That is, this rolling bearing 125a with a seal plate comprises an outer ring 132, an inner ring 133, and two or more balls 134, 134 which are rolling elements. Of these composing parts, the outer ring 132 includes, in the inner peripheral surface of the middle portion thereof, a single-row deep-groove-type outer raceway 135 having an arc-shaped section. Also, the inner ring 133 includes, in the outer peripheral surface of the middle portion thereof, a single-row deep-groove-type inner raceway 136 which also has an arc-shaped section. And, the above respective balls 134, 134 are rotatably interposed two or more in number between this inner raceway 136 and the above outer raceway 135. Also, as will be described later in detail, the outer peripheral edge portions of the seal plates 138a, 138a are secured to securing grooves 137 respectively formed in the inner peripheral surfaces of the two end portions of the above outer ring 132 and, at the same time, the inner peripheral edge portions of the respective seal plates 138a, 138a are slidably contacted with the entire peripheries of the outer peripheral surfaces of the two end portions of the above inner ring 133.

And, the above outer ring 132 is fitted with and fixed to the inside of the inner peripheral surface of a ring-shaped member 149 fitted with and fixed to the inner surface of the above driven pulley 124a and, at the same time, the above inner ring 133 is fitted with and fixed to the outer surface of a small diameter portion 150 formed in one side portion (in FIG. 19, the left side portion) of the outer peripheral surface of the above support tube portion 123. Also, the axial-direction one end face (in FIGS. 19~21, the right end face) of this inner ring 133 is butted against a stepped portion 152 which is a continuous portion between a large diameter portion 151 formed in the other end portion (in FIG. 19, the right end portion) of the outer peripheral surface of the above support tube portion 133 and the above small diameter portion 150. And, the above inner ring 133 is held by and between the stepped portion 152 and a retaining ring 171 secured to the above small diameter portion 150.

And, according to the invention, a pair of seal plates 138a, 138a are interposed between the inner peripheral surfaces of the two end portions of the outer ring 132 and the outer peripheral surfaces of the two end portions of the inner ring 133 respectively constituting the above rolling bearing 125a with a seal plate. Each of the seal plates 138a, 138a, as shown in detail in FIGS. 20 and 21, is structured such that an elastic member 140 made of elastomer such as rubber is reinforced with a core metal 139 produced by forming a metal plate such as a steel plate into a circular ring shape, whereby the seal plate 138a is formed in a circular ring shape as a whole. The outer periphery edge portion of the elastic member 140 is projected outwardly in the diameter direction slightly beyond the outer peripheral edge of the above core metal 139, while this projected portion is secured to the above securing groove 137. On the other hand, the axial-direction middle portion of the inner peripheral edge portion of the above elastic member 140 is projected inwardly in the diameter direction sufficiently beyond the inner peripheral edge of the above core metal 139, while a seal lip 153 is formed by the projected portion.

Especially, in the case of the invention, this seal lip 153 includes a main body portion 154 formed in a substantially circular-ring shape (a partially conic tube shape) and, in the inner peripheral edge portion of the main body portion 154, a projecting portion 155 formed over the entire periphery thereof in such a manner that it projects outwardly in the axial direction. Also, the main body portion 154, except for the projecting portion 155, is formed in a partially conic tube shape which, in a free state, is inclined outwardly in the axial direction as it goes toward the inner peripheral edge thereof. And, of a pair of side wall surfaces 144a, 144b of each of seal grooves 143 respectively formed over the entire peripheries of the outer peripheral surfaces of the two end portions of the above inner ring 133, with the outside side wall surface 144b, there is slidably contacted the leading end edge of a projecting portion 155 formed in the above seal lip 153 over the entire periphery thereof in a line contact state. This outside sidewall surface 144b is inclined outwardly in the axial direction thereof as it goes toward the outside diameter side.

According to the above-structured invention, when lubricating the bearing using the grease charged into the interior of the bearing, not only the seizure life of the grease can be enhanced but also the inner raceway 136, outer raceway 135 and the rolling surfaces of the respective balls 134, 134 can be prevented against damage. That is, in case where the pressure (internal pressure) of the space with the balls 134, 134 stored therein increases due to an increase in the temperature during use of the bearing, this pressure acts in a direction where it presses the leading end edge of the above projecting portion 155 against the above sidewall surface 144b. Thanks to this, there is eliminated the possibility that the contact pressure of the sliding contact portion between the leading end edge of the projecting portion 155 and the side wall surface 144b can be lowered to thereby generate a clearance in the sliding contact portion. Rather, when the above internal pressure rises, the leading end edge of the above projecting portion 155 is positively pressed against the above side wall surface 144b, which can enhance the sealing property of the sliding contact portion further.

Also, because the leading end edge of the projecting portion 155, which is disposed in the inner peripheral edge portion of the seal lip 153 in a state where it projects in the axial direction, is slidably contacted with the above outer side wall surface 144b, these leading end edge and outer side wall surface 144b can be easily contacted with each other in a stable manner. That is, since the side wall surface 144b is inclined outwardly in the axial direction as it goes outwardly in the diameter direction, even when the outer ring 132 is inclined in any direction with respect to the inner ring 133, the leading end edge of the above projecting portion 155 is hard to be separated from the above side wall surface.

Further, in the case of the invention, because the main body portion 154 (except for the projecting portion 155) constituting the above seal lip 153, when the seal lip 153 is held in a free state, is inclined outwardly in the axial direction as it goes toward the inner peripheral edge, the elastic deformation quantity (allowance) of the above seal lip 153 can be increased and thus the pressing force of the projecting portion 155 against the above outer side wall surface 144b can be increased. Also, as shown in FIGS. 20 and 21, in a state where the leading end edge of this projecting portion 155 is slidably contacted with this outer side wall surface 144b, the two side surfaces of the main body portion 154 except for the above projecting portion 155 can be easily inclined outwardly in the axial direction as it goes toward the inner peripheral edge or can be easily made to coincide with a virtual plane which intersects the center axis of the present seal plate 138a at right angles. Therefore, even when a centrifugal force acts on the inner peripheral edge portion of the seal lip 153 including the above projecting portion 155 because the bearing is used in a state where the outer ring 132 rotates at a high speed, the present inner peripheral edge portion can be prevented from shifting in a direction where it parts away from the outer side wall surface 144b of the above seal groove 143. As a result of this, even under severe conditions in which the temperature rises, a large partial load is applied, or the outer ring rotates at a high speed, the sealing performance of the rolling bearing with a seal plate 125a can be secured sufficiently. Therefore, when the bearing is used while grease is charged into the interior thereof, not only the base oil of the grease can be prevented from leaking to the outside, but also the base oil can be prevented from being oxidized by the air in the outside, thereby being able to enhance the life of the grease.

Further, various foreign substances existing in the outside can be prevented from entering the space with the respective balls 134, 134 stored therein, thereby being able to prevent the inner raceway 136, the outer raceway 135 and the rolling surfaces of the respective balls 134, 134 against damage.

By the way, to reduce the axial-direction inclination angle α (FIG. 21) of the above main body portion 144 as much as possible is preferable in that the force to press the above projecting portion 155 against the above outer side wall surface 144b can be increased in accordance with the centrifugal force to be applied when the bearing is in operation. However, in case where the above inclination angle α is reduced excessively, there is a possibility that the axial-direction length of the rolling bearing with a seal plate 125 can increase. Therefore, when reducing the inclination angle α in the illustrated structure, preferably, the outer peripheral edge portion of the above main body portion 154 may be shifted more inwardly in the axial direction than the illustrated structure to thereby prevent the axial-direction length of the rolling bearing with a seal plate 125 from increasing. On the other hand, in case where the above inclination angle α is increased, the force to press the above projecting portion 155 against the above outer side wall surface 144b in accordance with the above centrifugal force can be reduced, thereby being able to reduce the rotation torque of the rolling bearing with a seal plate 125. In this manner, according to the invention, by changing the above inclination angle α properly, there can be obtained the performance that is required in accordance with the use conditions and use purposes of the rolling bearing with a seal plate. Also, the pressing force of the above projecting portion 155 against the above outer side wall surface 144b can also be adjusted to a desired value by adjusting the shape, dimension, material and the like of the above seal lip.

Figure 22:
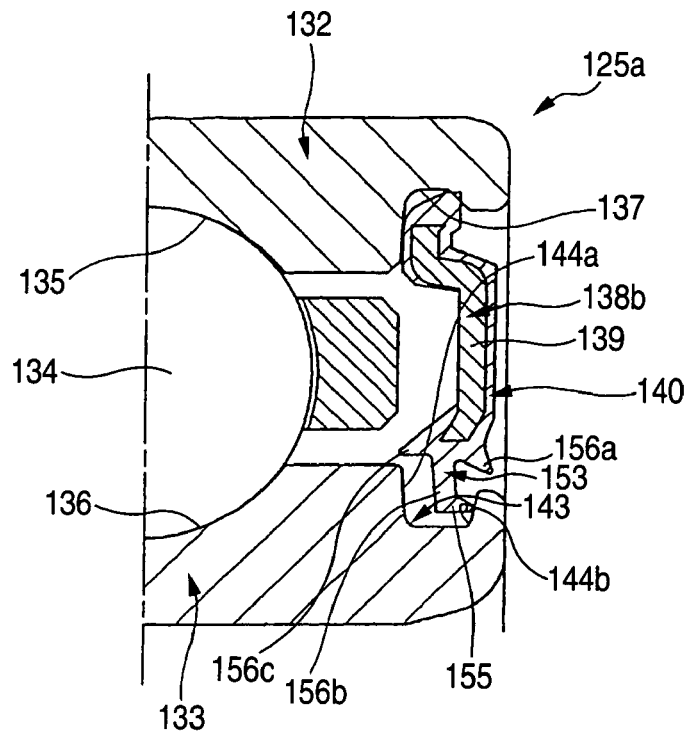
FIG. 22, similarly to FIG. 20, is a section view of a tenth embodiment of the mode for carrying out the invention.
Figure 23:
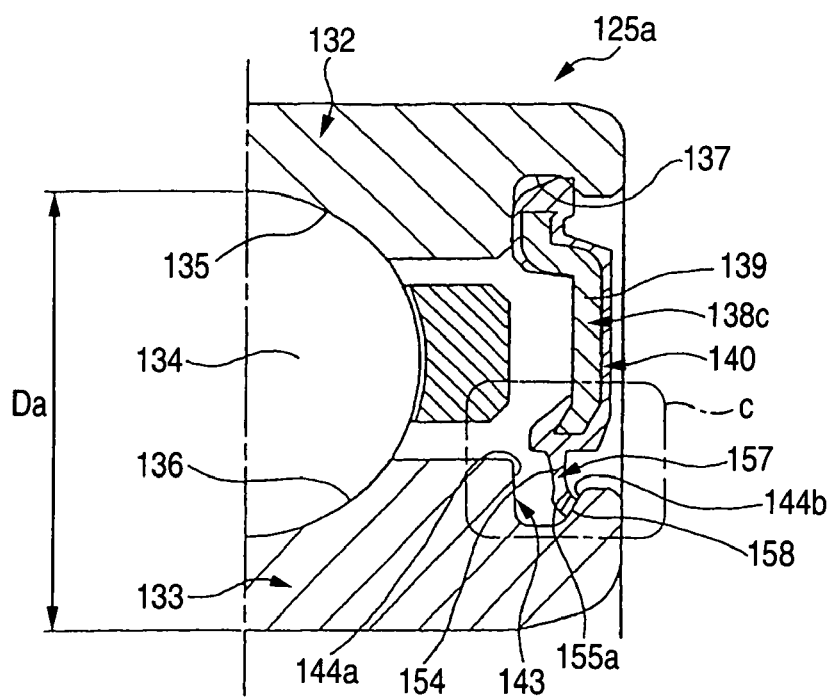
FIG. 23, similarly to FIG. 20, is a section view of an eleventh embodiment of the mode for carrying out the invention.
Figure 24:
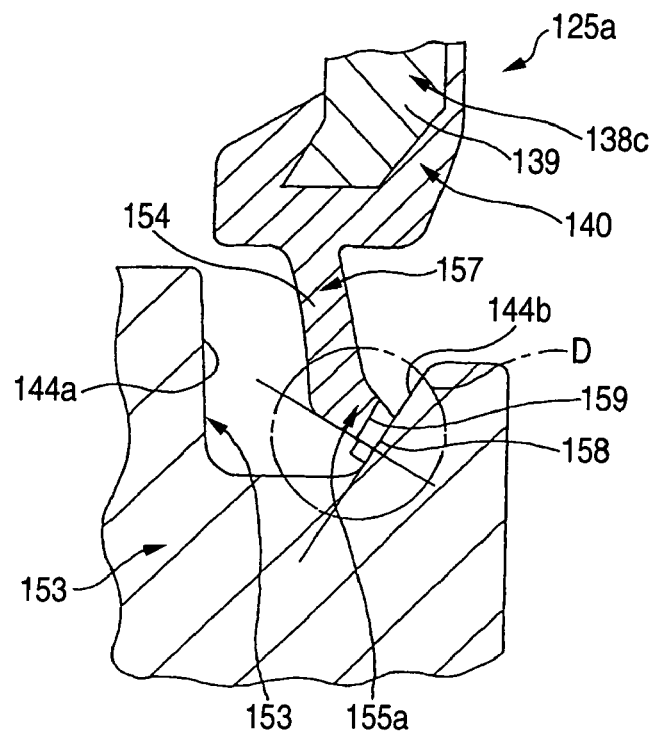
FIG. 24 is an enlarged section view of the C portion shown in FIG. 23.

Next, FIG. 22 shows a tenth embodiment of the mode for carrying out the invention, similarly corresponding to the third aspect. In the case of the present embodiment, differently from the above-mentioned ninth embodiment, three seal lips 156a~156c are formed in the inner peripheral edge portions of each of a pair of seal plates 138b. And, of the three seal lips 156a~156c, in the inner peripheral edge portion of the middle seal lip 156b that is situated in the middle portion, there is formed a projecting portion 155 in such a manner that it projects outwardly in the axial direction over the entire periphery thereof and, at the same time, the leading end edge of this projecting portion 155 is slidably contacted with the axial-direction outer-side side wall surface 144b of a seal groove 143 over the entire periphery thereof. In the case of the present embodiment, the above middle seal lip 155b corresponds to a seal lip as set forth in the appended claims.

And, in the case of the present embodiment, of the three seal lips 156a~156c, the leading edge of the outside seal lip 156a that is situated most outside is opposed to the portions of the outer peripheral surfaces of the two end portions of the inner ring 133 that are shifted more outwardly in the axial direction than the above-mentioned respective seal grooves 143 with a slight clearance between them; and, on the present portions, there are disposed labyrinth seals. Also, the leading end edge of the inside seal lip 156c situated most inside is opposed to the portion of the outer peripheral surface of the middle portion of the above inner ring 133 that is shifted more inwardly in the axial direction than the above seal groove 143, with a slight clearance between them; and, on the present portion, there is disposed a labyrinth seal. In the case of the present embodiment structured in this manner, the sealing performance can be enhanced more than the above-mentioned ninth embodiment.

The remaining structures and operations of the present embodiment are similar to those of the above-mentioned ninth embodiment. Therefore, the same parts thereof as the ninth embodiment are given the same designations and thus the duplicate description thereof is omitted here.

Figure 25:
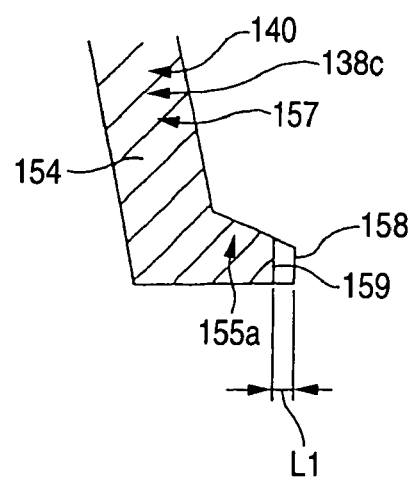
FIG. 25 is an enlarged section view of a seal lip in its free state, corresponding to the D portion shown in FIG. 24.
Figure 26:
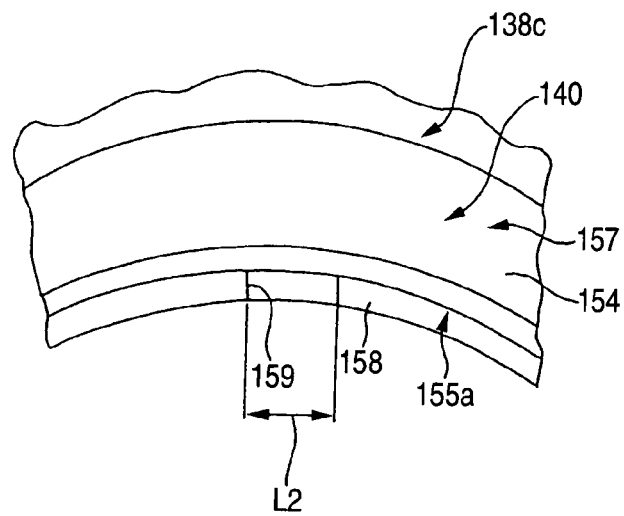
FIG. 26 is a view of the seal lip, when it is viewed from the right side of FIG. 25.

Next, FIGS. 23~26 respectively show an eleventh embodiment of the mode for carrying out the invention. In the case of the present embodiment, on the inner peripheral edge portions of each of a pair of seal plates 138c, there is disposed a seal lip 157. This seal lip 157 includes a circular-ring-shaped main body portion 154 and a projecting portion 155a. Of these composing parts, the projecting portion 155a, as shown in FIG. 25, is formed in the inner peripheral edge portion of the above main body portion 154 in such a manner that, in a state where the seal lip 157 is held in a free state, it projects substantially in parallel to the center axis of this main body portion 154 and outwardly in the axial direction over the entire periphery thereof. Also, in the leading end face of the above projecting portion 155a, there is formed a flat surface portion 158 in which an uneven portion does not exist substantially. Further, in the circumferential-direction portion of this flat surface portion 158, there is formed a rectangular-shaped or an arc-shaped slight cut-away portion 159.

And, in the case of the present embodiment, the flat surface portion 158 formed in the leading end face of the projecting portion 155a of the above seal lip 157 is slidably contacted by surface contact with the outer side wall surfaces 144b of the seal grooves 143 formed in the outer peripheral surfaces of the two end portions of the inner ring 133 over the entire periphery thereof. Also, in the thus slidably contacted state, both of the main body portion 154 and the above projecting portion 155a formed in the above seal lip 157 are inclined outwardly in the axial direction as they go toward the inner peripheral edges thereof. Also, in a section relating to a virtual plane containing the center axes of the above respective seal plates 138c, a straight line in contact with the inner peripheral surface of the above projecting portion 155a and a straight line in contact with the outer side wall surface 144b are made to intersect each other almost at right angles. Further, according to the present embodiment, referring to the above cut-away portion 159, in case where the depth thereof from the leading end edge of the above seal lip 157 is expressed as $L_1$ (FIG. 25), the circumferential-direction length thereof is expressed as $L_2$ (FIG. 26), and the diameter of the respective balls 134 is expressed as $D_a$, the dimensions of the cut-away portion 159 are restricted such that they can satisfy the following relations, that is, $L_1 \leq 0.09 D_a$, and $L_2 \leq 0.18 D_a$.

According to the structure of the present embodiment structured in the above-mentioned manner, the contact area between the leading end portion of the seal lip 157 and the outer side wall surface 144b of the seal groove 143 formed in the inner ring 133 can be increased. Thanks to this, even under severe conditions, the sealing performance can be secured sufficiently; and thus, when the bearing is used while grease is charged in the interior thereof, not only the base oil of the grease can be prevented from leaking to the outside but also this base oil can be prevented from being oxidized by the air in the outside, thereby being able to enhance the life of the grease.

Further, the present structure can prevent various foreign substances existing in the outside from moving into the space with the respective balls 134 stored therein, thereby being able to prevent the inner raceway 136, outer raceway 135 and the rolling surfaces of the respective balls 134 against damage.

Also, according to the invention, in a section relating to a virtual plane containing the center axes of the above respective seal plates, a straight line in contact with the inner peripheral surface of the above projecting portion 155a and a straight line in contact with the outer side wall surface 144b are made to intersect each other almost at right angles. This can increase the force to press the above projecting portion 155a against the present side wall surface 144b. Further, in the case of the present embodiment, since the cut-away portion 159 is formed in the leading end face of the projecting portion 155a formed in the above seal lip 157, in a state where the leading end face of the present projecting portion 155a is slidably contacted with the above outer side wall surface 144b, the air of the interior of the rolling bearing with a seal plate 125a can be discharged through a slight passage constituted by this cut-away portion 159. Thanks to this, when the rolling bearing with a seal plate 125a is in use, even when the internal pressure of the present rolling bearing tends to rise as the temperature thereof rises, because the air of the interior thereof is discharged to the outside, the internal pressure thereof can be prevented from increasing. Therefore, the above seal lip 157 can be prevented from turning up, which can stabilize the seal performance by this seal lip 157. And, in the case of the present embodiment, the dimensions of the cut-away portion 159 are regulated in the following manner: that is, in case where the depth thereof from the leading end edge of the above seal lip 157 is expressed as $L_1$ (FIG. 25), the circumferential-direction length thereof is expressed as $L_2$ (FIG. 26), and the diameter of the respective balls 134 is expressed as $D_a$, the dimensions of the cut-away portion 159 are restricted such that they can satisfy the following relations, that is, $L_1 \leq 0.09 D_a$, and $L_2 \leq 0.18 D_a$. In this manner, in the case of the present embodiment, since the dimensions of the above cut-away portion 159 are restricted to low levels, the air can be prevented from flowing into the rolling bearing through this cut-away portion 159 from the outside. Therefore, regardless of the existence of the cut-away portion 159, the oxidization of the above grease can be prevented.

The remaining structures and operations of the present embodiment are similar to those of the ninth embodiment previously shown in FIGS. 19~21. Therefore, the same parts thereof are given the same designations and thus the duplicate description thereof is omitted here.

By the way, the cut-away portion 159 is formed in only one circumferential-direction portion of the leading end face of the projecting portion 155a formed in the seal lip 157 constituting each seal plate 138c. However, this cut-away portion 159 can also be formed in two or more circumferential-direction portions of the preset leading end face. Also, in the case of the present embodiment, the leading end portion of the seal lip 157 is slidably contacted with the outer side wall surface 144b of the seal groove 143; but, the invention as set forth in Claim 5 can also be enforced in a state where the leading end portion of the seal lip 157 is slidably contacted with the inner side wall surface 144a of the present seal groove 143. However, as in the present embodiment, in case where the leading end portion of the seal lip 157 is slidably contacted with the outer side wall surface 144b, the leading end portion of this seal lip 157 can be prevented from shifting in a direction where it parts away from the outer side wall surface 144b due to an increase in the internal pressure of the rolling bearing, thereby being able to enhance the sealing performance thereof further.

Figure 27:
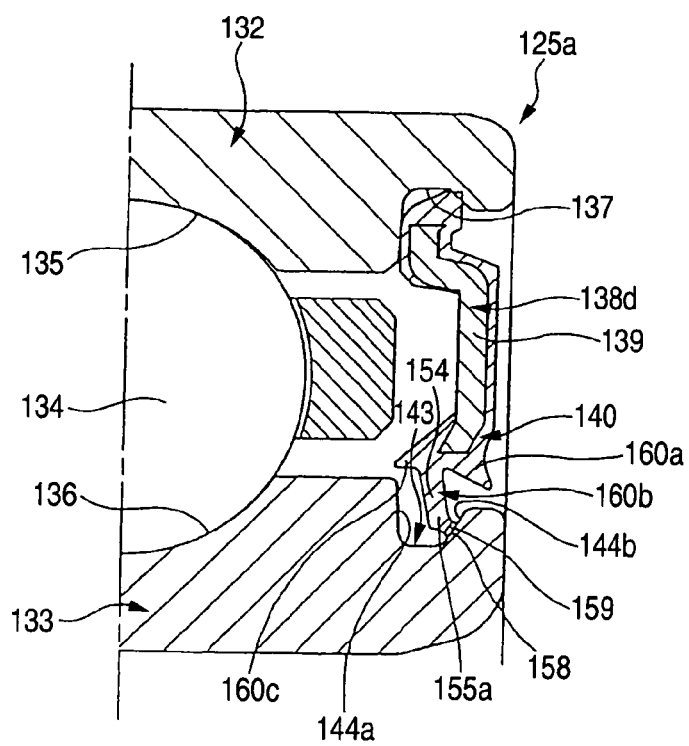
FIG. 27, similarly to FIG. 29, is a section view of a twelfth embodiment of the mode for carrying out the invention.

Next, FIG. 27 shows a twelfth embodiment of the mode for carrying out the invention, also corresponding to the fourth aspect. According to the present embodiment, three seal lips 160a~160c are disposed on the inner peripheral edge portions of each of seal plates 148d. And, a flat surface portion 158, which is formed in the leading end face of a projecting portion 155a disposed on the inner peripheral edge portion of the seal lip 16b situated in the middle position of the three seal lips 160a~160c, is slidably contacted by surface contact with the outer side wall surface 144b of a seal groove 143 formed in the outer peripheral surface of each of the two end portions of an inner ring 133 over the entire periphery thereof. Also, of the above three seal lips 160a~160c, the leading end edge of the outer seal lip 160c situated on the outer-most side is opposed to the portion of the end portion outer peripheral surface of the inner ring 133 that is shifted more outwardly in the axial direction than the seal groove 143 with a slight clearance between them, thereby providing a labyrinth seal in the present portion. Also, of the above three seal lips 160a~160c, the leading end edge of the outer seal lip 160c situated on the inner-most side is opposed to the portion of the middle portion outer peripheral surface of the inner ring 133 that is shifted more inwardly in the axial direction than the seal groove 143 with a slight clearance between them, thereby providing a labyrinth seal in the present portion.

In the case of the present embodiment structured in this manner, since there are disposed the labyrinth seals that are respectively formed by the two outer and inner seal lips 160a, 160c, the sealing performance of the present embodiment can be enhanced more than the above-described eleventh embodiment.

The remaining structures and operations of the present embodiment are similar to those of the eleventh embodiment previously shown in FIG. 23~26. Therefore, the same parts are given the same designations and thus the duplicate description thereof is omitted here.

By the way, the structures of the eleventh and twelfth embodiments previously shown in FIGS. 23~27 can also be enforced in combination with the structures of the ninth and tenth embodiments previously shown in FIGS. 19~22. That is, in the ninth and tenth embodiments, a rectangular-shaped or arc-shaped cut-away portion can also be formed in the leading end face of the seal lip.

Figure 28:
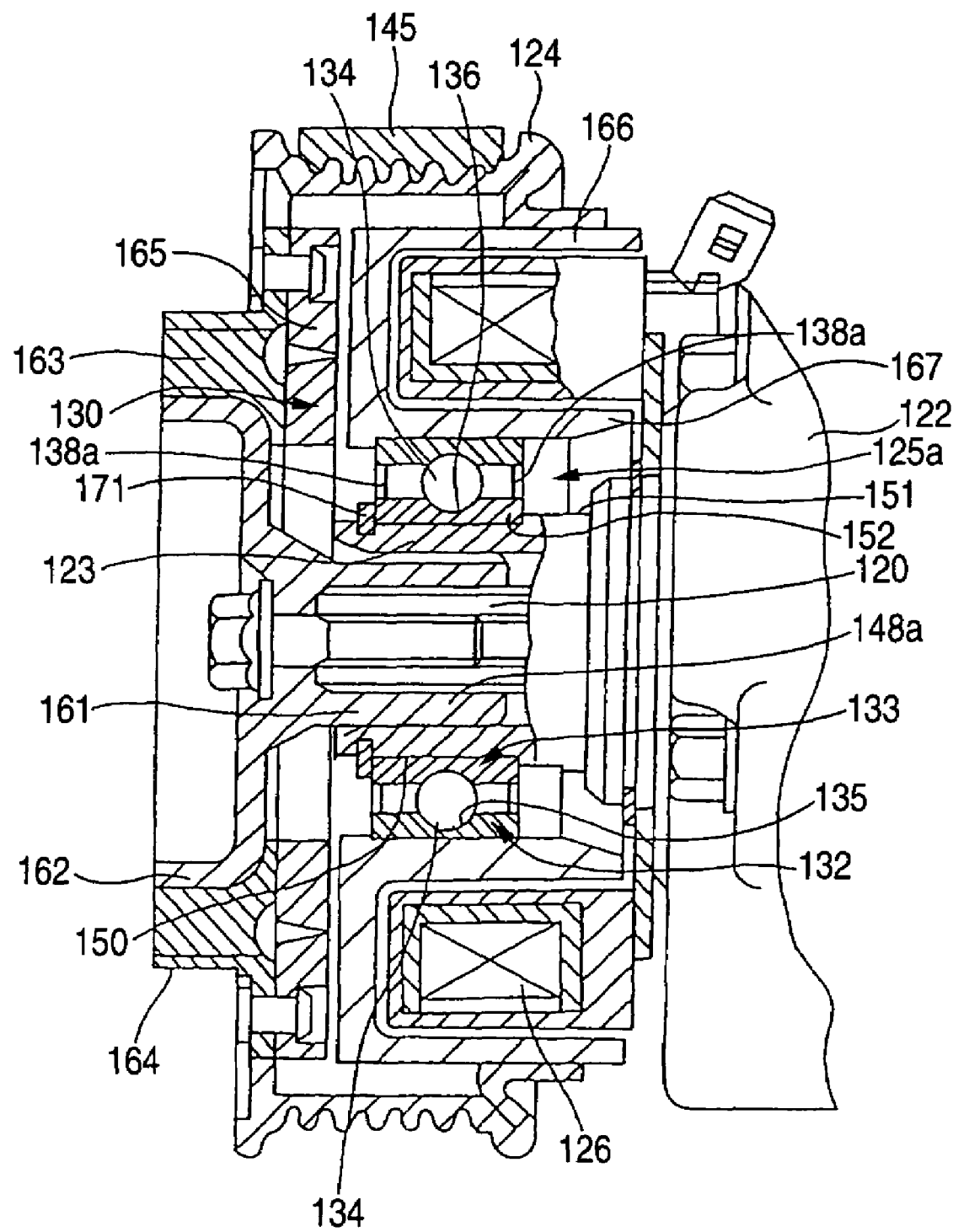
FIG. 28 is a section view of the ninth embodiment of the invention, showing a state in which the rolling bearing with a seal plate is incorporated into the rotation support portion of a pulley for a compressor with an electromagnetic clutch incorporated therein.

Also, a rolling bearing with a seal plate according to the invention is not limited to the structure previously described in the ninth embodiment and shown in FIGS. 19~21 in which, when it is used, it is incorporated into the rotation support part (which does not include an electromagnetic clutch) for driving a compressor for a car air conditioner. For example, the rolling bearing 125a with a seal plate according to the ninth embodiment previously shown in FIGS. 19~21 can be used while it is incorporated into such a rotation support part as shown in FIG. 28 (which includes an electromagnetic clutch) for a compressor for a car air conditioner. That is, in the case of the pulley rotation support part for a compressor shown in FIG. 28, an electromagnetic clutch 130 is interposed between a driven pulley 124 and a rotary shaft 121 and, as this electromagnetic clutch 130 is operated or not operated, these driven pulley 124 and rotary shaft 121 can be engaged with or disengaged from each other. For this purpose, a small-diameter tube portion 161 formed in the near-to-inside-diameter portion of a bracket 148a is fitted with and fixed to the outer surface of the portion of the end portion of the rotary shaft 121 that projects from a casing 122. Also, a tubular member 164 and a ring-shaped plate 165 made of magnetic material are connected through an elastic member 163 to the outside-diameter side and axial-direction one side of a large-diameter tube portion 162 formed in the near-to-outside-diameter portion of the bracket 148a.

And, between the outer peripheral surface of a support tube portion 123 disposed on the outer surface of the end portion of the above casing 122 and the inner peripheral surface of an inside-diameter-side tube portion 167 disposed in the near-to-inside-diameter portion of a ring-shaped member 166 which is fitted with and fixed to the inner surface of the inside diameter portion of the driven pulley 124 and is formed in a circular-ring-like shape as a whole having a U-shaped section, there is interposed the rolling bearing with a seal plate 125a used in the ninth embodiment shown in the previously described FIGS. 19~21. Also, a solenoid 126, which is fixed to the end face of the above casing 122, is disposed in the internal space of the above ring-shaped member 166. The above ring-shaped plate 165 connected to the axial-direction one side of the above bracket 148a, when the above solenoid 126 is not energized, as shown in FIG. 28, is separated from the above ring-shaped member 166 due to the elastic force of the above elastic member 163; but, when the above solenoid 126 is energized, the ring-shaped plate 165 is attracted to this ring-shaped member 166 to thereby allow the rotation power to be transmitted from the above driven pulley 124 to the above-mentioned rotary shaft 121. That is, in the case of the present embodiment, the above solenoid 126, ring-shaped member 166, ring-shaped plate 165 and elastic member 163 cooperate together in constituting the electromagnetic clutch 130 which is used to engage the above driven pulley 124 and rotary shaft 121 with each other as well as disengage them from each other.

Figure 29:
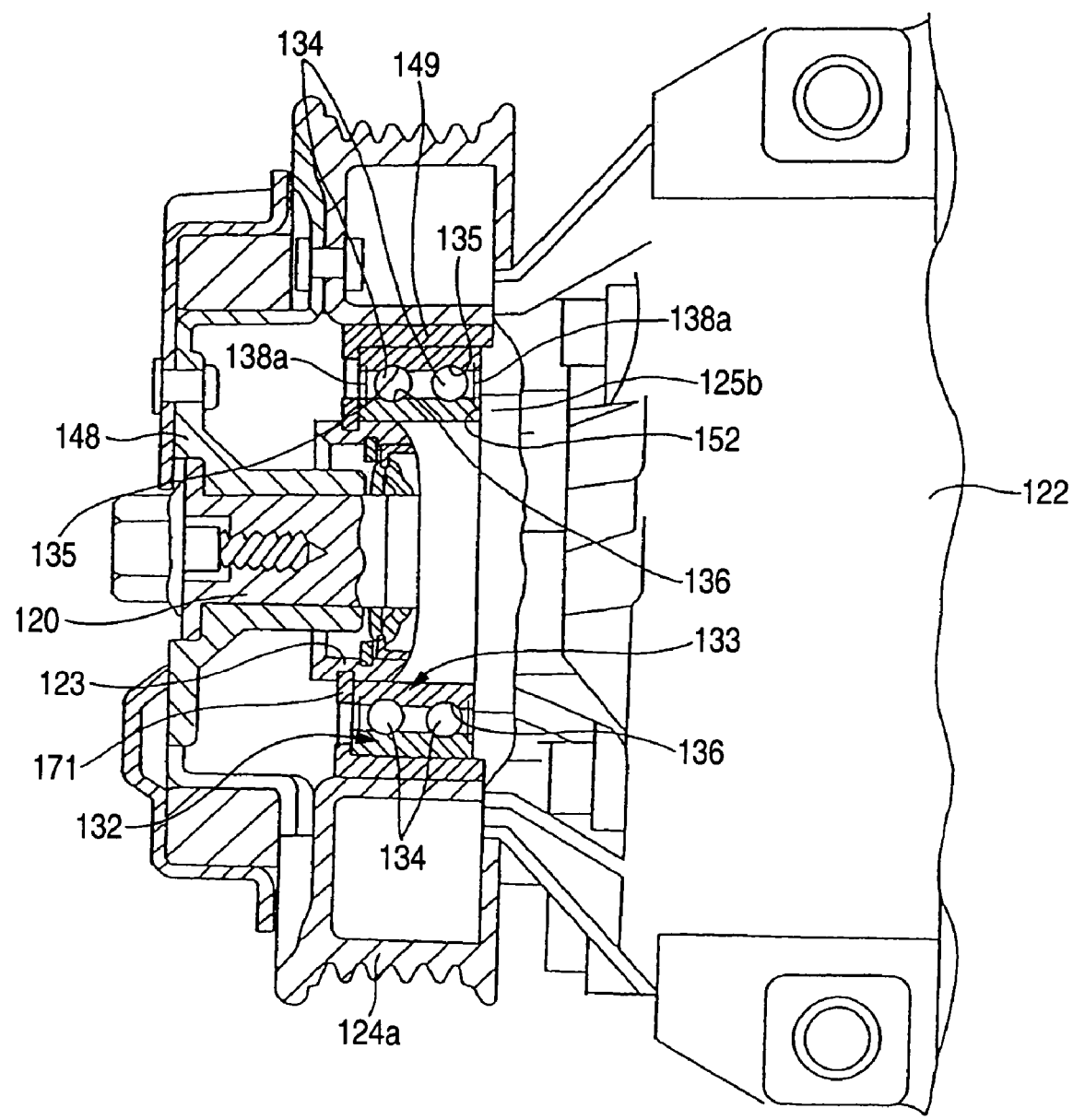
FIG. 29 is a section view of a thirteenth embodiment of the mode for carrying out the invention.

Also, in the above-described respective embodiments, description has been given of a case in which the rolling bearing with a seal plate 125a is structured by providing a pair of seal plates 138a-138d on a single-row radial ball bearing. However, the rolling bearing with a seal plate according to the invention is not limited to such structure. For example, as in a thirteenth embodiment of the mode for carrying out the invention shown in FIG. 29 which will be shown next and corresponds to the third aspect, even in case where a pair of seal plates 138a, 138a are disposed on a double-row radial ball bearing, the invention can be enforced. In the case of the present embodiment shown in FIG. 29, double-row outer raceways 135, 135 are formed in the inner peripheral surface of an outer ring 132 and, at the same time, double-row inner raceways 136, 136 are formed in the outer surface of an inner ring 133. And, between these sets of outer raceways 135, 135 and inner raceways 136, 136, there are rotatably interposed balls 134, 134 respectively serving as rolling elements by two or more for each set. And, between the inner peripheral surfaces of the two end portions of the above outer ring 132 and the outer peripheral surfaces of the two end portions of the above inner ring 133, there are interposed a pair of seal plates 138a, 138a, thereby providing a rolling bearing with a seal plate 125b.

The remaining structures and operations of the present embodiment are similar to those of the ninth embodiment shown in the previously described FIGS. 19~21. Therefore, the same parts thereof are given the same designations and thus the duplicate description thereof is omitted here.

Figure 30:
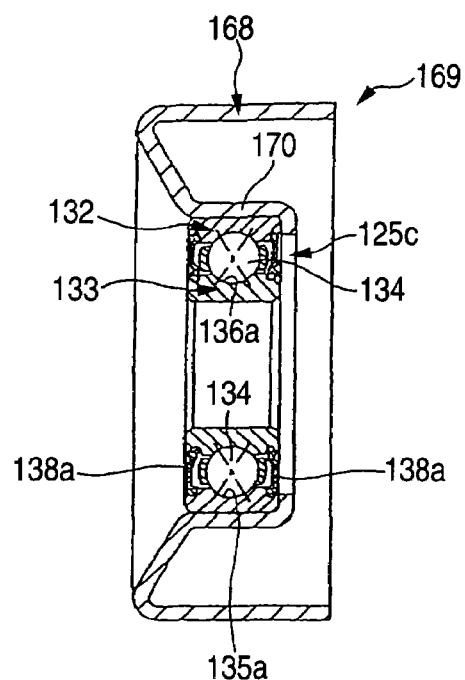
FIG. 30 is a section view of a fourteenth embodiment of the mode for carrying out the invention.
Figure 31:
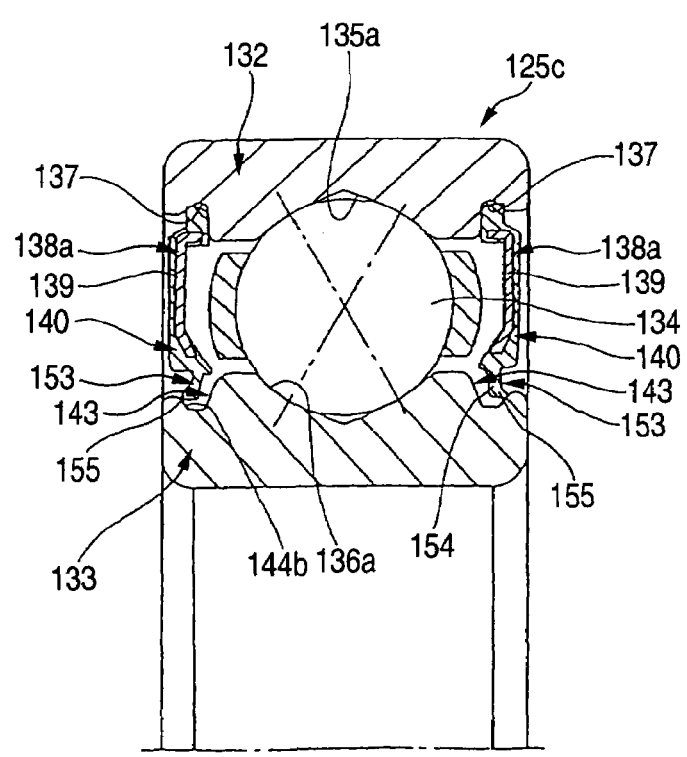
FIG. 31 is an enlarged section view of a half section of only the rolling bearing with a seal plate take out from the pulley rotation support apparatus shown in FIG. 30.

Next, FIGS. 30 and 31 show a fourteenth embodiment of the mode for carrying out the invention, also corresponding to the third aspect. In the case of the present embodiment, the invention is applied to an integrated-pulley-type rolling bearing 169 for use in a tensioner which adjusts the tensile force of an endless belt such as a timing belt used in an engine. This integrated-pulley-type rolling bearing 169 is composed of a pulley 168 and a rolling bearing with a seal plate 125c to which the invention relates. Of these composing parts, the pulley 168 is formed in a circular-ring shape as a whole by press working a steel plate.

Also, the above rolling bearing with a seal plate 125c, as shown in detail in FIG. 31, is composed of a single-row four-point-contact-type ball bearing and a pair of seal plates 138a, 138a disposed on the present ball bearing. That is, each of the sections of an outer raceway 135a and an inner raceway 136a respectively formed in the inner peripheral surface of an outer ring 132 and in the outer peripheral surface of an inner ring 133 respectively constituting the present rolling bearing with a seal plate 125c has a so called Gothic-arch shape which can be obtained when two arcs each having a larger radius of curvature than one half of the diameter of the respective balls 134, 134 are made to cross each other in the middle portions thereof. Therefore, the above respective raceways 135a, 136a and the above respective balls 134, 134 are contacted with each other respectively at two points, a total of four points for every balls 134, 134. And, the outer ring 132 constituting the above rolling bearing with a seal plate 125c is fitted with and fixed to the inner surface of an inside-diameter-side cylindrical portion 170 formed in the near-to-inside-diameter portion of the above pulley 168. Also, the above inner ring 133 can be fitted with and fixed to the outer surface of a support shaft (not shown).

The remaining structures and operations of the rolling bearing with a seal plate 125c are similar to those of the ninth embodiment shown in the previously described FIGS. 19~21 and thus the duplicate description thereof is omitted here.

The present embodiment is based on the Japanese Patent Application (Patent Application 2002-088771) filed on Mar. 27, 2002 and thus the contents thereof are incorporated into the present embodiment for reference.

Although the invention has been described heretofore in detail and with reference to the specific embodiments thereof, it is obvious to a person skilled in the art that various changes and modifications are possible without departing from the spirit and scope of the invention.

INDUSTRIAL APPLICABILITY

Figure 6:
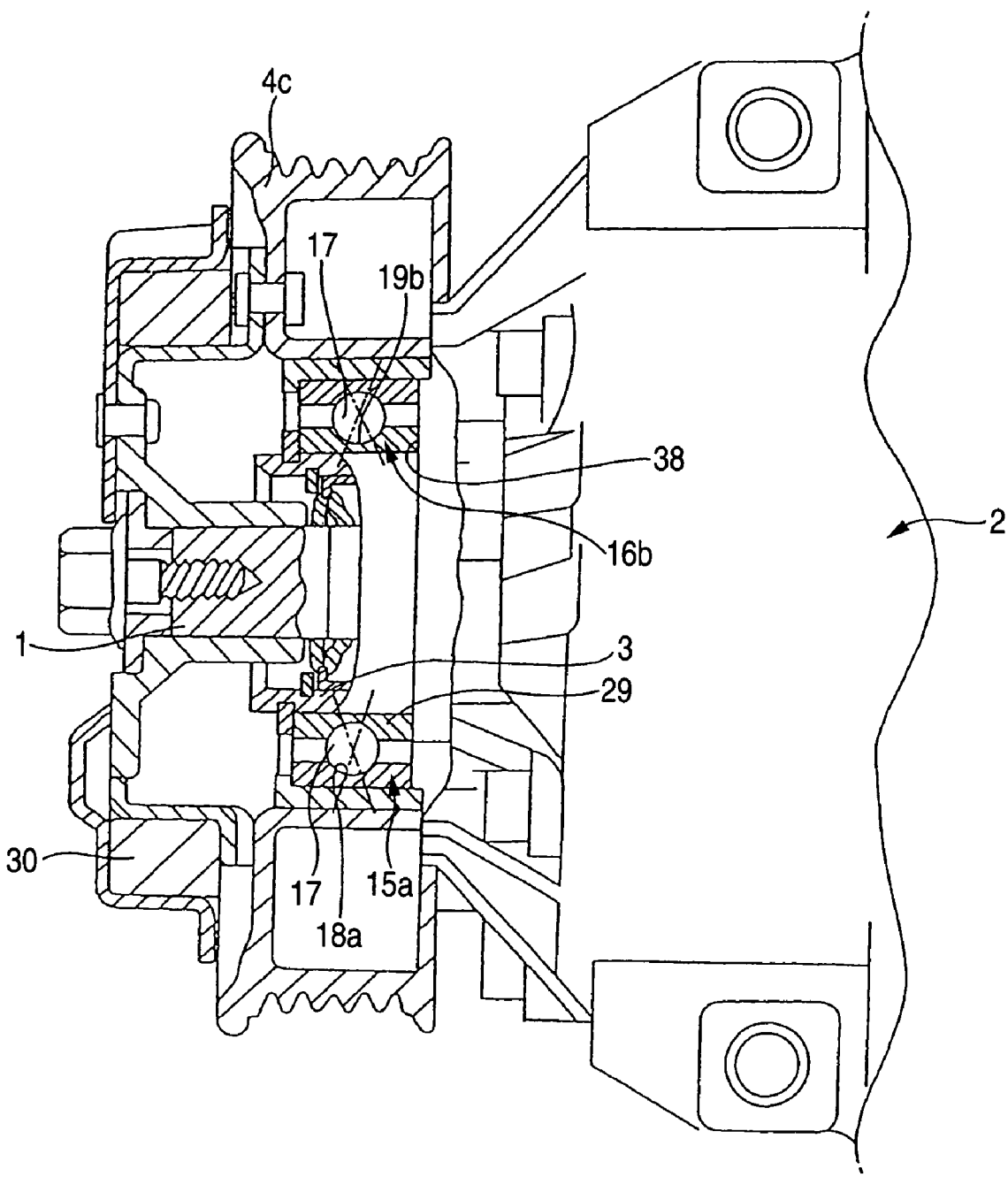
FIG. 6 is a section view of another example of a structure to which the invention is applied.

Further, in the above description of the first embodiment of the mode for carrying out the invention, there is shown a case where the invention is applied to a structure including an electromagnetic clutch which is used to engage a pulley and rotary shaft with each other and disengage them from each other. However, the invention can also be applied even to a structure not including an electromagnetic clutch, provided that it can transmit the rotation power from the pulley to the rotary shaft. That is, in the case of a swash-plate-type variable-capacitance-type compressor which is disclosed, for example, in the above-mentioned patent reference 3 or in the above-mentioned patent reference 4, by reducing the inclination angle of a swash plate down to a small value (further by reducing the inclination angle down to zero), the rotation torque of the rotation shaft of the compressor can be reduced to a very small value. In the case of such structure, in some cases, as shown in FIG. 6, without using an electromagnetic clutch, the driven pulley 4c and rotary shaft 1, which are rotatably supported through the rolling bearing 29 on the periphery of the support tube portion 3 formed in the end portion of the casing 2, are connected to each other through the damping member 30 functioning as a torque fuse in such a manner that the rotation power can be transmitted to each other unless an excessive torque is applied. In such structure, in case where, as the above rolling bearing 29, there is used a single-row three-point-contact-type or four-point-contact-type radial ball bearing as shown in FIG. 6, the factors of this rolling bearing 29 are restricted to proper values, and the position relationship between this rolling bearing 29 and the above driven pulley 4c is restricted as shown in the previously described FIG. 1, there can be obtained the operations and effects of the invention. Such structure is also a target to which the invention can be applied. When applying the invention to such structure, the specifications of the respective parts of the above rolling bearing 29, which can be a single-row three-point-contact-type or four-point-contact-type ball bearing, as well as the position relationship between this rolling bearing 29 and the above pulley 4c should be similar to those shown in the above-mentioned FIGS. 1~2.

Also, in the second embodiment of the mode for carrying out the invention, even when there is used a deep-groove ball bearing, an angular ball bearing or a three-point-contact ball bearing is used instead of the four-point-contact bearing used as a single-row ball bearing, there can be obtained similar effects as the above structure.

And, in the third to eighth embodiments of the mode for carrying out the invention, the invention can be applied not only to the above single-row deep-groove-type rolling bearing but also to a three-point8 - or four-point-contact-type rolling bearing and further to a double-row rolling bearing. Especially, when the invention is applied to a rolling bearing with a seal plate which is used for grease lubrication under the severe condition that a moment load based on an offset load is supported and also under its outer ring is to be rotated, the durability of this rolling bearing with a seal plate can be enhanced.

And, in the ninth to fourteenth embodiments of the mode for carrying out the invention, even in case where, differently from the present embodiments, a seal plate is disposed in a three-point-contact-type ball bearing in which an inner raceway or an outer raceway is contacted with rolling surfaces of the respective balls at a point and an outer raceway or an inner raceway is contacted with the rolling surfaces of the respective rolling elements at two points, at a total of three points for every rolling element, the invention can be enforced.

Since the pulley rotation support apparatus as set forth in the first aspect of the invention is structured and operates in the previously described manner, without increasing the axial-direction dimension thereof, an allowable moment load can be secured as well as heat generation and wear which occurs during operation can be restricted. Further, even when the invention is used in an apparatus which must be increased in the rotation and capacity thereof and must be reduced in the size thereof, the grease seizure life and the rolling element run-up allowance can be secured sufficiently. Therefore, the life of a rolling bearing to be incorporated into the above-mentioned pulley rotation support apparatus as well as the life of an endless belt provided on a pulley supported on this rolling bearing can be extended. Thus, the present pulley rotation support apparatus can contribute not only to a reduction in the size of various machines such as a compressor for a car air conditioner but also to enhancement in the performance thereof.

Further, since the present pulley rotation support apparatus is structured and operates in the previously described manner, specifically, since the pocket opening of the retainer is disposed so as to face in the direction where the radial load is applied to the center of the bearing, when the radial load offset with respect to the bearing center is applied, grease existing around the load area during the bearing operation is caused to circulate actively from the inner raceway on the pocket opening side of the retainer to the outer raceway. Therefore, when the offset load is applied, the seizure life of the grease can be extended and thus the bearing performance can be enhanced.

Further, in the case of the pulley rotation support apparatus as set forth in the second aspect of the invention, because it is structured and operates in the previously described manner, it can enhance the durability of a rolling bearing with a seal plate and thus can contribute toward enhancing the durability and reliability of various machines incorporated into this rolling bearing with a seal plate.

Further, in the case of the pulley rotation support apparatus as set forth in the third aspect of the invention, because it is structured and operates in the previously described manner, it can secure its sealing performance sufficiently even under severe conditions. As a result of this, when lubrication is executed using grease charged into the interior of the apparatus, not only the life of the grease can be enhanced but also the respective raceways and the rolling surfaces of the respective rolling elements can be prevented against damage.

Further, according to the pulley rotation support apparatus as set forth in the fourth aspect of the invention, since it is structured and operates in the previously described manner, it can secure its sealing performance sufficiently under severe conditions and, when it is used with grease charged into the interior thereof, it can enhance the life of the grease. Further, it can prevent various foreign substances existing in the outside from entering a space with the respective rolling elements stored therein, thereby being able to prevent the respective raceways and the rolling surfaces of the respective rolling elements against damage. Further, even when, during use of the present apparatus, the internal pressure of the rolling bearing with a seal plate tends to rise, the air of the interior of the space can be discharged out to the outside and thus a rise in the internal pressure can be restricted, so that the sealing performance by this seal lip can be stabilized. And, oxidization of the grease charged into the interior of the present apparatus can be prevented.

The invention claimed is:

1. A pulley rotation support apparatus, comprising a fixed support part, a rolling bearing supported on the fixed support part, and a pulley on which an endless belt is disposed:

the rolling bearing being a single-row three-point- or four-point-contact radial ball bearing including an inner ring having an inner raceway on the outer peripheral surface thereof, the inner raceway contacting with the rolling surface of a rolling element at one or two points, an outer ring having an outer raceway on the inner peripheral surface thereof, the outer raceway contacting with the rolling surfaces of the rolling element at one or two points, a plurality of rolling elements rotatably interposed between the inner raceway and outer raceway, a retainer with pockets for holding the rolling elements therein, and a seal plate having the outer peripheral edge portion secured to the inner peripheral surface of the outer ring and a leading end portion of a seal lip formed in the inner peripheral edge portion thereof, the seal lip slidably contacting with the inner ring, wherein the rolling bearing is lubricated by a lubricant, and at least one of the inner raceway and outer raceway is contacted with the rolling surfaces of the rolling element at two points respectively, and wherein an offset quantity being an axial-direction distance between the width-direction central port ion position of the outer peripheral surface of the pulley to be contacted with the endless belt and the center of the radial ball bearing is 40% or less of the pitch circle diameter of the radial ball bearing, the radial clearance of the radial ball bearing in an unloaded state is 0.2% or less of the pitch circle diameter of the radial ball bearing, and the seal plate has, of the inner surfaces thereof, at least a portion adjacent the outside-diameter portion thereof close to the inner peripheral surface of the outer ring, the portion adjacent the outside-diameter portion is formed as an inclined surface or a concavely curved surface inclined inwardly in the axial direction as it goes outwardly in the diameter direction.

2. A pulley rotation support apparatus, comprising a fixed support part, a rolling bearing supported on the fixed support part, and a pulley on which an endless belt is disposed:

the rolling bearing being a single-row three-point- or four-point-contact radial ball bearing including an inner ring having an inner raceway on the outer peripheral surface thereof, the inner raceway contacting with the rolling surface of a rolling element at one or two points, an outer ring having an outer raceway on the inner peripheral surface thereof, the outer raceway contacting with the rolling surfaces of the rolling element at one or two points, a plurality of rolling elements rotatably interposed between the inner raceway and outer raceway, a retainer with pockets for holding the rolling elements therein, and a seal plate having the outer peripheral edge portion secured to the inner peripheral surface of the outer ring and a leading end portion of a seal lip formed in the inner peripheral edge portion thereof, the seal lip slidably contacting with the inner ring, wherein the rolling bearing is lubricated by a lubricant, and at least one of the inner raceway and outer raceway is contacted with the rolling surfaces of the rolling element at two points respectively, and wherein an offset quantity being an axial-direction distance between the width-direction central portion position of the outer peripheral surface of the pulley to be contacted with the endless belt and the center of the radial ball bearing is 40% or less of the pitch circle diameter of the radial ball bearing, the radial clearance of the radial ball bearing in an unloaded state is 0.2% or less of the pitch circle diameter of the radial ball bearing, and at least one of the seal lips includes a substantially-circular-ring-shaped main body portion and a projecting portion formed in the inner peripheral edge portion of the main body portion so as to project outwardly in the axial direction substantially over the entire periphery thereof, the main body portion of the present seal lip except for the projecting portion thereof, when the present seal lip is held in free state, is inclined outwardly in the axial direction thereof as it goes toward the inner peripheral edge portion thereof, and, in the assembled state thereof, the leading end edge of the projecting portion is slidably contacted with the axial-direction outer side wall surface of a seal groove formed over the entire periphery of part of the outer peripheral surface of the inner ring substantially over the entire periphery of the present side wall surface.

3. A pulley rotation support apparatus, comprising a fixed support part, a rolling bearing supported on the fixed support part, and a pulley on which an endless belt is disposed:

the rolling bearing being a single-row three-point- or four-point-contact radial ball bearing including an inner ring having an inner raceway on the outer peripheral surface thereof, the inner raceway contacting with the rolling surface of a rolling element at one or two points, an outer ring having an outer raceway on the inner peripheral surface thereof, the outer raceway contacting with the rolling surfaces of the rolling element at one or two points, a plurality of rolling elements rotatably interposed between the inner raceway and outer raceway, a retainer with pockets for holding the rolling elements therein, and a seal plate having the outer peripheral edge portion secured to the inner peripheral surface of the outer ring and a leading end portion of a seal lip formed in the inner peripheral edge portion thereof, the seal lip slidably contacting with the inner ring, wherein the rolling bearing is lubricated by a lubricant, and at least one of the inner raceway and outer raceway is contacted with the rolling surfaces of the rolling element at two points respectively, and wherein an offset quantity being an axial-direction distance between the width-direction central portion position of the outer peripheral surface of the pulley to be contacted with the endless belt and the center of the radial ball bearing is 40% or less of the pitch circle diameter of the radial ball bearing, the radial clearance of the radial ball bearing in an unloaded state is 0.2% or less of the pitch circle diameter of the radial ball bearing, and at least one of the two seal plates is structured such that, in the portion of the leading end face of the seal lip that is opposed to the axial-direction outer side wall surface of a seal groove, there is formed a rectangular-shaped or arc-shaped cut-away portion allowing the air to pass into the inside thereof, the leading end portion of this seal lip is surface contacted with the axial-direction outer side wall surface of a seal groove substantially over the entire periphery thereof, and, regarding to the cut-away portion, in case where the depth thereof from the leading end edge of the seal lip is expressed as $L_1$, the length in the circumferential direction thereof is expressed as $L_2$, and the diameter of the rolling element is expressed as $D_a$, "$L_1 \leqq 0.09 D_a$ and $L_2 \leqq 0.18 D_a$" is satisfied.

* * * * *